(12) United States Patent
Strong et al.

(10) Patent No.: US 11,426,979 B2
(45) Date of Patent: Aug. 30, 2022

(54) THIN-FILM DEVICES AND FABRICATION

(71) Applicant: View, Inc., Milpitas, CA (US)

(72) Inventors: Fabian Strong, Hayward, CA (US); Yashraj Bhatnagar, Santa Clara, CA (US); Abhishek Anant Dixit, Memphis, TN (US); Todd Martin, Mountain View, CA (US); Robert T. Rozbicki, Saratoga, CA (US)

(73) Assignee: View, Inc., Milipitas, CA (US)

( * ) Notice: Subject to any disclaimer, the term of this patent is extended or adjusted under 35 U.S.C. 154(b) by 0 days.

(21) Appl. No.: 17/456,165

(22) Filed: Nov. 23, 2021

(65) Prior Publication Data
US 2022/0080706 A1 Mar. 17, 2022

Related U.S. Application Data

(63) Continuation of application No. 17/446,566, filed on Aug. 31, 2021, which is a continuation of application
(Continued)

(51) Int. Cl.
*B32B 17/10* (2006.01)
*G02F 1/155* (2006.01)
(Continued)

(52) U.S. Cl.
CPC .... *B32B 17/10119* (2013.01); *B32B 17/1099* (2013.01); *B32B 17/10513* (2013.01);
(Continued)

(58) Field of Classification Search
CPC ......... B32B 17/10119; B32B 17/10513; B32B 17/1099; C23C 14/086; G02B 1/18;
(Continued)

(56) References Cited

U.S. PATENT DOCUMENTS 4,854,675 A   8/1989  Yamazaki et al.
4,950,888 A   8/1990  Hamada
(Continued)

FOREIGN PATENT DOCUMENTS

CN   1350326 A   5/2002
CN   1482509 A   3/2004
(Continued)

OTHER PUBLICATIONS

AU Examination report No. 1 for Standard patent application, dated Jul. 13, 2020, for Australian Patent Application No. 2015371272.
(Continued)

*Primary Examiner* — James C. Jones
(74) *Attorney, Agent, or Firm* — Weaver Austin Villeneuve & Sampson LLP; Brian D. Griedel

(57) ABSTRACT

Thin-film devices, for example electrochromic devices for windows, and methods of manufacturing are described. Particular focus is given to methods of patterning optical devices. Various edge deletion and isolation scribes are performed, for example, to ensure the optical device has appropriate isolation from any edge defects. Methods described herein apply to any thin-film device having one or more material layers sandwiched between two thin film electrical conductor layers. The described methods create novel optical device configurations.

22 Claims, 30 Drawing Sheets

Related U.S. Application Data

No. 16/947,834, filed on Aug. 19, 2020, which is a continuation of application No. 15/491,869, filed on Apr. 19, 2017, now Pat. No. 10,795,232, which is a continuation of application No. 14/822,732, filed on Aug. 10, 2015, now Pat. No. 10,114,265, which is a continuation of application No. 14/362,863, filed as application No. PCT/US2012/068817 on Dec. 10, 2012, now Pat. No. 9,454,053.

(60) Provisional application No. 61/709,046, filed on Oct. 2, 2012, provisional application No. 61/664,638, filed on Jun. 26, 2012, provisional application No. 61/569,716, filed on Dec. 12, 2011.

(51) Int. Cl.

| | | |
|---|---|---|
| G02F 1/153 | (2006.01) | |
| G02B 1/18 | (2015.01) | |
| G02F 1/1523 | (2019.01) | |
| C23C 14/08 | (2006.01) | |
| H01B 13/00 | (2006.01) | |

(52) U.S. Cl.
CPC ............. *C23C 14/086* (2013.01); *G02B 1/18* (2015.01); *G02F 1/155* (2013.01); *G02F 1/1523* (2013.01); *G02F 1/1533* (2013.01); *H01B 13/00* (2013.01); *G02F 1/153* (2013.01); *G02F 2001/1536* (2013.01); *Y10T 29/49126* (2015.01)

(58) Field of Classification Search
CPC ...... G02F 1/1523; G02F 1/1533; G02F 1/155; G02F 1/153; G02F 2001/1536; H01B 13/00; Y10T 29/49126
See application file for complete search history.

(56) References Cited

U.S. PATENT DOCUMENTS

| | | |
|---|---|---|
| 5,724,175 A | 3/1998 | Hichwa et al. |
| 5,830,336 A | 11/1998 | Schulz |
| 5,877,936 A | 3/1999 | Nishitani et al. |
| 5,995,271 A | 11/1999 | Zieba et al. |
| 6,055,089 A | 4/2000 | Schulz et al. |
| 6,176,715 B1 | 1/2001 | Buescher |
| 6,284,412 B1 | 9/2001 | Minakata et al. |
| 6,407,847 B1 | 6/2002 | Poll et al. |
| 6,515,787 B1 | 2/2003 | Westfall et al. |
| 6,822,778 B2 | 11/2004 | Westfall et al. |
| 7,710,671 B1 | 5/2010 | Kwak et al. |
| 7,719,751 B2 | 5/2010 | Egerton et al. |
| 7,777,933 B2 | 8/2010 | Piroux et al. |
| 7,869,114 B2 | 1/2011 | Valentin et al. |
| 8,035,882 B2 | 10/2011 | Fanton et al. |
| 8,071,420 B2 | 12/2011 | Su et al. |
| 8,164,818 B2 | 4/2012 | Collins et al. |
| 9,019,588 B2 | 4/2015 | Brown et al. |
| 9,102,124 B2 | 8/2015 | Collins et al. |
| 9,454,053 B2 | 9/2016 | Strong et al. |
| 9,482,921 B2 | 11/2016 | Lamine et al. |
| 9,581,875 B2 | 2/2017 | Burdis et al. |
| 9,703,167 B2 | 7/2017 | Parker et al. |
| 9,939,704 B2 | 4/2018 | Patterson et al. |
| 9,952,481 B2 | 4/2018 | Rozbicki et al. |
| 9,958,750 B2 | 5/2018 | Parker et al. |
| 9,995,985 B2 | 6/2018 | Parker et al. |
| 10,114,265 B2 | 10/2018 | Strong et al. |
| 10,295,880 B2 | 5/2019 | Dixit et al. |
| 10,303,032 B2 | 5/2019 | Brossard et al. |
| 10,409,130 B2 | 9/2019 | Parker et al. |
| 10,551,711 B2 | 2/2020 | Kozlowski et al. |
| 10,795,232 B2 | 10/2020 | Strong et al. |
| 10,802,371 B2 | 10/2020 | Dixit et al. |
| 11,065,845 B2 | 7/2021 | Parker et al. |
| 11,086,182 B2 | 8/2021 | Dixit et al. |
| 2002/0075552 A1 | 6/2002 | Poll et al. |
| 2002/0149829 A1 | 10/2002 | Mochizuka et al. |
| 2003/0137712 A1 | 7/2003 | Westfall et al. |
| 2003/0227663 A1 | 12/2003 | Agrawal et al. |
| 2004/0042059 A1 | 3/2004 | Minami et al. |
| 2004/0202001 A1 | 10/2004 | Roberts et al. |
| 2004/0234678 A1 | 11/2004 | Hirai et al. |
| 2006/0018000 A1 | 1/2006 | Greer |
| 2006/0098289 A1 | 5/2006 | McCabe et al. |
| 2007/0138949 A1 | 6/2007 | Yoshida et al. |
| 2008/0030836 A1 | 2/2008 | Tonar et al. |
| 2008/0099065 A1 | 5/2008 | Ito et al. |
| 2008/0190759 A1 | 8/2008 | Valentin et al. |
| 2008/0266642 A1 | 10/2008 | Burrell et al. |
| 2009/0272483 A1 | 11/2009 | Howes |
| 2009/0304912 A1 | 12/2009 | Kwak et al. |
| 2009/0323162 A1* | 12/2009 | Fanton .................. G02F 1/1533 359/275 |
| 2010/0067090 A1 | 3/2010 | Egerton et al. |
| 2010/0243427 A1 | 9/2010 | Kozlowski et al. |
| 2010/0245973 A1 | 9/2010 | Wang et al. |
| 2010/0321758 A1 | 12/2010 | Bugno et al. |
| 2011/0096388 A1 | 4/2011 | Agrawal et al. |
| 2011/0148218 A1 | 6/2011 | Rozbicki |
| 2011/0151383 A1 | 6/2011 | Yamashiro et al. |
| 2011/0199666 A1 | 8/2011 | Chun et al. |
| 2011/0211247 A1 | 9/2011 | Kozlowski et al. |
| 2011/0260961 A1 | 10/2011 | Burdis |
| 2011/0266137 A1 | 11/2011 | Wang et al. |
| 2011/0266138 A1 | 11/2011 | Wang et al. |
| 2011/0267673 A1 | 11/2011 | Agrawal et al. |
| 2011/0267674 A1 | 11/2011 | Wang et al. |
| 2011/0267675 A1 | 11/2011 | Wang et al. |
| 2012/0026573 A1 | 2/2012 | Collins et al. |
| 2012/0033287 A1 | 2/2012 | Friedman et al. |
| 2012/0147449 A1 | 6/2012 | Bhatnagar et al. |
| 2012/0218620 A1 | 8/2012 | Kwak et al. |
| 2012/0327499 A1 | 12/2012 | Parker et al. |
| 2013/0222877 A1 | 8/2013 | Greer et al. |
| 2013/0278988 A1 | 10/2013 | Jack et al. |
| 2014/0253996 A1 | 9/2014 | Burdis et al. |
| 2014/0340731 A1 | 11/2014 | Strong et al. |
| 2015/0092260 A1 | 4/2015 | Parker et al. |
| 2015/0153622 A1 | 6/2015 | Kalweit et al. |
| 2015/0362816 A1 | 12/2015 | Strong et al. |
| 2016/0103379 A1 | 4/2016 | Kozlowski et al. |
| 2016/0114523 A1 | 4/2016 | Luten et al. |
| 2016/0138328 A1 | 5/2016 | Behmke et al. |
| 2016/0199936 A1 | 7/2016 | Luten et al. |
| 2017/0066679 A1 | 3/2017 | Yeh |
| 2017/0115544 A1 | 4/2017 | Parker et al. |
| 2017/0176831 A1 | 6/2017 | Dixit et al. |
| 2017/0219903 A1 | 8/2017 | Strong et al. |
| 2018/0210307 A1 | 7/2018 | Parker et al. |
| 2018/0259822 A1 | 9/2018 | Dixit et al. |
| 2019/0079365 A1 | 3/2019 | Sarrach et al. |
| 2019/0086756 A1 | 3/2019 | Dixit et al. |
| 2019/0346732 A1 | 11/2019 | Parker et al. |
| 2020/0384738 A1 | 12/2020 | Strong et al. |
| 2021/0001426 A1 | 1/2021 | Dixit et al. |
| 2021/0394489 A1 | 12/2021 | Strong et al. |
| 2022/0001651 A1 | 1/2022 | Cabrera |
| 2022/0032584 A1 | 2/2022 | Parker et al. |
| 2022/0050348 A1 | 2/2022 | Dixit et al. |

FOREIGN PATENT DOCUMENTS

| | | |
|---|---|---|
| CN | 1537257 A | 10/2004 |
| CN | 1620678 A | 5/2005 |
| CN | 1688923 A | 10/2005 |
| CN | 1808271 A | 7/2006 |
| CN | 1993648 A | 7/2007 |
| CN | 101276079 A | 10/2008 |
| CN | 101421666 A | 4/2009 |
| CN | 102388340 A | 3/2012 |
| CN | 104011588 A | 8/2014 |
| EP | 3238253 A2 | 11/2017 |

(56) References Cited

FOREIGN PATENT DOCUMENTS

| | | | |
|---|---|---|---|
| JP | S5994744 A | 5/1984 | |
| JP | 2001051307 A | 2/2001 | |
| JP | 2001051308 A | 2/2001 | |
| JP | 2001133816 A | 5/2001 | |
| JP | 2002076390 A | 3/2002 | |
| JP | 2008542578 A | 11/2008 | |
| JP | 2011128504 A | 6/2011 | |
| JP | 2011526378 A | 10/2011 | |
| KR | 20040031685 A | 4/2004 | |
| TW | 201013286 A | 4/2010 | |
| TW | 201029838 A | 8/2010 | |
| TW | 201215981 A | 4/2012 | |
| TW | 201342509 A | 10/2013 | |
| TW | 201435464 A | 9/2014 | |
| WO | WO-2009148861 A2 | 12/2009 | |
| WO | WO-2010093703 A1 | 8/2010 | |
| WO | WO-2011028254 A2 | 3/2011 | |
| WO | WO-2011050291 A2 | 4/2011 | |
| WO | WO-2012078634 A2 | 6/2012 | |
| WO | WO-2012138281 A1 | 10/2012 | |
| WO | WO-2013090209 A1 | 6/2013 | |
| WO | WO-2013163107 A1 | 10/2013 | |
| WO | WO-2014201287 A1 | 12/2014 | |
| WO | WO-2015103433 A1 | 7/2015 | |
| WO | WO-2016004373 A1 | 1/2016 | |
| WO | WO-2016105549 A2 | 6/2016 | |

OTHER PUBLICATIONS

AU Notice of Acceptance for patent application, dated Oct. 6, 2020, for Australian Patent Application No. 2015371272.
CA Notice of Allowance dated Jun. 22, 2021 in CA Application No. 2,859,023.
CA Office Action dated Dec. 4, 2020 in CA Application No. 2,859,023.
CA Office Action dated Jan. 13, 2020 in CA Application No. 2,859,023.
CN Notice of Allowance with Search Report dated May 27, 2021 in CN Application No. 201580039994.0, with English Translation.
CN Office Action dated Dec. 24, 2020 in CN Application No. 201580039994.0, with English Translation.
CN Office Action dated Feb. 2, 2019 in CN Application No. 201280061260.9.
CN Office Action dated Feb. 3, 2020 in CN Application No. 201580039994.0.
CN Office Action dated Feb. 3, 2021 in CN Application No. 201580074719.2.
CN Office Action dated Feb. 4, 2017 in CN Application No. 201280061260.9.
CN Office Action dated Mar. 16, 2020 in CN Application No. 201580074719.2.
CN Office Action dated Mar. 21, 2016 in CN Application No. 201280061260.9.
CN Office Action dated May 6, 2020 in CN Application No. 201280061260.9, with English Translation.
CN Office Action dated Oct. 14, 2019 in CN Application No. 201480073448.4.
CN Office Action dated Oct. 16, 2017 in CN Application No. 201280061260.9.
CN Office Action (Decision of Rejection) dated May 15, 2018 in CN Application No. 201280061260.9.
CN Reexamination Decision dated Mar. 25, 2021 in CN Application No. 201280061260.9, No Translation.
CN Rejection Decision dated Dec. 1, 2020 in CN Application No. 201280061260.9, with English Translation.
CN Rejection Decision dated Jun. 28, 2021 in CN Application No. 201580074719.2.
Decision to Grant dated Apr. 22, 2021 for EP Application No. 17197774.7.
Decision to Grant dated Jun. 11, 2021 for EP Application No. 19150851.4.
EP search report dated Sep. 14, 2021, in application No. EP21173523.8.
European Office Action, dated Feb. 18, 2020, for EP Application No. 15814398.2.
European Office Action dated Jul. 28, 2016 for EP Application No. 12857376.3.
European Office Action dated Jun. 29, 2020 for EP Application No. 19150851.4.
European Search Report dated Apr. 24, 2018 for EP Application No. 17197774.7.
European Search Report dated Jan. 17, 2019 for EP Application No. 15873818.7.
European Search Report dated Jan. 30, 2018 for EP Application No. 15814398.2.
European Search Report dated Jul. 10, 2015 for EP Application No. 12857376.3.
European Search Report dated Mar. 28, 2019 for EP Application No. 17197774.7.
European Search Report dated Mar. 29, 2019 for EP Application No. 19150851.4.
International Preliminary Report on Patentability dated Jan. 12, 2017, in PCT/US2015/039089.
International Preliminary Report on Patentability dated Jun. 26, 2014 in PCT/US2012/068817.
International Preliminary Report on Patentability dated Jun. 27, 2017, in PCT/US2015/00411.
International Search Report and Written Opinion dated Jun. 29, 2016, in PCT/US2015/00411.
International Search Report and Written Opinion dated Mar. 29, 2013, in PCT/US2012/068817.
International Search Report and Written Opinion dated Oct. 30, 2015, in PCT/US2015/039089.
KR Notice of Decision to Grant, dated Jan. 30, 2020, in KR Application No. 2014-7018018.
KR Office Action dated Dec. 20, 2018 in KR Application No. 2014-7018018.
KR Office Action dated Oct. 30, 2019 in KR Application No. 2014-7018018.
KR Office Action, Notification of Provisional Rejection, dated Apr. 8, 2021 in KR Application No. 10-2020-7008593.
KR Office Action, Notification of Provisional Rejection, dated Jun. 22, 2020 in KR Application No. 10-2020-7008593.
Minutes of the Oral Proceedings dated Dec. 3, 2020 for EP Application No. 17197774.7.
Notice of Allowance dated Dec. 9, 2020 for EP Application No. 17197774.7.
Notice of Allowance dated May 17, 2021 for EP Application No. 15873818.7.
Preliminary Amendment filed Apr. 6, 2015 in U.S. Appl. No. 14/512,297.
Preliminary Amendment filed Aug. 31, 2015 in U.S. Appl. No. 14/822,732.
Preliminary Amendment filed Feb. 23, 2015 in U.S. Appl. No. 14/423,085.
Preliminary Amendment filed Jul. 28, 2014 in U.S. Appl. No. 14/325,290.
Preliminary Amendment filed Jul. 7, 2014 in U.S. Appl. No. 14/363,769.
Preliminary Amendment filed Oct. 21, 2014 in U.S. Appl. No. 14/363,769.
Response to Summons dated Oct. 23, 2020 for EP Application No. 17197774.7.
Results of the telephone consultation dated Dec. 1, 2020 for EP Application No. 17197774.7.
RU Notice of Allowance dated Jul. 19, 2017 in RU Application No. 2014128536.
RU Office Action dated Apr. 14, 2017 in RU Application No. 2014128536.
Singapore Exam Report and Grant Notice dated Mar. 5, 2018 for SG Application No. 10201608917Q.

(56) References Cited

OTHER PUBLICATIONS

Singapore Search Report and Written Opinion dated Apr. 19, 2017 for SG Application No. 10201608917Q.
Summons to attend oral proceedings dated May 12, 2020 for EP Application No. 17197774.7.
Taiwanese Notice of Allowance dated May 28, 2021 for TW Application No. 109106926 with English Translation.
Taiwanese Office Action dated Jan. 31, 2019 for TW Application No. 104121575.
Taiwanese Office Action dated Nov. 12, 2020 for TW Application No. 109106926 with English Translation.
TW Office Action dated Aug. 31, 2018 in TW Application No. 106146406.
TW Office Action dated Feb. 15, 2017 in TW Application No. 101146775.
TW Office Action dated Jun. 20, 2018 in TW Application No. 106119450.
TW Office Action dated May 10, 2021 in TW Application No. 108117698.
TW Office Action dated Oct. 20, 2016 in TW Application No. 101146775.
U.S. Corrected Notice of Allowability dated Apr. 24, 2020 in U.S. Appl. No. 15/539,650.
U.S. Final Office Action dated Aug. 22, 2019 in U.S. Appl. No. 15/491,869.
U.S. Final Office Action dated Oct. 16, 2017 in U.S. Appl. No. 15/364,162.
U.S. Notice of Allowance (corrected) dated May 19, 2016 in U.S. Appl. No. 14/362,863.
U.S. Notice of Allowance dated Apr. 26, 2019 for U.S. Appl. No. 15/934,854.
U.S. Notice of Allowance dated Feb. 6, 2018 in U.S. Appl. No. 15/364,162.
U.S. Notice of Allowance dated Jan. 2, 2019 in U.S. Appl. No. 15/390,421.
U.S. Notice of Allowance dated Jan. 23, 2020 in U.S. Appl. No. 15/539,650.
U.S. Notice of Allowance dated Jan. 4, 2019 for U.S. Appl. No. 15/934,854.
U.S. Notice of Allowance dated Jun. 26, 2018 in U.S. Appl. No. 14/822,732.
U.S. Notice of Allowance dated Mar. 12, 2021 for U.S. Appl. No. 16/523,852.
U.S. Notice of Allowance dated May 12, 2017 for U.S. Appl. No. 14/512,297.
U.S. Notice of Allowance dated May 14, 2020 in U.S. Appl. No. 15/491,869.
U.S. Notice of Allowance dated May 15, 2020 in U.S. Appl. No. 15/539,650.
U.S. Notice of Allowance dated May 23, 2018 in U.S. Appl. No. 15/390,421.
U.S. Notice of Allowance dated May 6, 2016 in U.S. Appl. No. 14/362,863.
U.S. Notice of Allowance dated Nov. 23, 2020 in U.S. Appl. No. 16/195,693.
U.S. Notice of Allowance dated Oct. 4, 2016 for U.S. Appl. No. 14/512,297.
U.S. Notice of Allowance dated Sep. 19, 2018 in U.S. Appl. No. 15/390,421.
U.S. Notice of Allowance dated Sep. 23, 2019 for U.S. Appl. No. 14/884,683.
U.S. Office Action dated Apr. 2, 2020 for U.S. Appl. No. 16/523,852.
U.S. Office Action dated Aug. 1, 2018 for U.S. Appl. No. 15/934,854.
U.S. Office Action dated Feb. 15, 2019 in U.S. Appl. No. 15/491,869.
U.S. Office Action dated Jan. 10, 2020 in U.S. Appl. No. 15/491,869.
U.S. Office Action dated Jan. 29, 2016 in U.S. Appl. No. 14/362,863.
U.S. Office Action dated Jun. 29, 2018 in U.S. Appl. No. 15/491,869.
U.S. Office Action dated Mar. 28, 2017 for U.S. Appl. No. 15/364,162.
U.S. Office Action dated May 10, 2016 for U.S. Appl. No. 14/512,297.
U.S. Office Action dated May 15, 2019 for U.S. Appl. No. 14/884,683.
U.S. Office Action dated Oct. 15, 2015 for U.S. Appl. No. 14/512,297.
U.S. Office Action dated Oct. 25, 2019 for U.S. Appl. No. 16/523,852.
U.S. Office Action dated Oct. 31, 2018 for U.S. Appl. No. 14/884,683.
U.S. Office Action dated Sep. 12, 2017 in U.S. Appl. No. 14/822,732.
U.S. Office Action dated Sep. 16, 2020 for U.S. Appl. No. 16/523,852.
U.S. Appl. No. 15/364,162, inventors Parker et al., filed Nov. 29, 2016.
U.S. Appl. No. 15/390,421, inventors Dixit et al., filed Dec. 23, 2016.
U.S. Appl. No. 15/491,869, inventors Strong et al., filed Apr. 19, 2017.
U.S. Appl. No. 15/539,650, inventors Dixit et al., filed Jun. 23, 2017.
U.S. Appl. No. 15/934,854, inventors Parker et al., filed Mar. 23, 2018.
U.S. Appl. No. 16/195,693, inventors Dixit et al., filed Nov. 19, 2018.
U.S. Appl. No. 16/523,852, inventors Parker et al., filed Jul. 26, 2019.
U.S. Appl. No. 16/947,834, inventors Strong et al., filed Aug. 19, 2020.
U.S. Appl. No. 16/947,841, inventors Dixit et al., filed Aug. 19, 2020.
U.S. Appl. No. 13/312,057, filed Dec. 6, 2011, entitled "Spacers for Insulated Glass Units".
U.S. Appl. No. 13/326,168, filed Dec. 14, 2011, entitled "Connectors For Smart Windows".
U.S. Appl. No. 13/452,032, filed Apr. 20, 2012, entitled "Angled Bus Bar".
U.S. Appl. No. 13/456,056, filed Apr. 25, 2012, entitled "Electrochromic Window Fabrication Methods".
U.S. Appl. No. 13/968,258, filed Aug. 15, 2013.
U.S. Appl. No. 14/103,660, filed Dec. 11, 2013, entitled "Connectors for Smart".
U.S. Appl. No. 14/152,873, filed Jan. 10, 2014, entitled "Spacers for Insulated Glass Units".
U.S. Appl. No. 14/196,895, filed Mar. 4, 2014, entitled "Improved Spacers and Connectors for Insulated Glass Units".
U.S. Appl. No. 14/325,290, filed Jan. 7, 2015.
U.S. Appl. No. 14/325,290, filed Jul. 7, 2014, entitled "Connectors for Smart Windows".
U.S. Appl. No. 14/363,769, filed Jun. 6, 2014, entitled "Connectors for Smart Windows"—371 national phase application.
U.S. Appl. No. 14/512,297, filed Oct. 10, 2014, entitled "Electrochromic Window Fabrication Methods", and prelim amendment filed Oct. 10, 2014.
U.S. Appl. No. 14/822,732, filed Aug. 10, 2015, entitled "Thin-Film Devices and Fabrication".
U.S. Appl. No. 14/884,683, filed Oct. 15, 2015, entitled "Fabrication of Low Defectivity Electrochromic Devices".
U.S. Preliminary Amendment dated Sep. 17, 2019 for U.S. Appl. No. 16/523,852.
U.S. Preliminary Amendment filed Aug. 26, 2020 in U.S. Appl. No. 16/947,834.
U.S. Preliminary Amendment filed Aug. 31, 2020 in U.S. Appl. No. 16/947,841.
U.S. Preliminary Amendment filed Nov. 20, 2018 in U.S. Appl. No. 16/195,693.
U.S. Preliminary Amendment filed Jan. 12, 2017 for U.S. Appl. No. 15/364,162.
U.S. Preliminary Amendment filed Apr. 17, 2018 in U.S. Appl. No. 15/934,854.
U.S. Preliminary Amendment filed Apr. 20, 2017 for U.S. Appl. No. 15/491,869.
U.S. Preliminary Amendment filed Aug. 17, 2015 in U.S. Appl. No. 14/362,863.
U.S. Preliminary Amendment filed Sep. 12, 2014 in U.S. Appl. No. 14/362,863.
IN Office Action dated Feb. 22, 2022, in Application No. IN201938042428.
EP Office Action dated Apr. 11, 2022, in Application No. EP15814398.2.

(56) References Cited

OTHER PUBLICATIONS

EP Search Report dated Apr. 7, 2022, in Application No. EP21204163.6.
U.S. Appl. No. 17/658,825, filed Apr. 12, 2022.
U.S. Preliminary Amendment filed on Apr. 12, 2022 for U.S. Appl. No. 17/658,825.
U.S. Restriction Requirement dated Apr. 15, 2022 in U.S. Appl. No. 17/304,741.
CA Office Action dated Apr. 7, 2022 in CA Application No. CA2859023.
KR Office Action dated Jan. 26, 2022, in Application No. KR1020207008593 with English translation.

* cited by examiner

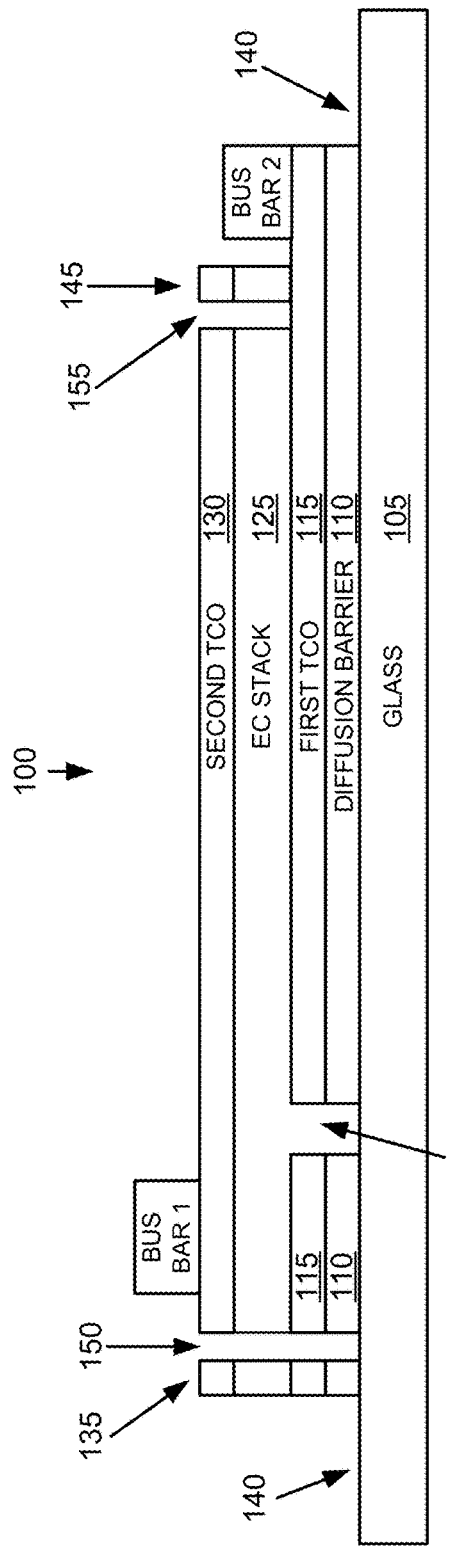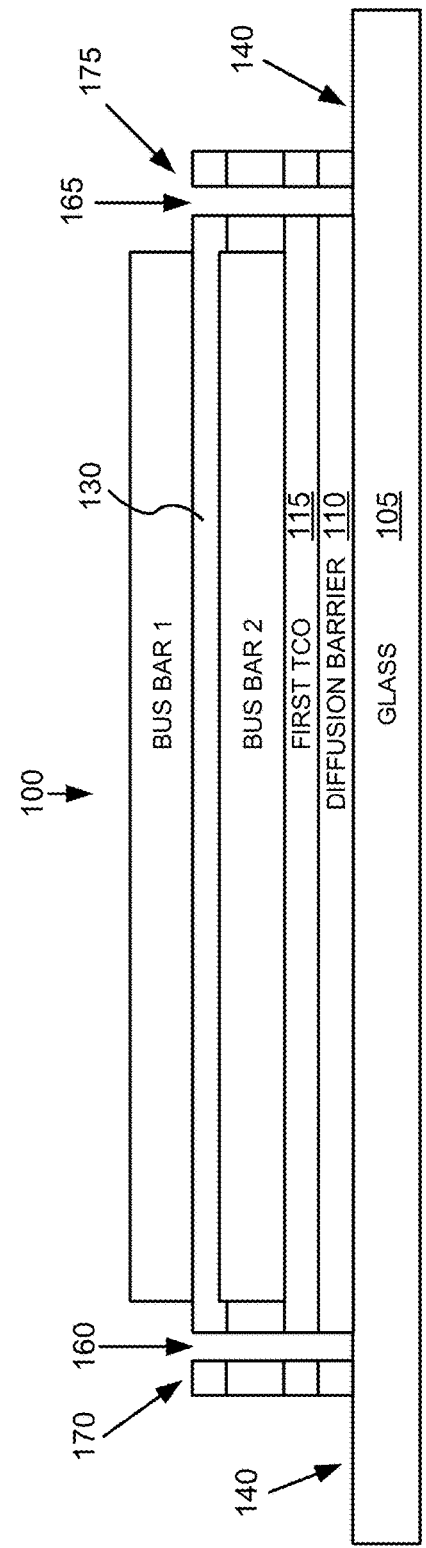

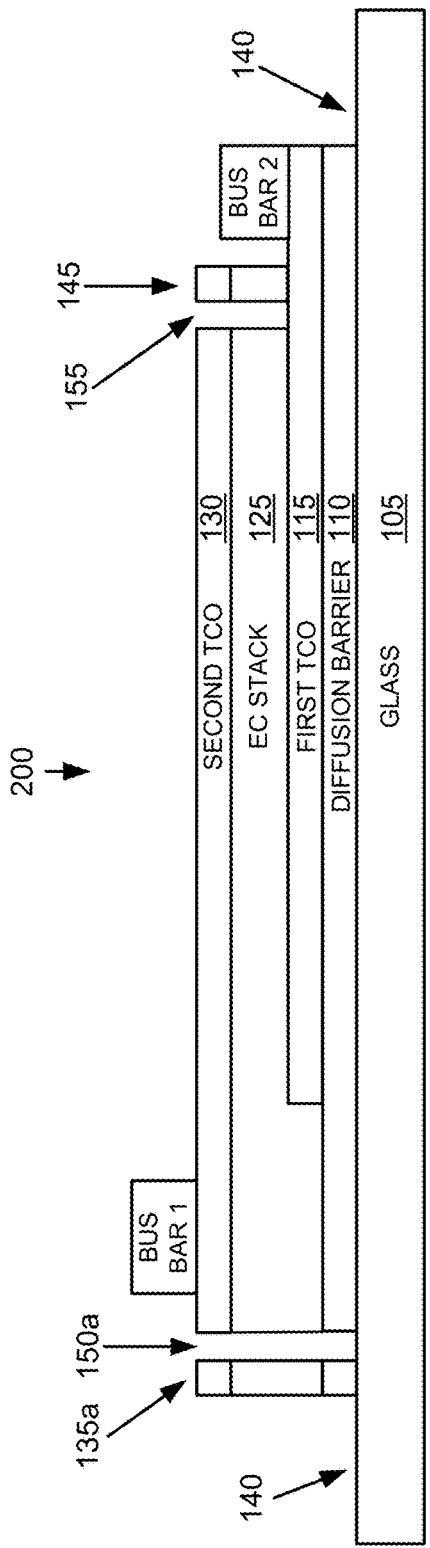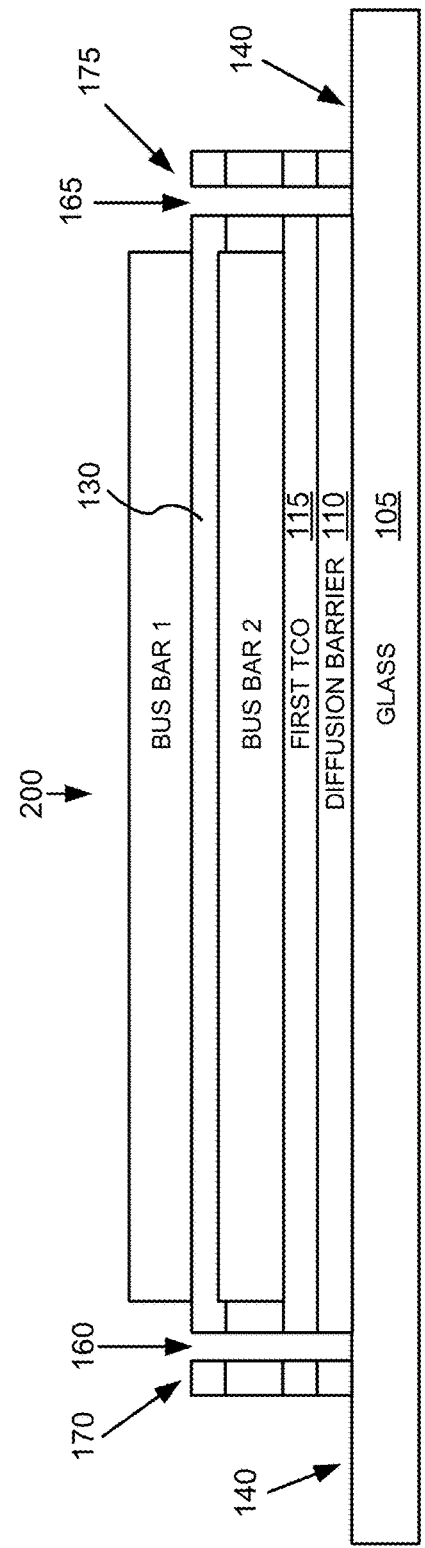

Section Z-Z' of device 440

Section W-W' of device 440

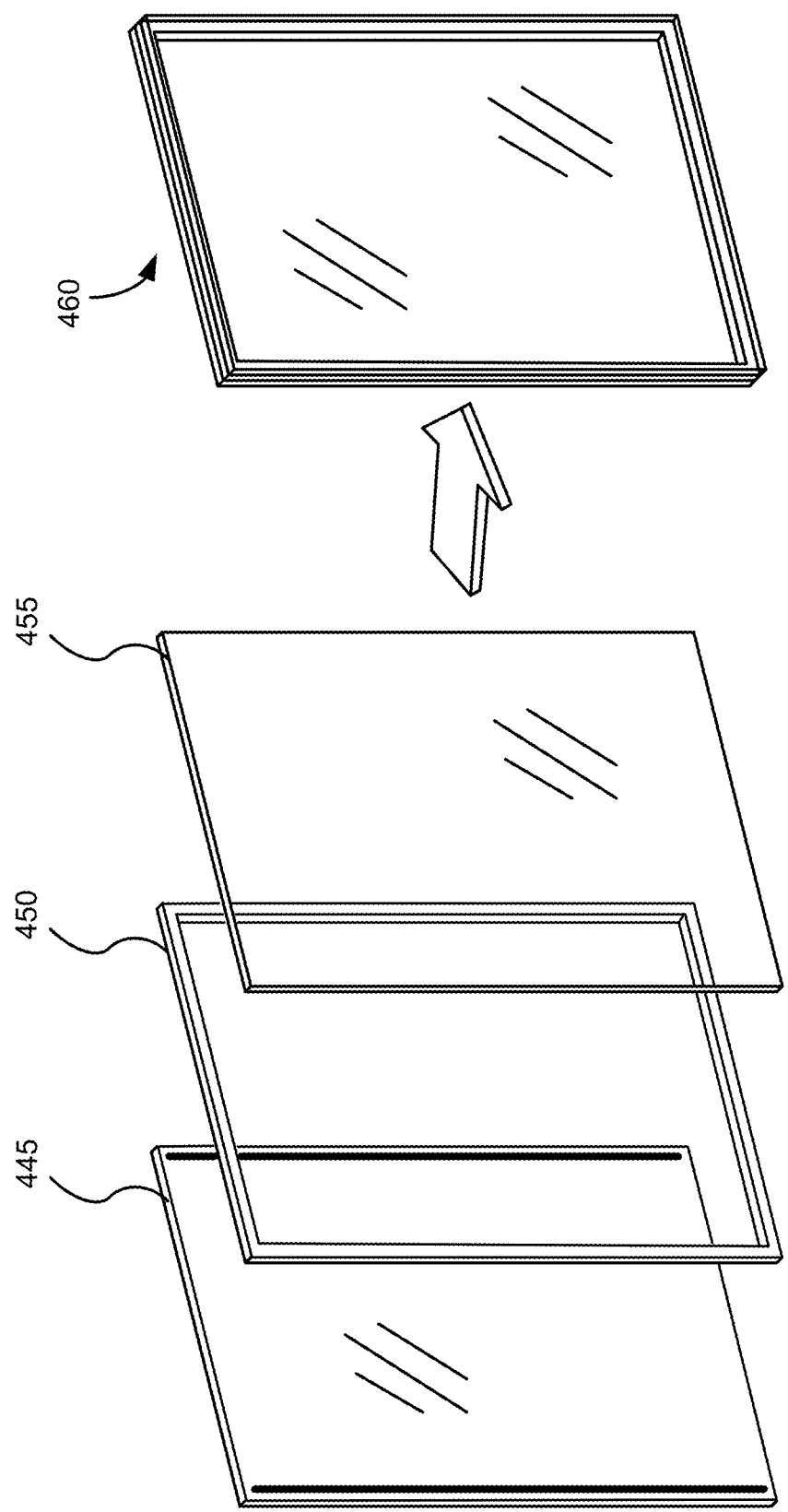

THIN-FILM DEVICES AND FABRICATION

INCORPORATION BY REFERENCE

An Application Data Sheet is filed concurrently with this specification as part of the present application. Each application that the present application claims benefit of or priority to as identified in the concurrently filed Application Data Sheet is incorporated by reference herein in its entirety and for all purposes.

FIELD

Embodiments disclosed herein relate generally to optical devices, and more particularly to methods of fabricating optical devices.

BACKGROUND

Electrochromism is a phenomenon in which a material exhibits a reversible electrochemically-mediated change in an optical property when placed in a different electronic state, typically by being subjected to a voltage change. The optical property is typically one or more of color, transmittance, absorbance, and reflectance. For example, one well known electrochromic material is tungsten oxide (WO3). Tungsten oxide is a cathodically coloring electrochromic material in which a coloration transition, bleached (non-colored) to blue, occurs by electrochemical reduction. When electrochemical oxidation takes place, tungsten oxide transitions from blue to a bleached state.

Electrochromic materials may be incorporated into, for example, windows for home, commercial and other uses. The color, transmittance, absorbance, and/or reflectance of such windows may be changed by inducing a change in the electrochromic material, that is, electrochromic windows are windows that can be darkened and lightened reversibly via application of an electric charge. A small voltage applied to an electrochromic device of the window will cause it to darken; reversing the voltage causes it to lighten. This capability allows control of the amount of light that passes through the windows, and presents an opportunity for electrochromic windows to be used as energy-saving devices.

While electrochromism was discovered in the 1960's, electrochromic devices, and particularly electrochromic windows, still unfortunately suffer various problems and have not begun to realize their full commercial potential despite many recent advancements in electrochromic technology, apparatus, and related methods of making and/or using electrochromic devices.

SUMMARY

Thin-film devices, for example, electrochromic devices for windows, and methods of manufacturing are described. Particular focus is given to methods of patterning and fabricating optical devices. Various edge deletion and isolation scribes are performed, for example, to ensure the optical device has appropriate isolation from any edge defects, but also to address unwanted coloration and charge buildup in areas of the device. Edge treatments are applied to one or more layers of optical devices during fabrication. Methods described herein apply to any thin-film device having one or more material layers sandwiched between two thin-film electrical conductor layers. The described methods create novel optical device configurations.

One embodiment is an optical device including: (i) a first conductor layer on a substrate, the first conductor layer including an area less than that of the substrate, the first conductor layer surrounded by a perimeter area of the substrate which is substantially free of the first conductor layer; (ii) one or more material layers including at least one optically switchable material, the one or more material layers configured to be within the perimeter area of the substrate and co-extensive with the first conductor layer but for at least one exposed area of the first conductor layer, the at least one exposed area of the first conductor layer free of the one or more material layers; and (iii) a second conductor layer on the one or more material layers, the second conductor layer transparent and co-extensive with the one or more material layers, where the one or more material layers and the second conductor layer overhang the first conductor layer but for the at least one exposed area of the first conductor layer. The optical device may further include a vapor barrier layer coextensive with the second conductor layer. The optical device may include a diffusion barrier between the first conductor layer and the substrate. In some embodiments, the optical device does not include an isolation scribe, i.e., there are no inactive portions of the device isolated by a scribe.

In certain embodiments, the at least one optically switchable material is an electrochromic material. The first and second conductor layers may both be transparent, but at least one is transparent. In certain embodiments, the optical device is all solid-state and inorganic. The substrate may be float glass, tempered or not.

Certain embodiments include an insulated glass unit (IGU) which includes optical devices described herein. In certain embodiments, any exposed areas of the first conducting layer are configured to be within the primary seal of the IGU. In certain embodiments, any bus bars are also configured to be within the primary seal of the IGU. In certain embodiments, any isolation or other scribes are also within the primary seal of the IGU. Optical devices described herein may be of any shape, e.g., regular polygon shaped such as rectangular, round or oval, triangular, trapezoidal, etc., or irregularly-shaped.

Some embodiments are methods of making optical devices as described herein. One embodiment is a method of fabricating an optical device including one or more material layers sandwiched between a first and a second conducting layer, the method including: (i) receiving a substrate including the first conducting layer over its work surface (e.g., an underlying glass layer with or without a diffusion barrier); (ii) removing a first width of the first conducting layer from between about 10% and about 90% of the perimeter of the substrate; (iii) depositing the one or more material layers of the optical device and the second conducting layer such that they cover the first conducting layer and, where possible (except where the portion the substrate where the first conducting layer was not removed), extend beyond the first conducting layer about its perimeter; (iv) removing a second width, narrower than the first width, of all the layers about substantially the entire perimeter of the substrate, where the depth of removal is at least sufficient to remove the first conducting layer; (v) removing at least one portion of the second transparent conducting layer and the one or more layers of the optical device thereunder thereby revealing at least one exposed portion of the first conducting layer; and (vi) applying an electrical connection, e.g. a bus bar, to the at least one exposed portion of the first transparent conducting layer; where at least one of the first and second conducting layers is transparent.

In one embodiment, (ii) includes removing the first width of the first conducting layer from between about 50% and about 75% around the perimeter of the substrate. In one embodiment, the at least one exposed portion of the first conducting layer exposed is fabricated along the perimeter portion of the optical device proximate the side or sides of the substrate where the first conducting layer was not removed in (ii). Methods may further include applying at least one additional electrical connection (e.g., a second bus bar) to the second conducting layer. Aspects of methods described herein may be performed in an all vacuum integrated deposition apparatus. Methods may further include fabricating an IGU using optical devices as described herein.

Certain embodiments include fabrication methods, and resulting devices, having particular edge treatments which create more robust and better performing devices. For example the edge of an electrochromic device layer or layers may be tapered in order to avoid stress and cracking in overlying layers of the device construct. In another example, lower conductor exposure for bus bar application is carried out to ensure good electrical contact and uniform coloration front in the electrochromic device. In certain embodiments, device edge treatments, isolation scribes and lower conductor layer exposures are performed using variable depth laser scribes.

These and other features and advantages will be described in further detail below, with reference to the associated drawings.

BRIEF DESCRIPTION OF THE DRAWINGS

The following detailed description can be more fully understood when considered in conjunction with the drawings in which:

FIGS. 1A, 1B, and 1C are cross-section, end view, and top view drawings respectively of an electrochromic device fabricated on a glass substrate.

FIGS. 2B-2C are cross-sectional and end view drawings respectively of an improved device architecture similar to that described in relation to FIG. 2A.

FIG. 4F is a schematic drawing in the perspective view depicting fabrication of an IGU with an optical device.

DETAILED DESCRIPTION

For the purposes of brevity, embodiments are described in terms of electrochromic devices; however, the scope of the disclosure is not so limited. One of ordinary skill in the art would appreciate that methods described can be used to fabricate virtually any thin-film device where one or more layers are sandwiched between two thin-film conductor layers. Certain embodiments are directed to optical devices, that is, thin-film devices having at least one transparent conductor layer. In the simplest form, an optical device includes a substrate and one or more material layers sandwiched between two conductor layers, one of which is transparent. In one embodiment, an optical device includes a transparent substrate and two transparent conductor layers. In another embodiment, an optical device includes a transparent substrate upon which is deposited a transparent conductor layer (the lower conductor layer) and the other (upper) conductor layer is not transparent. In another embodiment, the substrate is not transparent, and one or both of the conductor layers is transparent. Some examples of optical devices include electrochromic devices, flat panel displays, photovoltaic devices, suspended particle devices (SPD's), liquid crystal devices (LCD's), and the like. For context, a description of electrochromic devices is presented below. For convenience, all solid-state and inorganic electrochromic devices are described; however, embodiments are not limited in this way.

Figure 1C:
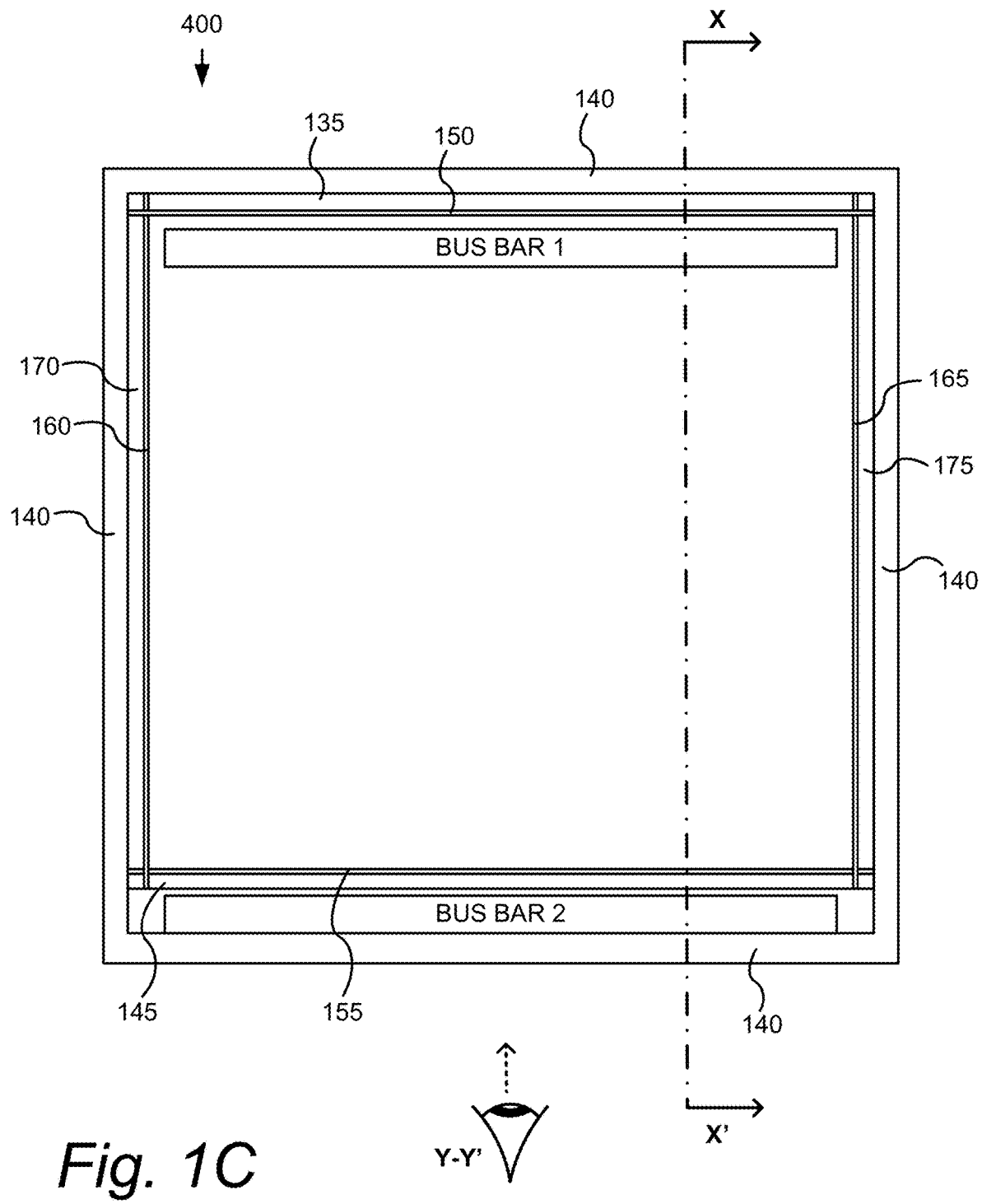

A particular example of an electrochromic lite is described with reference to FIGS. 1A-1D, in order to illustrate embodiments described herein. The electrochromic lite includes an electrochromic device fabricated on a substrate. FIG. 1A is a cross-sectional representation (see cut X-X' of FIG. 1C) of an electrochromic lite, 100, which is fabricated starting with a glass sheet, 105. FIG. 1B shows an end view (see perspective Y-Y' of FIG. 1C) of electrochromic lite 100, and FIG. 1C shows a top-down view of electrochromic lite 100.

FIG. 1A shows the electrochromic lite 100 after fabrication on glass sheet 105 and the edge has been deleted to produce area 140 around the perimeter of the lite. Edge deletion refers to removing one or more material layers from the device about some perimeter portion of the substrate. Typically, though not necessarily, edge deletion removes material down to and including the lower conductor layer (e.g., layer 115 in the example depicted in FIGS. 1A-1D), and may include removal of any diffusion barrier layer(s) down to the substrate itself. In FIGS. 1A-1B, the electrochromic lite 100 has also been laser scribed and bus bars have been attached. The glass lite, 105, has a diffusion barrier, 110, and a first transparent conducting oxide (TCO) 115 on the diffusion barrier.

In this example, the edge deletion process removes both TCO 115 and diffusion barrier 110, but in other embodiments, only the TCO is removed, leaving the diffusion barrier intact. The TCO layer 115 is the first of two conductive layers used to form the electrodes of the electrochromic device fabricated on the glass sheet. In some examples, the glass sheet may be prefabricated with the diffusion barrier formed over underlying glass. Thus, the diffusion barrier is formed, and then the first TCO 115, an EC stack 125 (e.g., stack having electrochromic, ion conductor, and counter electrode layers), and a second TCO, 130, are formed. In other examples, the glass sheet may be prefabricated with both the diffusion barrier and the first TCO 115 formed over underlying glass.

In certain embodiments, one or more layers may be formed on a substrate (e.g., glass sheet) in an integrated deposition system where the substrate does not leave the integrated deposition system at any time during fabrication of the layer(s). In one embodiment, an electrochromic device including an EC stack and a second TCO may be fabricated in the integrated deposition system where the glass sheet does not leave the integrated deposition system at any time during fabrication of the layers. In one case, the first TCO layer may also be formed using the integrated deposition system where the glass sheet does not leave the integrated deposition system during deposition of the EC stack, and the TCO layer(s). In one embodiment, all of the layers (e.g., diffusion barrier, first TCO, EC stack, and second TCO) are deposited in the integrated deposition system where the glass sheet does not leave the integrated deposition system during deposition. In this example, prior to deposition of EC stack 125, an isolation trench, 120, may be cut through first TCO 115 and diffusion barrier 110. Trench 120 is made in contemplation of electrically isolating an area of first TCO 115 that will reside under bus bar 1 after fabrication is complete (see FIG. 1A). Trench 120 is sometimes referred to as the "L1" scribe, because it is the first laser scribe in certain processes. This is done to avoid charge buildup and coloration of the EC device under the bus bar, which can be undesirable. This undesirable result is explained in more detail below and was the impetus for certain embodiments described herein. That is, certain embodiments are directed toward eliminating the need for isolation trenches, such as trench 120, for example, to avoid charge buildup under a bus bar, but also to simplify fabrication of the device by reducing or even eliminating laser isolation scribe steps.

After formation of the EC device, edge deletion processes and additional laser scribing are performed. FIGS. 1A and 1B depict areas 140 where the EC device has been removed, in this example, from a perimeter region surrounding laser scribe trenches, 150, 155, 160 and 165. Laser scribes 150, 160 and 165 are sometimes referred to as "L2" scribes, because they are the second scribes in certain processes. Laser scribe 155 is sometimes referred to as the "L3" scribe, because it is the third scribe in certain processes. The L3 scribe passes through second TCO, 130, and in this example (but not necessarily) the EC stack 125, but not the first TCO 115. Laser scribe trenches 150, 155, 160, and 165 are made to isolate portions of the EC device, 135, 145, 170, and 175, which were potentially damaged during edge deletion processes from the operable EC device. In one embodiment, laser scribe trenches 150, 160, and 165 pass through the first TCO to aid in isolation of the device (laser scribe trench 155 does not pass through the first TCO, otherwise it would cut off bus bar 2's electrical communication with the first TCO and thus the EC stack). In some embodiments, such as those depicted in FIGS. 1A-1D, laser scribe trenches 150, 160, and 165 may also pass through a diffusion barrier.

The laser or lasers used for the laser scribe processes are typically, but not necessarily, pulse-type lasers, for example, diode-pumped solid state lasers. For example, the laser scribe processes can be performed using a suitable laser. Some examples of suppliers that may provide suitable lasers include IPG Photonics Corp. (of Oxford, Mass.), Ekspla (of Vilnius, Lithuania), TRUMPF Inc. (Farmington, Conn.), SPI Lasers LLC (Santa Clara, Calif.), Spectra-Physics Corp. (Santa Clara, Califor.), nLIGHT Inc. (Vancouver, Wash.), and Fianium Inc. (Eugene, Oreg.). Certain scribing steps can also be performed mechanically, for example, by a diamond tipped scribe; however, certain embodiments describe depth control during scribes or other material removal processing, which is well controlled with lasers. For example, in one embodiment, edge deletion is performed to the depth of the first TCO, in another embodiment edge deletion is performed to the depth of a diffusion barrier (the first TCO is removed), in yet another embodiment edge deletion is performed to the depth of the substrate (all material layers removed down to the substrate). In certain embodiments, variable depth scribes are described.

After laser scribing is complete, bus bars are attached. Non-penetrating bus bar (1) is applied to the second TCO. Non-penetrating bus bar (2) is applied to an area where the device including an EC stack and a second TCO was not deposited (for example, from a mask protecting the first TCO from device deposition) or, in this example, where an edge deletion process (e.g. laser ablation using an apparatus e.g. having a XY or XYZ galvanometer) was used to remove material down to the first TCO. In this example, both bus bar 1 and bus bar 2 are non-penetrating bus bars. A penetrating bus bar is one that is typically pressed into (or soldered) and through one or more layers to make contact with a lower conductor, e.g. TCO located at the bottom of or below one or more layers of the EC stack). A non-penetrating bus bar is one that does not penetrate into the layers, but rather makes electrical and physical contact on the surface of a conductive layer, for example, a TCO. A typical example of a non-penetrating bus bar is a conductive ink, e.g. a silver-based ink, applied to the appropriate conductive surface.

The TCO layers can be electrically connected using a non-traditional bus bar, for example, a bus bar fabricated with screen and lithography patterning methods. In one embodiment, electrical communication is established with the device's transparent conducting layers via silk screening (or using another patterning method) a conductive ink followed by heat curing or sintering the ink. Advantages to using the above described device configuration include simpler manufacturing, for example, and less laser scribing than conventional techniques which use penetrating bus bars.

After the bus bars are fabricated or otherwise applied to one or more conductive layers, the electrochromic lite may be integrated into an insulated glass unit (IGU), which includes, for example, wiring for the bus bars and the like. In some embodiments, one or both of the bus bars are inside the finished IGU. In particular embodiments, both bus bars are configured between the spacer and the glass of the IGU (commonly referred to as the primary seal of the IGU); that is, the bus bars are registered with the spacer used to separate the lites of an IGU. Area 140 is used, at least in part, to make the seal with one face of the spacer used to form the IGU. Thus, the wires or other connection to the bus bars runs between the spacer and the glass. As many spacers are made of metal, e.g., stainless steel, which is conductive, it is desirable to take steps to avoid short circuiting due to electrical communication between the bus bar and connector thereto and the metal spacer. Particular methods and apparatus for achieving this end are described in U.S. patent application Ser. No. 13/312,057, filed Dec. 6, 2011, and titled "Improved Spacers for Insulated Glass Units," which is hereby incorporated by reference in its entirety. In certain embodiments described herein, methods and resulting IGUs include having the perimeter edge of the EC device, bus bars and any isolation scribes are all within the primary seal of the IGU.

Figure 1D:
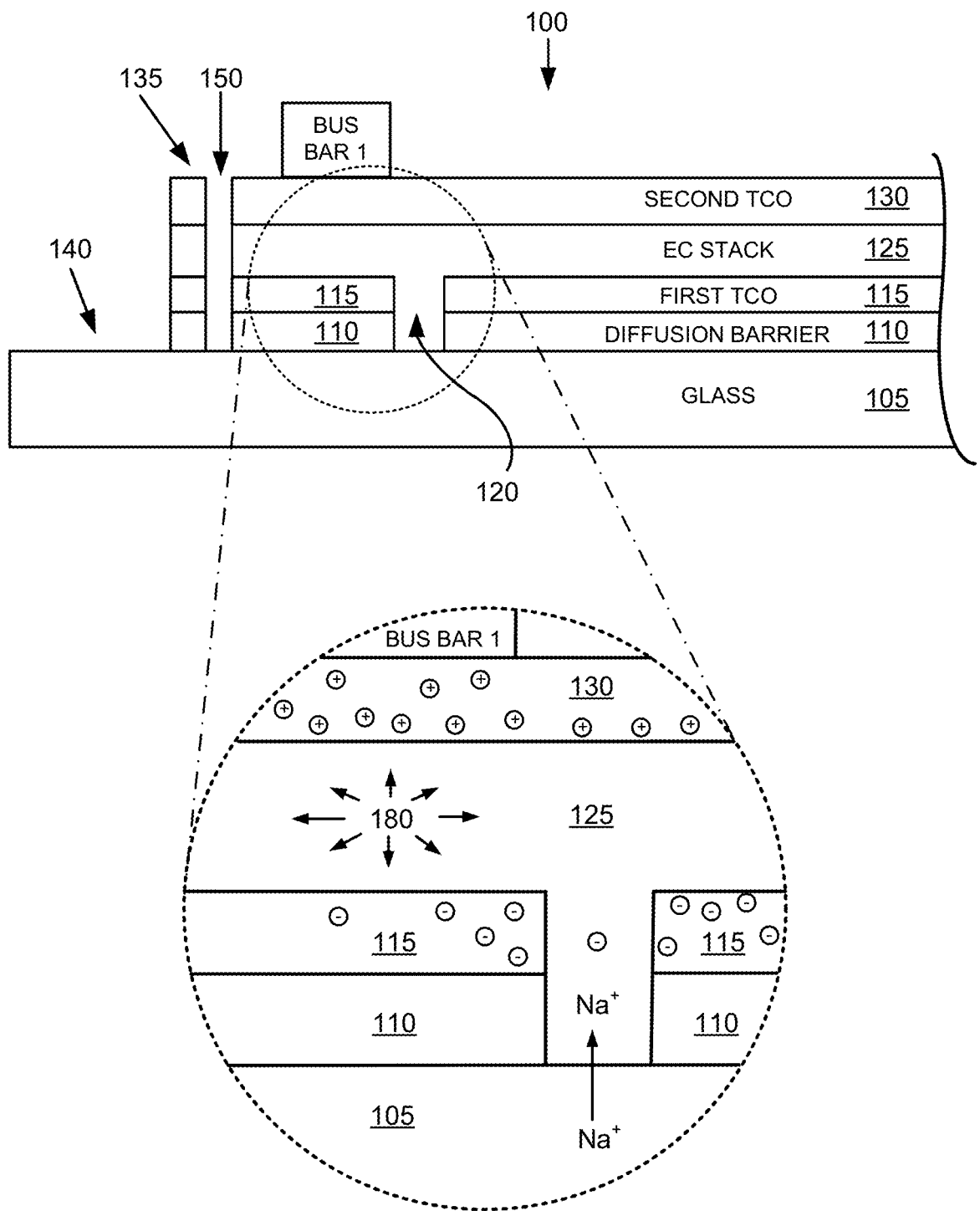
FIG. 1D is a detailed portion of the cross-section shown in FIG. 1A.

FIG. 1D depicts a portion of the cross section in FIG. 1A, where a portion of the depiction is expanded to illustrate an issue for which certain embodiments disclosed herein may overcome. Prior to fabrication of EC stack 125 on TCO 115, an isolation trench, 120, is formed through TCO 115 and diffusion barrier 110 in order to isolate a portion of the 115/110 stack from a larger region. This isolation trench is intended to cut off electrical communication of the lower TCO 115, which is ultimately in electrical communication with bus bar 2, with a section of TCO 115 that lies directly below bus bar 1, which lies on TCO 130 and supplies electrical energy thereto. For example, during coloration of the EC device, bus bar 1 and bus bar 2 are energized in order to apply a potential across the EC device; for example, TCO 115 has a negative charge and TCO 130 has a positive charge or visa versa.

Isolation trench 120 is desirable for a number of reasons. It is sometimes desirable not to have the EC device color under bus bar 1 since this area is not viewable to the end user (the window frame typically extends beyond the bus bars and the isolation trench and/or these features are under the spacer as described above). Also, sometimes area 140 includes the lower TCO and the diffusion barrier, and in these instances it is undesirable for the lower TCO to carry charge to the edge of the glass, as there may be shorting issues and unwanted charge loss in areas that are not seen by the end user. Also, because the portion of the EC device directly under the bus bar experiences the most charge flux, there is a predisposition for this region of the device to form defects, e.g., delamination, particle dislodging (pop-off defects), and the like, which can cause abnormal or no coloring regions that become visible in the viewable region and/or negatively affect device performance. Isolation trench 120 was designed to address these issues. Despite these desired outcomes, it has been found that coloration below the first bus bar still occurs. This phenomenon is explained in relation to the expanded section of device 100 in the lower portion of FIG. 1D.

When EC stack 125 is deposited on first TCO 115, the electrochromic materials, of which EC stack 125 is comprised, fill isolation trench 120. Though the electrical path of first TCO 115 is cut off by trench 120, the trench becomes filled with material that, although not as electrically conductive as the TCO, is able to carry charge and is permeable to ions. During operation of EC lite 100, e.g. when first TCO 115 has a negative charge (as depicted in FIG. 1D), small amounts of charge pass across trench 120 and enter the isolated portion of first TCO 115. This charge buildup may occur over several cycles of coloring and bleaching EC lite 100. Once the isolated area of TCO 115 has charge built up, it allows coloration of the EC stack 125 under bus bar 1, in area 180. Also, the charge in this portion of first TCO 115, once built up, does not drain as efficiently as charge normally would in the remaining portion of TCO 115, e.g., when an opposite charge is applied to bus bar 2. Another problem with isolation trench 120 is that the diffusion barrier may be compromised at the base of the trench. This can allow sodium ions to diffuse into the EC stack 125 from the glass substrate. These sodium ions can act as charge carriers and enhance charge buildup on the isolated portion of first TCO 115. Yet another issue is that charge buildup under the bus bar can impose excess stress on the material layers and promote defect formation in this area. Finally, fabricating an isolation scribe in the conductor layer on the substrate adds further complication to the processing steps. Embodiments described herein may overcome these problems and others.

Figure 2A:
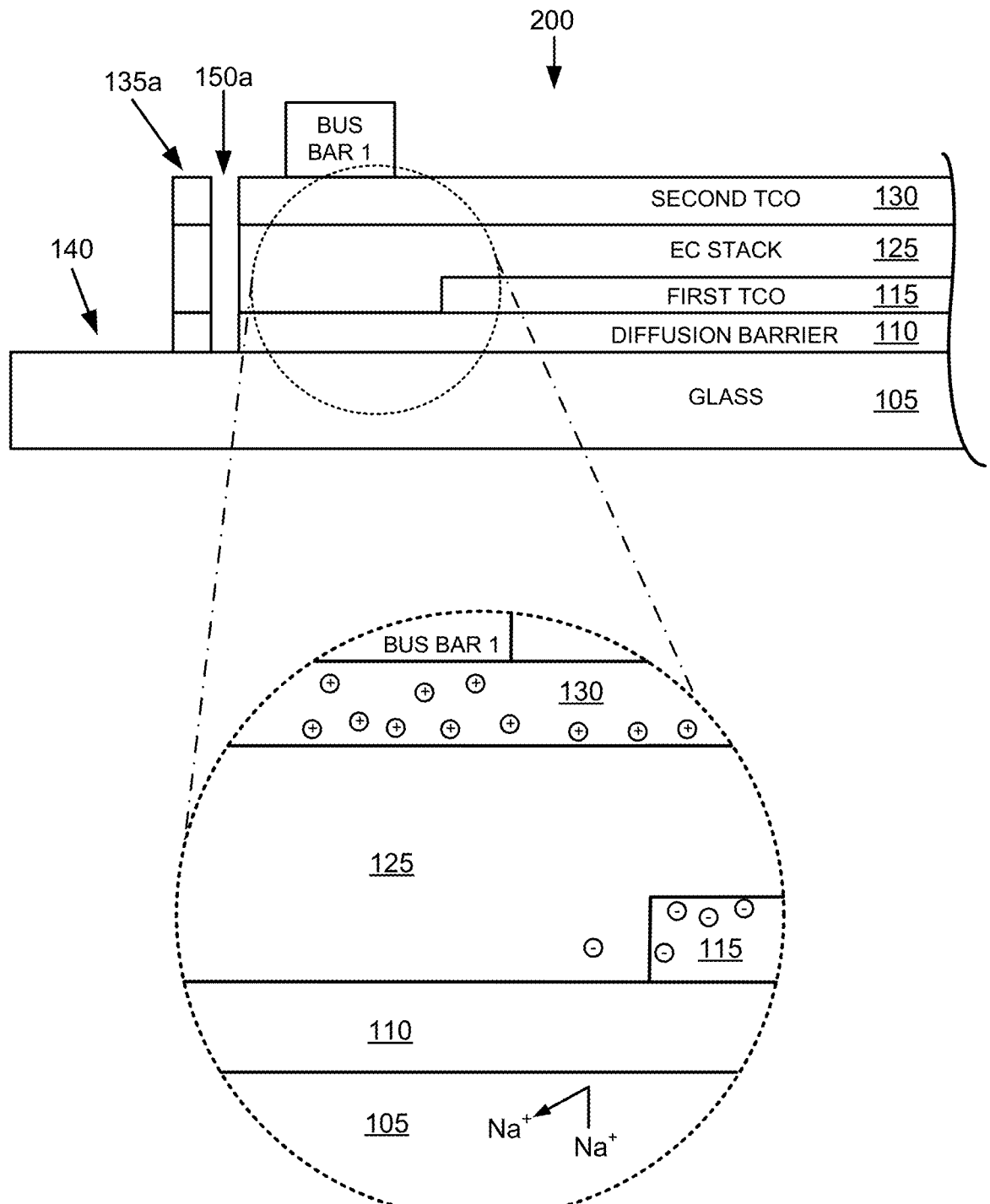
FIG. 2A is a partial cross-section of an improved electrochromic device architecture on a substrate, according to disclosed embodiments.

FIG. 2A is a partial cross-section showing an improved architecture of an EC device, 200. In this illustrated embodiment, the portion of first TCO 115 that would have extended below bus bar 1 is removed prior to fabrication of EC stack 125. In this embodiment, diffusion barrier 110 extends to under bus bar 1 and to the edge of the EC device. In some embodiments, the diffusion barrier extends to the edge of glass 105, that is, it covers area 140. In other embodiments, a portion of the diffusion barrier may also be removed under the bus bar 1. In the aforementioned embodiments, the selective TCO removal under bus bar 1 is performed prior to fabrication of EC stack 125. Edge deletion processes to form areas 140 (e.g., around the perimeter of the glass where the spacer forms a seal with the glass) can be performed prior to device fabrication or after. In certain embodiments, an isolation scribe trench, 150*a*, is formed if the edge delete process to form 140 creates a rough edge or otherwise unacceptable edge due to, e.g., shorting issues, thus isolating a portion, 135*a*, of material from the remainder of the EC device. As exemplified in the expanded portion of EC device 200 depicted in FIG. 2A, since there is no portion of TCO 115 under bus bar 1, the aforementioned problems such as unwanted coloring and charge buildup may be avoided. Also, since diffusion barrier 110 is left intact, at least co-extensive with EC stack 125, sodium ions are prevented from diffusing into the EC stack 125 and causing unwanted conduction or other problems.

In certain embodiments, a band of TCO 115 is selectively removed in the region under where bus bar 1 will reside once fabrication is complete. That is, the diffusion barrier 110 and first TCO 115 may remain on the area 140, but a width of the first TCO 115 is selectively removed under bus bar 1. In one embodiment, the width of the removed band of TCO 115 may greater than the width of the bus bar 1 which resides above the removed band of TCO once device fabrication is complete. Embodiments described herein include an EC device having the configuration as depicted and described in relation to FIG. 2A with a selectively removed band of TCO 115. In one embodiment, the remainder of the device is as depicted and described as in relation to FIGS. 1A-C.

A device similar to device 200 is depicted in FIGS. 2B and 2C, showing the device architecture including laser isolation trenches and the like. FIGS. 2B and 2C are drawings of an improved device architecture of disclosed embodiments. In certain embodiments, there are fewer, or no, laser isolation trenches made during fabrication of the device. These embodiments are described in more detail below.

Figure 2D:
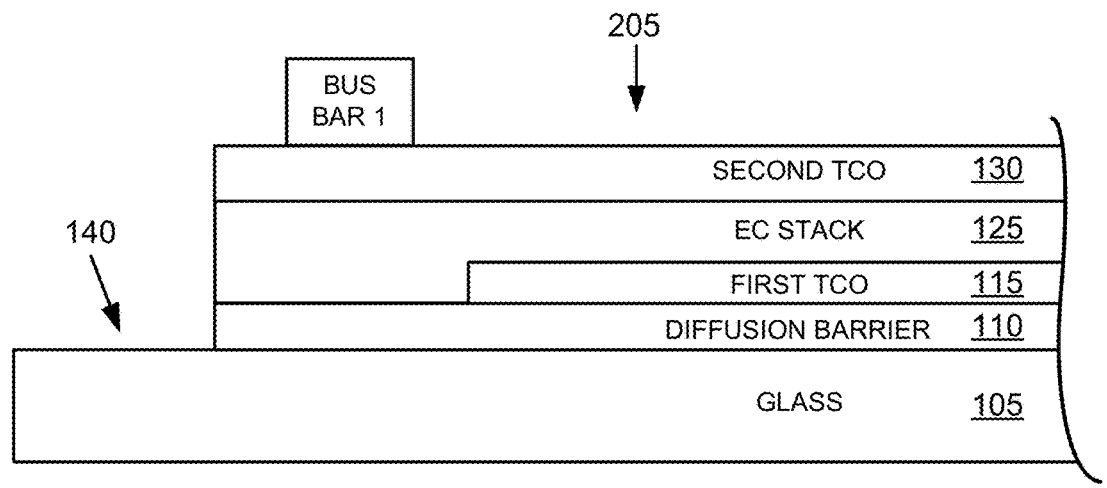
FIGS. 2D-E are partial cross-sectional and top view drawings respectively of a device with an architecture similar to that described in relation to FIGS. 2A-C.
Figure 2E:
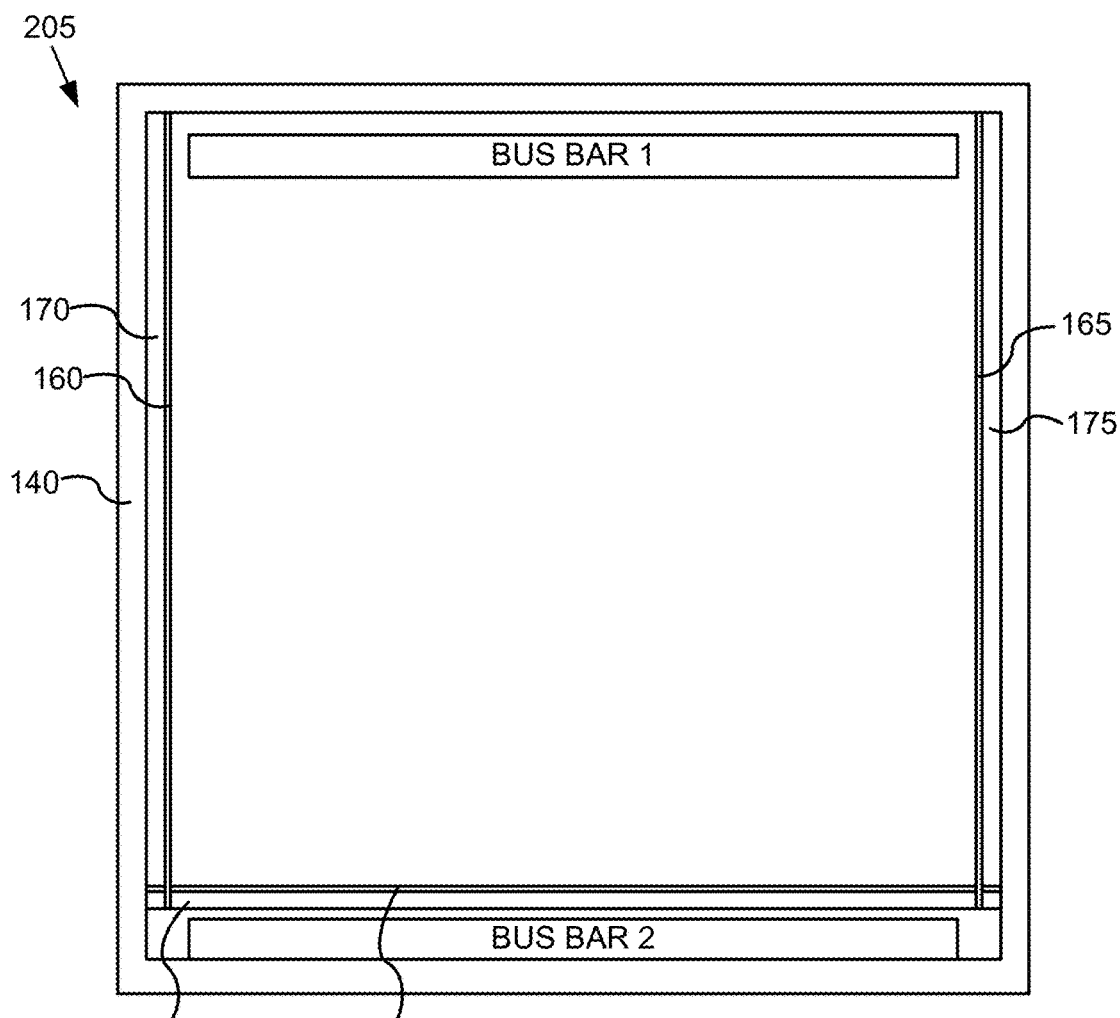

FIGS. 2D and 2E depict an electrochromic device, 205, which has architecture very similar to device 200, but it has neither a laser isolation scribe 150a, nor an isolated region, 135a, of the device that is non-functional. Certain laser edge delete processes leave a sufficiently clean edge of the device such that laser scribes like 150a are not necessary. One embodiment is an optical device as depicted in FIGS. 2D and 2E but not having isolation scribes 160 and 165, nor isolated portions 170 and 175. One embodiment is an optical device as depicted in FIGS. 2D and 2E but not having isolation scribe 155, nor isolated portion 145. One embodiment is an optical device as depicted in FIGS. 2D and 2E but not having isolation scribes 160, 165, or 155, nor isolated portions 145, 170, and 175. In certain embodiments, fabrication methods do not include any laser isolation scribes and thus produce optical devices having no physically isolated non-functional portions of the device.

As described in more detail below, certain embodiments include devices where the one or more material layers of the device and the second (upper) conductor layer are not co-extensive with the first (lower) conductor layer; specifically, these portions overhang the first conductor layer about some portion of the perimeter of the area of the first conductor. These overhanging portions may or may not include a bus bar. As an example, the overhanging portions as described in relation to FIG. 2A or 3 do have a bus bar on the second conductor layer.

Figure 3:
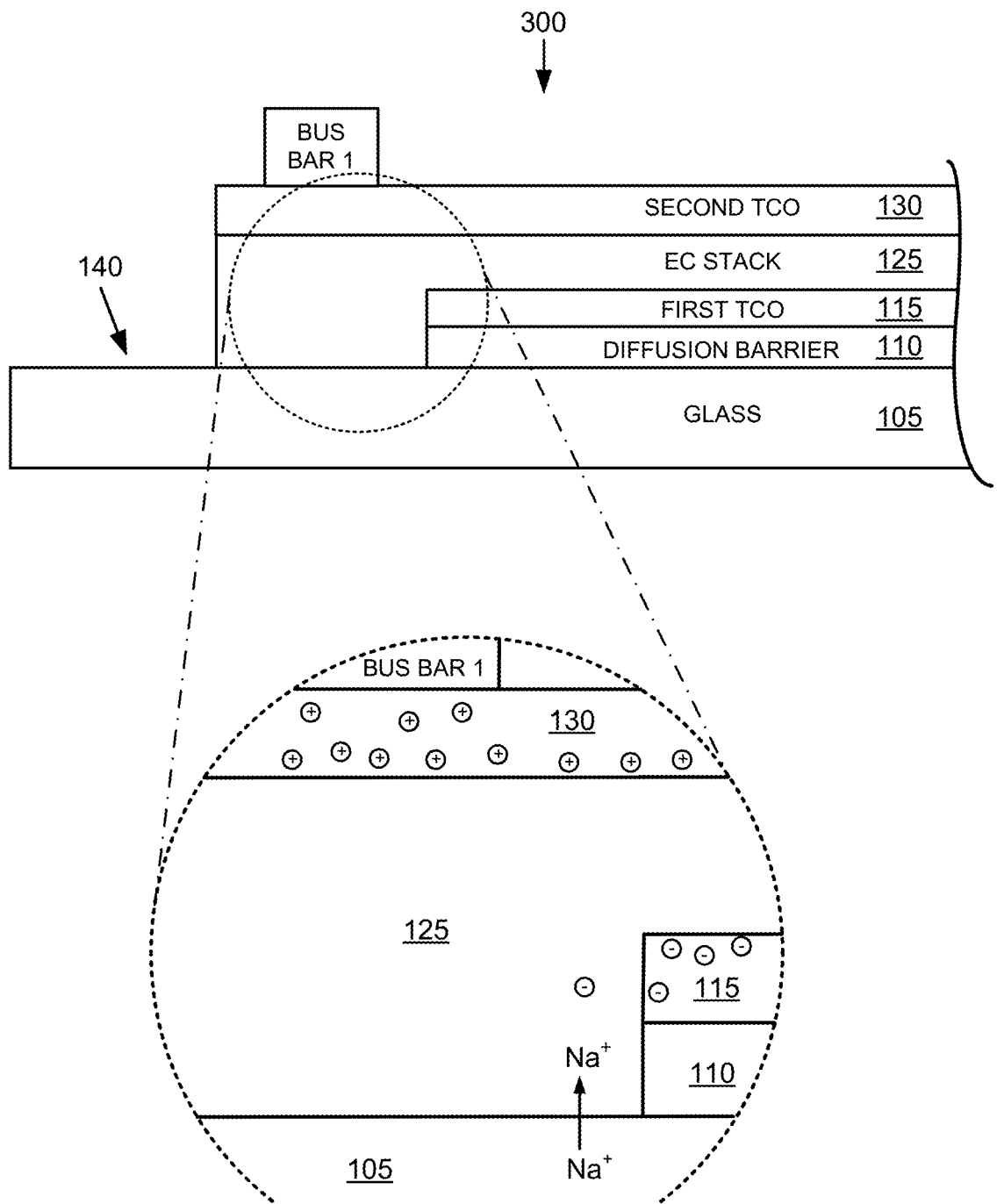
FIG. 3 is a partial cross-section showing an improved device architecture where the diffusion barrier is removed along with the lower conducting layer.

FIG. 3 is a partial cross-section showing an improved electrochromic device architecture, 300 of disclosed embodiments. In this illustrated embodiment, the portions of TCO 115 and diffusion barrier 110 that would have extended below bus bar 1 are removed prior to fabrication of EC stack 125. That is, the first TCO and diffusion barrier removal under bus bar 1 is performed prior to fabrication of EC stack 125. Edge deletion processes to form areas 140 (e.g., around the perimeter of the glass where the spacer forms a seal with the glass) can be performed prior to device fabrication (e.g., removing the diffusion barrier and using a mask thereafter) or after device fabrication (removing all materials down to the glass). In certain embodiments, an isolation scribe trench, analogous to 150a in FIG. 2A, is formed if the edge deletion process to form 140 creates a rough edge, thus isolating a portion, 135a (see FIG. 2A), of material from the remainder of the EC device.

Referring again to FIG. 3, as exemplified in the expanded portion of device 300, since there is no portion of TCO 115 under bus bar 1, therefore the aforementioned problems such as unwanted coloring and charge buildup may be avoided. In this example, since diffusion barrier 110 is also removed, sodium ions may diffuse into the EC stack in the region under bus bar 1; however, since there is no corresponding portion of TCO 115 to gain and hold charge, coloring and other issues are less problematic. In certain embodiments, a band of TCO 115 and diffusion barrier 110 is selectively removed in the region under where bus bar 1 will reside; that is, on the area 140, the diffusion barrier and TCO may remain, but a width of TCO 115 and diffusion barrier 110 is selectively removed under and at least co-extensive with bus bar 1. In one embodiment, the width of the removed band of TCO and diffusion barrier is greater than the width of the bus bar which resides above the removed band once device fabrication is complete. Embodiments described herein include an EC device having the configuration as depicted and described in relation to FIG. 3. In one embodiment, the remainder of the device is as depicted and described as in relation to FIGS. 1A-C. In certain embodiments, there are fewer, or no, laser isolation trenches made during fabrication of the device.

Embodiments include an optical device as described in relation to FIG. 3, where the remainder is as device 205 as described in relation to FIGS. 2D and 2E. One embodiment is an optical device as depicted in FIG. 3, but not having isolation scribes 160 and 165, nor isolated portions 170 and 175, as depicted FIGS. 2D and 2E. One embodiment is an optical device as depicted in FIG. 3, but not having isolation scribe 155, nor isolated portion 145, as depicted in FIGS. 2D and 2E. One embodiment is an optical device as depicted in FIG. 3, but not having isolation scribes 160, 165, or 155, nor isolated portions 145, 170, and 175, as depicted in FIGS. 2D and 2E. Any of the aforementioned embodiments may also include an isolation scribe analogous to scribe 150 as depicted in relation to FIGS. 1A-D, but not an isolation scribe analogous to scribe 120. All embodiments described herein obviate the need for a laser isolation scribe analogous to scribe 120, as described in relation to FIGS. 1A-D. In addition, the goal is to reduce the number of laser isolation scribes needed, but depending upon the device materials or lasers used for example, the scribes other than scribe 120 may or may not be necessary.

As described above, in certain embodiments, devices are fabricated without the use of laser isolation scribes, that is, the final device has no isolated portions that are non-functional. Exemplary fabrication methods are described below in terms of having no isolation scribes; however, it is to be understood that one embodiment is any device as described below, where the device has the functional equivalent (depending on its geometry) of the isolation scribes as described in relation to FIGS. 1A-D, but not isolation scribe 120. More specifically, one embodiment is an optical device as described below, but not having isolation scribes 160 and 165 as depicted FIGS. 2D and 2E. One embodiment is an optical device as described below, but not having isolation scribe 155 as depicted in FIGS. 2D and 2E. One embodiment is an optical device as described below, but not having isolation scribes 160, 165, or 155 as depicted in FIGS. 2D and 2E. Any of the aforementioned embodiments may also include an isolation scribe analogous to scribe 150 as depicted in relation to FIGS. 1A-D.

One embodiment is a method of fabricating an optical device including one or more material layers sandwiched between a first conducting layer (e.g., first TCO 115) and a second conducting layer (e.g., second TCO 130). The method includes: (i) receiving a substrate including the first conducting layer over its work surface; (ii) removing a first width of the first conducting layer from between about 10% and about 90% of the perimeter of the substrate; (iii) depositing the one or more material layers of the optical device and the second conducting layer such that they cover the first conducting layer and, where possible, extend beyond the first conducting layer about its perimeter; (iv) removing a second width, narrower than the first width, of all the layers about substantially the entire perimeter of the substrate, where the depth of removal is at least sufficient to remove the first conducting layer; (v) removing at least one portion of the second transparent conducting layer and the one or more layers of the optical device thereunder thereby revealing at least one exposed portion of the first conducting layer; and (vi) applying a bus bar to the at least one exposed portion of the first transparent conducting layer; where at least one of the first and second conducting layers is transparent. In one embodiment, (ii) includes removing the first width of the first conducting layer from between about 50% and about 75% around the perimeter of the substrate.

In one embodiment, a portion of the edge of the first conducting layer remaining after (ii) is tapered as described in more detail below. The tapered portion of the edge may include one, two or more sides if the transparent conductor is of a polygonal shape after (ii). In some cases, the first conducting layer is polished before (ii), and then optionally edge tapered. In other cases, the first conducting layer is polished after (ii), with or without edge tapering. In the latter cases, tapering can be prior to polish or after polishing.

In one embodiment, the at least one exposed portion of the first conducting layer exposed is fabricated along the perimeter portion of the optical device proximate the side or sides of the substrate where the first conducting layer was not removed in (ii). In certain embodiments, the exposed portion of the first conducting layer is not an aperture, or hole, through the one or more material layers and second conducting layer, but rather the exposed portion is an area that sticks out from an edge portion of the functional device stack layers. This is explained in more detail below with reference to particular examples.

The method may further include applying at least one second bus bar to the second conducting layer, particularly on a portion that does not cover the first conducting layer. In one embodiment, the optical device is an electrochromic device and may be all solid-state and inorganic. The substrate may be float glass and the first conducting layer may include tin oxide, e.g. fluorinated tin oxide. In one embodiment, (iii) is performed in an all vacuum integrated deposition apparatus. In certain embodiments, the method further includes depositing a vapor barrier layer on the second conducting layer prior to (iv).

In one embodiment, the at least one exposed portion of the first conducting layer is fabricated along the length of one side of the optical device, in one embodiment along the length of the side of the optical device proximate the side of the substrate where the first conducting layer was not removed in (ii). In one embodiment, the at least one second bus bar is applied to the second conducting layer proximate the side of the optical device opposite the at least one exposed portion of the first conducting layer. If a vapor barrier is applied a portion is removed in order to expose the second conductor layer for application of the at least one second bus bar. These methods are described below in relation to specific embodiments with relation to FIGS. 4A-D.

Figure 4A:
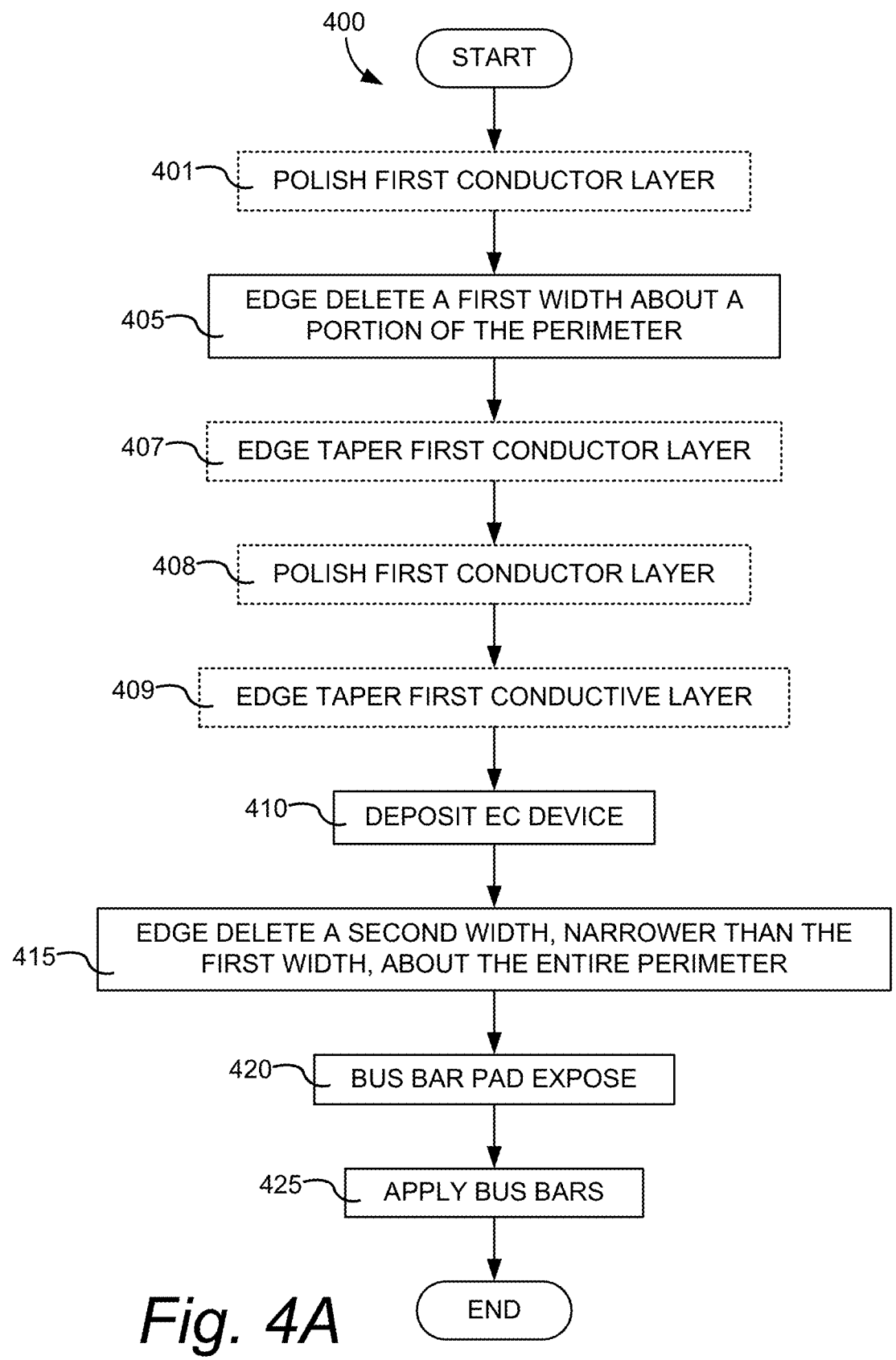
FIG. 4A is a flowchart of a process flow describing aspects of a method of fabricating an electrochromic device, according to embodiments.
Figure 4B:
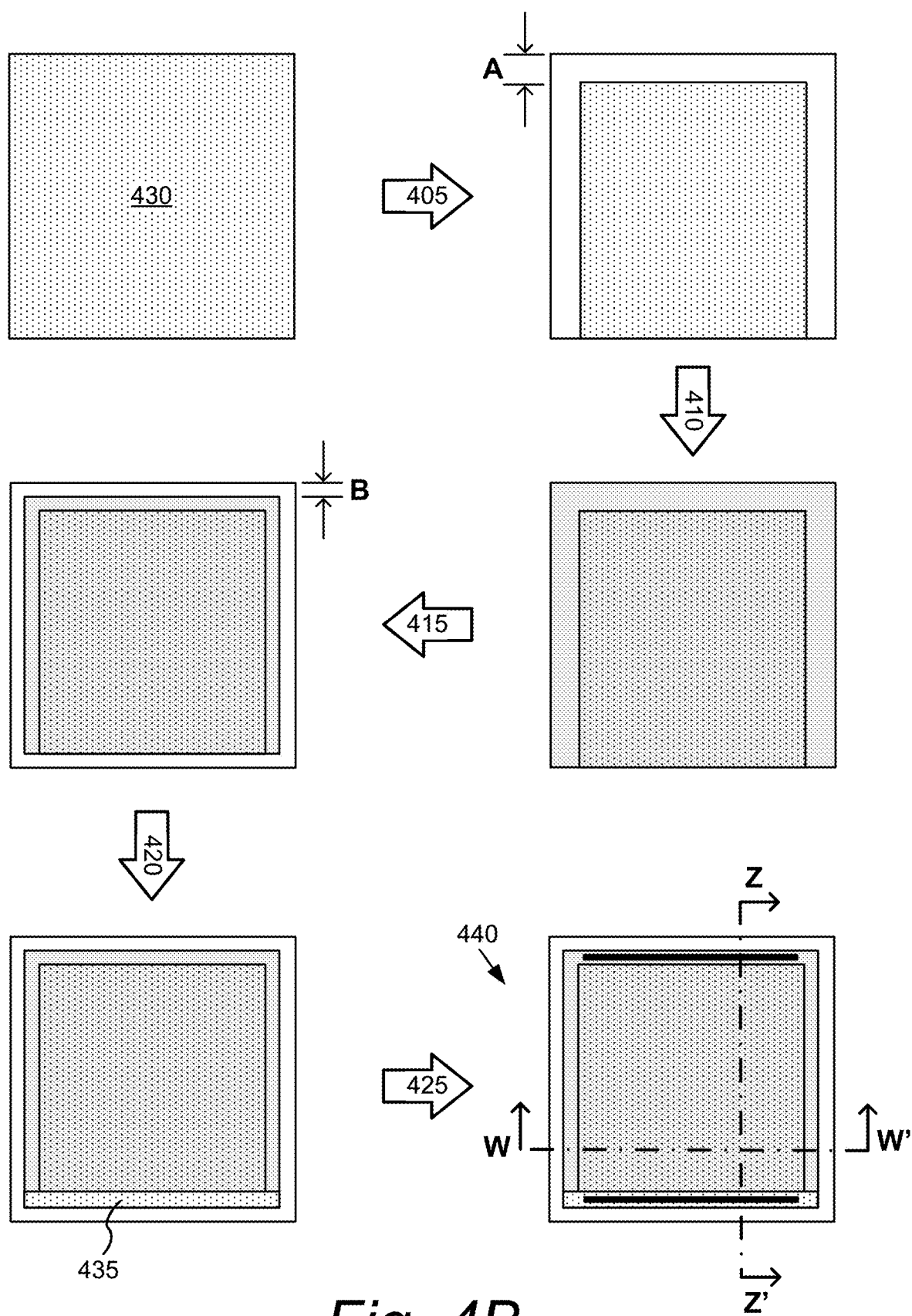
FIG. 4B are top views depicting steps in the process flow described in relation to FIG. 4A.
Figure 4C:
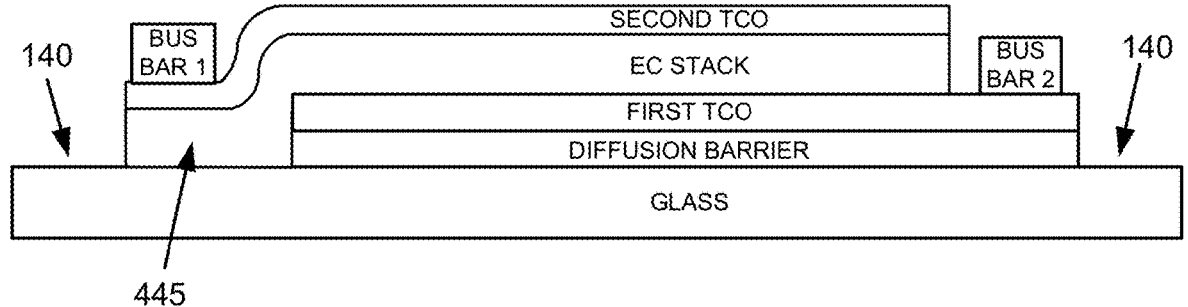
FIG. 4C depicts cross-sections of the electrochromic lite described in relation to FIG. 4B.
Figure 4C:
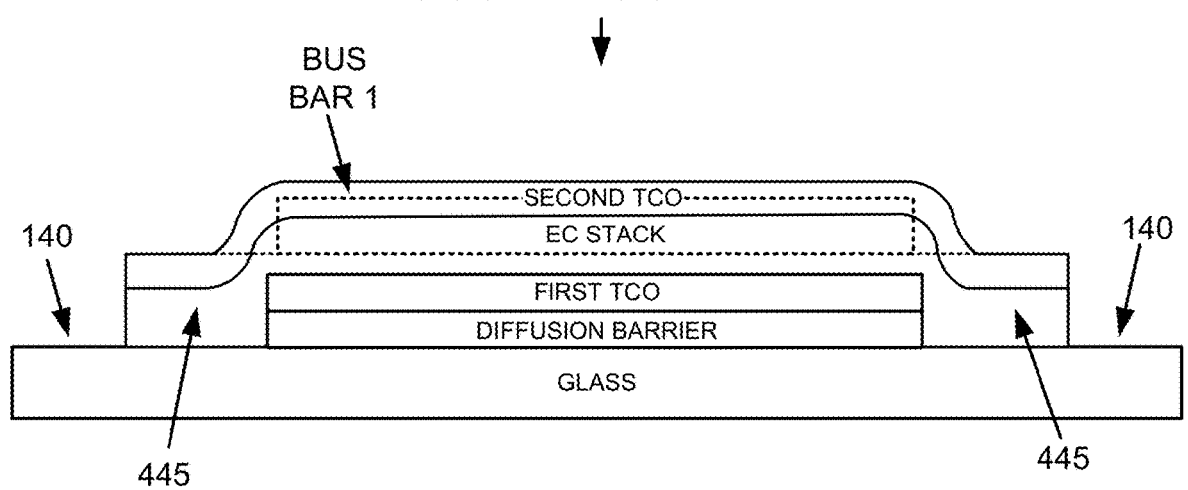

FIG. 4A is a process flow, 400, describing aspects of a method of fabricating an electrochromic device or other optical device having opposing bus bars, each applied to one of the conductor layers of the optical device. The dotted lines denote optional steps in the process flow. An exemplary device, 440, as described in relation to FIGS. 4B-C, is used to illustrate the process flow. FIG. 4B provides top views depicting the fabrication of device 440 including numerical indicators of process flow 400 as described in relation to FIG. 4A. FIG. 4C shows cross-sections of the lite including device 440 described in relation to FIG. 4B. Device 440 is a rectangular device, but process flow 400 applies to any shape of optical device having opposing bus bars, each on one of the conductor layers. This aspect is described in more detail below, e.g. in relation to FIG. 4D (which illustrates process flow 400 as it relates to fabrication of a round electrochromic device).

Referring to FIGS. 4A and 4B, after receiving a substrate with a first conductor layer thereon, process flow 400 begins with an optional polishing of the first conductor layer, see 401. In certain embodiments, polishing a lower transparent conductor layer has been found to enhance the optical properties of, and performance of, EC devices fabricated thereon. Polishing of transparent conducting layers prior to electrochromic device fabrication thereon is described in patent application, PCT/US12/57606, titled, "Optical Device Fabrication," filed on Sep. 27, 2012, which is hereby incorporated by reference in its entirety. Polishing, if performed, may be done prior to an edge deletion, see 405, or after an edge deletion in the process flow. In certain embodiments, the lower conductor layer may be polished both before and after edge deletion. Typically, the lower conductor layer is polished only once.

Referring again to FIG. 4A, if polishing 401 is not performed, process 400 begins with edge deleting a first width about a portion of the perimeter of the substrate, see 405. The edge deletion may remove only the first conductor layer or may also remove a diffusion barrier, if present. In one embodiment, the substrate is glass and includes a sodium diffusion barrier and a transparent conducting layer thereon, e.g. a tin-oxide based transparent metal oxide conducting layer. The substrate may be rectangular (e.g., the square substrate depicted in see FIG. 4B). The dotted area in FIG. 4B denotes the first conductor layer. Thus, after edge deletion according to process 405, a width A is removed from three sides of the perimeter of substrate 430. This width is typically, but not necessarily, a uniform width. A second width, B, is described below. Where width A and/or width B are not uniform, then their relative magnitudes with respect to each other are in terms of their average width.

As a result of the removal of the first width A at 405, there is a newly exposed edge of the lower conductor layer. In certain embodiments, at least a portion of this edge of the first conductive layer may be optionally tapered, see 407 and 409. The underlying diffusion barrier layer may also be tapered. The inventors have found that tapering the edge of one or more device layers, prior to fabricating subsequent layers thereon, has unexpected advantages in device structure and performance. The edge tapering process is described in more detail in relation to FIGS. 8A and 8B.

In certain embodiments, the lower conductor layer is optionally polished after edge tapering, see 408. It has been found, that with certain device materials, it may be advantageous to polish the lower conductor layer after the edge taper, as polishing can have unexpected beneficial effects on the edge taper as well as the bulk conductor surface which may improve device performance (as described above). In certain embodiments, the edge taper is performed after polish 408, see 409. Although edge tapering is shown at both 407 and 409 in FIG. 4A, if performed, edge tapering would typically be performed once (e.g., at 407 or 409).

After removal of the first width A, and optional polishing and/or optional edge tapering as described above, the EC device is deposited over the surface of substrate 430, see 410. This deposition includes one or more material layers of the optical device and the second conducting layer, e.g. a transparent conducting layer such as indium tin oxide (ITO). The depicted coverage is the entire substrate, but there could be some masking due to a carrier that must hold the glass in place. In one embodiment, the entire area of the remaining portion of the first conductor layer is covered including overlapping the first conductor about the first width A previously removed. This allows for overlapping regions in the final device architecture as explained in more detail below.

In particular embodiments, electromagnetic radiation is used to perform edge deletion and provide a peripheral region of the substrate, e.g. to remove transparent conductor layer or more layers (up to and including the top conductor layer and any vapor barrier applied thereto), depending upon the process step. In one embodiment, the edge deletion is performed at least to remove material including the transparent conductor layer on the substrate, and optionally also removing a diffusion barrier if present. In certain embodiments, edge deletion is used to remove a surface portion of the substrate, e.g. float glass, and may go to a depth not to exceed the thickness of the compression zone. Edge deletion is performed, e.g., to create a good surface for sealing by at least a portion of the primary seal and the secondary seal of the IGU. For example, a transparent conductor layer can sometimes lose adhesion when the conductor layer spans the entire area of the substrate and thus has an exposed edge, despite the presence of a secondary seal. Also, it is believed that when metal oxide and other functional layers have such exposed edges, they can serve as a pathway for moisture to enter the bulk device and thus compromise the primary and secondary seals.

Edge deletion is described herein as being performed on a substrate that is already cut to size. However, edge deletion can be done before a substrate is cut from a bulk glass sheet in other disclosed embodiments. For example, non-tempered float glass may be cut into individual lites after an EC device is patterned thereon. Methods described herein can be performed on a bulk sheet and then the sheet cut into individual EC lites. In certain embodiments, edge deletion may be carried out in some edge areas prior to cutting the EC lites, and again after they are cut from the bulk sheet. In certain embodiments, all edge deletion is performed prior to excising the lites from the bulk sheet. In embodiments employing "edge deletion" prior to cutting the panes, portions of the coating on the glass sheet can be removed in anticipation of where the cuts (and thus edges) of the newly formed EC lites will be. In other words, there is no actual substrate edge yet, only a defined area where a cut will be made to produce an edge. Thus "edge deletion" is meant to include removing one or more material layers in areas where a substrate edge is anticipated to exist. Methods of fabricating EC lites by cutting from a bulk sheet after fabrication of the EC device thereon are described in U.S. patent application Ser. No. 12/941,882 (now U.S. Pat. No. 8,164,818), filed Nov. 8, 2010, and U.S. patent application Ser. No. 13/456,056, filed Apr. 25, 2012, each titled "Electrochromic Window Fabrication Methods" each of which is hereby incorporated by reference in its entirety. One of ordinary skill in the art would appreciate that if one were to carry out methods described herein on a bulk glass sheet and then cut individual lites therefrom, in certain embodiments masks may have to be used, whereas when performed on a lite of desired end size, masks are optional.

Exemplary electromagnetic radiation includes UV, lasers, and the like. For example, material may be removed with directed and focused energy one of the wavelengths 248 nm, 355 nm (UV), 1030 nm (IR, e.g. disk laser), 1064 nm (e.g. Nd:YAG laser), and 532 nm (e.g. green laser). Laser irradiation is delivered to the substrate using, e.g. optical fiber or open beam path. The ablation can be performed from either the substrate side or the EC film side depending on the choice of the substrate handling equipment and configuration parameters. The energy density required to ablate the film thickness is achieved by passing the laser beam through an optical lens. The lens focuses the laser beam to the desired shape and size. In one embodiment, a "top hat" beam configuration is used, e.g., having a focus area of between about 0.005 $mm^2$ to about 2 $mm^2$. In one embodiment, the focusing level of the beam is used to achieve the required energy density to ablate the EC film stack. In one embodiment, the energy density used in the ablation is between about 2 $J/cm^2$ and about 6 $J/cm^2$.

During a laser edge delete process, a laser spot is scanned over the surface of the EC device, along the periphery. In one embodiment, the laser spot is scanned using a scanning F theta lens. Homogeneous removal of the EC film is achieved, e.g., by overlapping the spots' area during scanning. In one embodiment, the overlap is between about 5% and about 100%, in another embodiment between about 10% and about 90%, in yet another embodiment between about 10% and about 80%. Various scanning patterns may be used, e.g., scanning in straight lines, curved lines, and various patterns may be scanned, e.g., rectangular or other shaped sections are scanned which, collectively, create the peripheral edge deletion area. In one embodiment the scanning lines (or "pens," i.e. lines created by adjacent or overlapping laser spots, e.g. square, round, etc.) are overlapped at the levels described above for spot overlap. That is, the area of the ablated material defined by the path of the line previously scanned is overlapped with later scan lines so that there is overlap. That is, a pattern area ablated by overlapping or adjacent laser spots is overlapped with the area of a subsequent ablation pattern. For embodiments where overlapping is used, spots, lines or patterns, a higher frequency laser, e.g. in the range of between about 11 KHz and about 500 KHz, may be used. In order to minimize heat related damage to the EC device at the exposed edge (a heat affected zone or "HAZ"), shorter pulse duration lasers are used. In one example, the pulse duration is between about 100 fs (femtosecond) and about 100 ns (nanosecond), in another embodiment the pulse duration is between about 1 ps (picosecond) and about 50 ns, in yet another embodiment the pulse duration is between about 20 ps and about 30 ns. Pulse duration of other ranges can be used in other embodiments.

Referring again to FIGS. 4A and 4B, process flow 400 continues with removing a second width, B, narrower than the first width A, about substantially the entire perimeter of the substrate, see 415. This may include removing material down to the glass or to a diffusion barrier, if present. After process flow 400 is complete up to 415, e.g. on a rectangular substrate as depicted in FIG. 4B, there is a perimeter area, with width B, where there is none of the first transparent conductor, the one or more material layers of the device, or the second conducting layer—removing width B has exposed diffusion barrier or substrate. Within this perimeter area is the device stack, including the first transparent conductor surrounded on three sides by overlapping one or more material layers and the second conductor layer. On the remaining side (e.g., the bottom side in FIG. 4B) there is no overlapping portion of the one or more material layers and the second conductor layer. It is proximate this remaining side (e.g., bottom side in FIG. 4B) that the one or more material layers and the second conductor layer are removed in order to expose a portion (bus bar pad expose, or "BPE"), 435, of the first conductor layer, see 420. The BPE 435 need not run the entire length of that side, it need only be long enough to accommodate the bus bar and leave some space between the bus bar and the second conductor layer so as not to short on the second conductor layer. In one embodiment, the BPE 435 spans the length of the first conductor layer on that side.

As described above, in various embodiments, a BPE is where a portion of the material layers are removed down to the lower electrode or other conductive layer (e.g. a transparent conducting oxide layer), in order to create a surface for a bus bar to be applied and thus make electrical contact with the electrode. The bus bar applied can be a soldered bus bar, and ink bus bar and the like. A BPE typically has a rectangular area, but this is not necessary; the BPE may be any geometrical shape or an irregular shape. For example, depending upon the need, a BPE may be circular, triangular, oval, trapezoidal, and other polygonal shapes. The shape may be dependent on the configuration of the EC device, the substrate bearing the EC device (e.g. an irregular shaped window), or even, e.g., a more efficient (e.g. in material removal, time, etc.) laser ablation pattern used to create it. In one embodiment, the BPE spans at least about 50% of the length of one side of an EC device. In one embodiment, the BPE spans at least about 80% of the length of one side of an EC device. Typically, but not necessarily, the BPE is wide enough to accommodate the bus bar, but should allow for some space at least between the active EC device stack and the bus bar. In one embodiment, the BPE is substantially rectangular, the length approximating one side of the EC device and the width is between about 5 mm and about 15 mm, in another embodiment between about 5 mm and about 10 mm, and in yet another embodiment between about 7 mm and about 9 mm. As mentioned, a bus bar may be between about 1 mm and about 5 mm wide, typically about 3 mm wide.

As mentioned, the BPE is fabricated wide enough to accommodate the bus bar's width and also leave space between the bus bar and the EC device (as the bus bar is only supposed to touch the lower conductive layer). The bus bar width may exceed that of the BPE (and thus there is bus bar material touching both the lower conductor and glass (and/or diffusion barrier) on area 140), as long as there is space between the bus bar and the EC device (in embodiments where there is an L3 isolation scribe, the bus bar may contact the deactivated portion, e.g. see 145 in FIG. 1A). In embodiments where the bus bar width is fully accommodated by the BPE, that is, the bus bar is entirely atop the lower conductor, the outer edge, along the length, of the bus bar may be aligned with the outer edge of the BPE, or inset by about 1 mm to about 3 mm. Likewise, the space between the bus bar and the EC device is between about 1 mm and about 3 mm, in another embodiment between about 1 mm and 2 mm, and in another embodiment about 1.5 mm. Formation of BPEs is described in more detail below, with respect to an EC device having a lower electrode that is a TCO. This is for convenience only, the electrode could be any suitable electrode for an optical device, transparent or not.

To make a BPE, an area of the bottom TCO (e.g. first TCO) is cleared of deposited material so that a bus bar can be fabricated on the TCO. In one embodiment, this is achieved by laser processing which selectively removes the deposited film layers while leaving the bottom TCO exposed in a defined area at a defined location. In one embodiment, the absorption characteristics of the bottom electrode and the deposited layers are exploited in order to achieve selectivity during laser ablation, that is, so that the EC materials on the TCO are selectively removed while leaving the TCO material intact. In certain embodiments, an upper portion (depth) of the TCO layer is also removed in order to ensure good electrical contact of the bus bar, e.g., by removing any mixture of TCO and EC materials that might have occurred during deposition. In certain embodiments, when the BPE edges are laser machined so as to minimize damage at these edges, the need for an L3 isolation scribe line to limit leakage currents can be avoided—this eliminates a process step, while achieving the desired device performance results.

In certain embodiments, the electromagnetic radiation used to fabricate a BPE is the same as described above for performing edge deletion. The (laser) radiation is delivered to the substrate using either optical fiber or the open beam path. The ablation can be performed from either glass side or the film side depending on the choice of the electromagnetic radiation wavelength. The energy density required to ablate the film thickness is achieved by passing the laser beam through an optical lens. The lens focuses the laser beam to the desired shape and size, e.g. a "top hat" having the dimensions described above, in one embodiment, having an energy density of between about 0.5 J/cm$^2$ and about 4 J/cm$^2$. In one embodiment, laser scan overlapping for BPE is done as described above for laser edge deletion. In certain embodiments, variable depth ablation is used for BPE fabrication. This is described in more detail below.

In certain embodiments, e.g. due to the selective nature of the absorption in an EC film, the laser processing at the focal plane results in some amount (between about 10 nm and about 100 nm) of residue, e.g. tungsten oxide, remaining on the exposed area of the lower conductor. Since many EC materials are not as conductive as the underlying conductor layer, the bus bar fabricated on this residue does not make full contact with the underlying conductor, resulting in voltage drop across the bus bar to lower conductor interface. The voltage drop impacts coloration of the device as well as impacts the adhesion of the bus bar to the lower conductor. One way to overcome this problem is to increase the amount of energy used for film removal, however, this approach results in forming a trench at the spot overlap, unacceptably depleting the lower conductor. To overcome this problem the laser ablation above the focal plane is performed, i.e. the laser beam is defocused. In one embodiment, the defocusing profile of the laser beam is a modified top hat, or "quasi top hat." By using a defocused laser profile, the fluence delivered to the surface can be increased without damaging the underlying TCO at spot overlap region. This method minimizes the amount of residue left in on the exposed lower conductor layer and thus allows for better contact of the bus bar to the lower conductor layer.

Referring again to FIGS. 4A and 4B, after forming the BPE, bus bars are applied to the device, one on exposed area 435 of the first conductor layer (e.g., first TCO) and one on the opposite side of the device, on the second conductor layer (e.g., second TCO), on a portion of the second conductor layer that is not above the first conductor layer, see 425. This placement of the bus bar 1 on the second conductor layer avoids coloration under the bus bar (analogous to bus bar 1 in FIGS. 2A or 3) and the other associated issues with having a functional device under this bus bar. In this example, there are no laser isolation scribes necessary in fabrication of the device—this is a radical departure from conventional fabrication methods, where one or more isolation scribes leave non-functional device portions remaining in the final construct.

FIG. 4B indicates cross-section cuts Z-Z' and W-W' of device 440. The cross-sectional views of device 440 at Z-Z' and W-W' are shown in FIG. 4C. The depicted layers and dimensions are not to scale, but are meant to represent functionally the configuration. In this example, the diffusion barrier was removed when width A and width B were fabricated. Specifically, perimeter area 140 is free of first conductor layer and diffusion barrier; although in one embodiment the diffusion barrier is left intact to the edge of the substrate about the perimeter on one or more sides. In another embodiment, the diffusion barrier is co-extensive with the one or more material layers and the second conductor layer (thus width A is fabricated at a depth to the diffusion barrier, and width B is fabricated to a depth sufficient to remove the diffusion barrier). In this example, there is an overlapping portion, 445, of the one or more material layers about three sides of the functional device. On one of these overlapping portions, on the second TCO, bus bar 1 is fabricated. In one embodiment, a vapor barrier layer is fabricated co-extensive with the second conductor layer. A vapor barrier is typically highly transparent, e.g. aluminum zinc oxide, a tin oxide, silicon dioxide and mixtures thereof, amorphous, crystalline or mixed amorphous-crystalline. In this embodiment, a portion of the vapor barrier is removed in order to expose the second conductor layer for bus bar 1. This exposed portion is analogous to area 435, the BPE for bus bar 2. In certain embodiments, the vapor barrier layer is also electrically conductive, and exposure of the second conductor layer need not be performed, i.e. the bus bar may be fabricated on the vapor barrier layer. For example, the vapor barrier layer may be ITO, e.g. amorphous ITO, and thus be sufficiently electrically conductive for this purpose. The amorphous morphology of the vapor barrier may provide greater hermeticity than a crystalline morphology.

Figure 7:
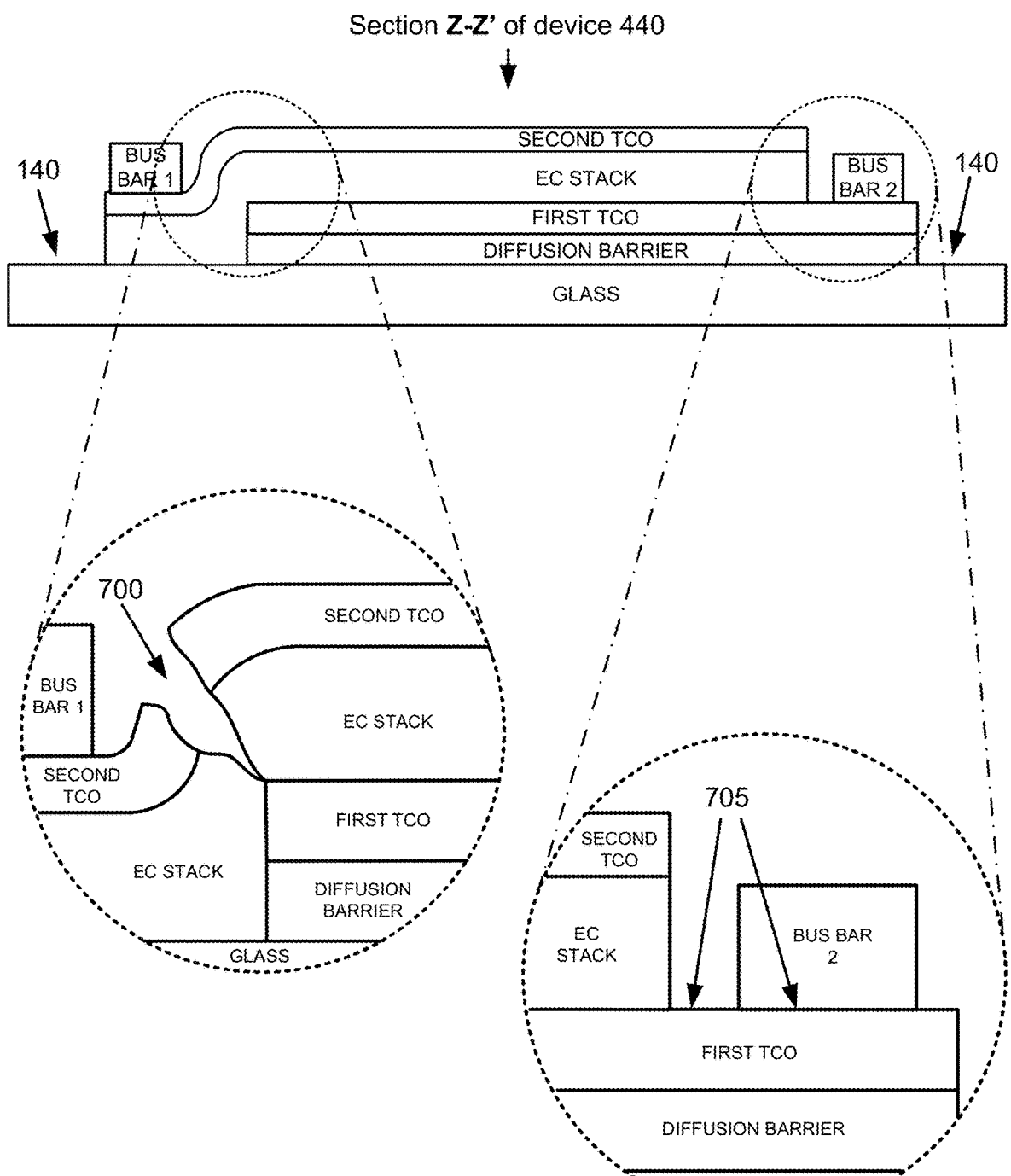
FIG. 7 includes cross-sectional views of an electrochromic device similar to the device described in relation to FIG. 4C, detailing problematic issues overcome by certain embodiments described herein.

FIG. 4C depicts the device layers overlying the first TCO, particularly the overlapping portion, 445. Although not to scale, cross section Z-Z' for example, depicts the conformal nature of the layers of the EC stack and the second TCO following the shape and contour of the first TCO including the overlapping portion 445. Cross section Z-Z' is reproduced in FIG. 7 and modified for illustrative purposes to show detail of a problem sometimes encountered with such overlapping configurations. Referring to FIG. 7, the transition to overlap 445, where the upper device layers overlay the edge of the first TCO, e.g. depending upon the device materials and thickness of the layers, may form fissures, 700, as depicted in the expanded portion (left). It is believed that these fissures are due to the stress related to the upper device layers having to follow an abrupt transition over the edge of the first TCO (in this example). Fissures 700 may form along the edges of the device where the overlying layers cover such abrupt edges. These fissures may cause electrical shorting, as there is an exposed path between the first and second TCO's, and ions may short the device as the ion conducting layer (or functional equivalent) is breached at the fissure. These shorts cause coloration aberrations and poor performance of the electrochromic device. Embodiments herein overcome this problem by tapering (sloping or otherwise modifying) the lower device layers about at least a portion of their edge, particularly the lower transparent conducting layer, so that the overlying layers will not encounter such stresses. This is referred to herein as "edge tapering." Although edge tapering is described in certain embodiments, other stress mitigation topology may be used such as edge rounding, stepping, and beveling. Also, combinations of stress mitigation topology may be used.

Figure 8A:
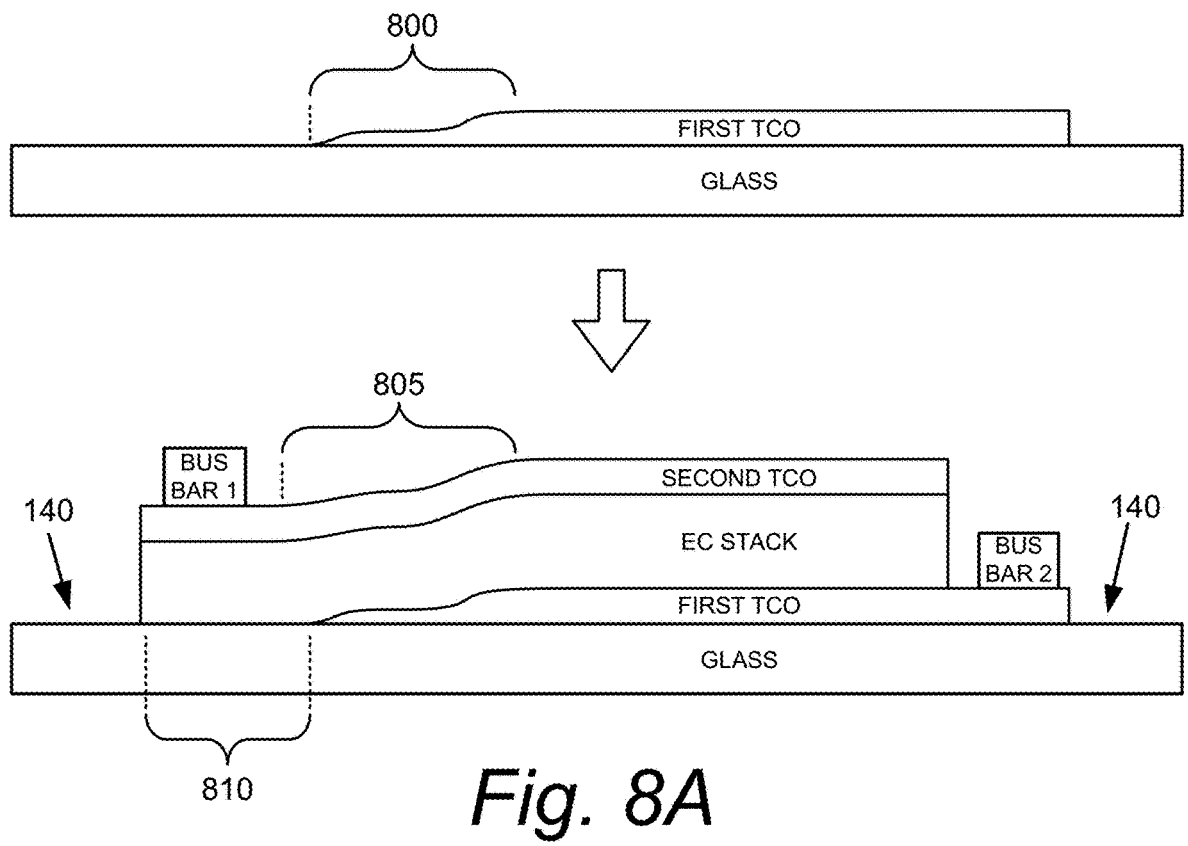
FIGS. 8A and 8B is a cross-sectional and top view respectively of an electrochromic device describing tapering the edge(s) of the lower conductor layer in order to avoid stress in subsequently deposited overlying layers.

Referring to FIG. 8A, the edge portion, 800, of the first TCO (diffusion barrier not depicted) is tapered, for example, by laser ablation. Thus 800 is an example of an edge taper. The tapered topography in this example is formed by a defocused laser (supra) so that smooth contours are formed rather than abrupt edges. In this example, the taper is a stepped contour, but this is not necessary. In a typical, but non-limiting example, a first TCO might be between about 0.25 µm and about 1 µm thick. The edge portion 800 having the tapered profile may be between about 0.25 µm and about 1000 µm wide, in another embodiment between about 0.5 µm and about 100 µm wide, in another embodiment between about 1 µm and about 10 µm wide. As described in relation to FIGS. 4A and 4B, the edge taper may be formed in the lower conductor layer before or after polishing of the lower conductor.

Figure 8B:
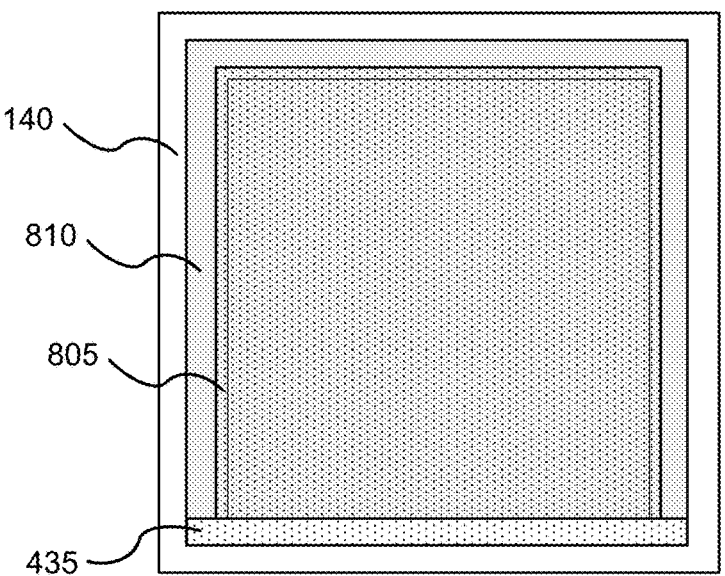

Referring again to FIG. 8A and also FIG. 8B, after device fabrication (as indicated by the downward pointing arrow) a resulting electrochromic device as described above has overlapping portions of the one or more material layers and the top conductor layer around three sides. The portion, 805, of the upper layers overlaps edge portion 800. Because of the sloped nature of edge portion 800, it is believed the overlying device layers in portion 805 no longer experience the stress levels otherwise encountered when an abrupt edge portion is below them. Portion 805 gradually transitions to portion 810 which lies on the glass substrate (or the diffusion barrier, not shown, portion 810 is analogous to portion 445 in FIG. 4C). In this example, the edge taper 800 is fabricated on three sides of the first TCO in accord with fabrication methods described herein, though, it can be done along any fraction of the perimeter of the TCO remaining after edge deletion (including the edge portion of the TCO along the substrate edge, i.e. that not removed by edge deletion). In one embodiment, edge taper is performed only about the perimeter edge of the TCO formed by edge deletion. In one embodiment, edge taper is performed only along that portion of the perimeter edge of the TCO formed by edge deletion and opposite side of the device as the BPE.

Although FIG. 8A depicts the lower conductor layer as tapered, this need not be the case. Edge tapering can be done, e.g., after one or more other layers have been deposited on the lower conductor layer so long as the overall result is lowering of stress of subsequently deposited layers. One embodiment is an electrochromic device with one or more layers below the uppermost layer having an edge taper on at least some portion of their perimeter edge. One embodiment is an electrochromic device with one or more layers below the uppermost layer having a stress mitigation topology on at least some portion of their perimeter edge. The stress mitigation topology may include edge taper, edge rounding, stepping and/or beveling.

One embodiment is a method of fabricating an optical device, the method including tapering one or more edges of an underlying material layer prior to fabrication of overlapping layers thereon. In one embodiment, the underlying material layer is the lower conductor layer. In one embodiment, tapering one or more edges of the lower conductor layer includes laser ablation. In one embodiment the laser is defocused so as to create smooth contours in the tapered edge portion. In one embodiment, the lower conductor layer is polished before the edge taper. In one embodiment, the lower conductor layer is polished after the edge taper.

As described, one or more laser isolation scribes may be needed, depending upon design tolerances, material choice and the like. FIG. 4G depicts top-views of three devices, 440a, 440b and 440c, each of which are variations on device 440 as depicted in FIGS. 4B and 4C. Device 440a is similar to device 440, but includes L2 scribes (see above) that isolate first portions of the EC device along the sides orthogonal to the sides with the bus bars. Device 440b is similar to device 440, but includes an L3 scribe isolating and deactivating a second portion of the device between the bus bar on the first (lower) conductor layer and the active region of the device. Device 440c is similar to device 440, but includes both the L2 scribes and the L3 scribe. Although the scribe line variations in FIG. 4G are described in reference to devices 440a, 440b and 440c, these variations can be used for any of the optical devices and lites of embodiments described herein. For example, one embodiment is a device analogous to device 440c, but where the edge deletion does not span three sides, but rather only the side bearing the bus bar on the top TCO (or a portion long enough to accommodate the bus bar). In this embodiment, since there are no edge delete portions on the two sides orthogonal to the bus bars (the right and left side of 440c as depicted), the L2 scribes may be closer to these edges in order to maximize viewable area. Depending upon device materials, process conditions, aberrant defects found after fabrication, etc., one or more of these scribes may be added to ensure proper electrical isolation of the electrodes and therefore device function. Any of these devices may have a vapor barrier applied prior to, or after, one or all of these scribes. If applied after, the vapor barrier is not substantially electrically conductive; otherwise it would short out the device's electrodes when filling the laser scribe trenches. The above-described edge tapering may obviate the need for such scribes.

Referring again back to FIG. 7, the right side of FIG. 7 includes a detailed portion of the cross section Z-Z' illustrating a problem sometimes encountered with BPE formation. Specifically, during laser ablation of the bus bar pad expose area, upon which bus bar 2 resides in this figure, the laser may not ablate away the top layers or ablate the lower conductor layer (first TCO in this instance) uniformly. Thus, there may be problematic issues with proper electrical connectivity between the bus bar and the lower conductor layer in areas 705. These issues are described in more detail with reference to FIGS. 9A and 9B.

Figure 9A:
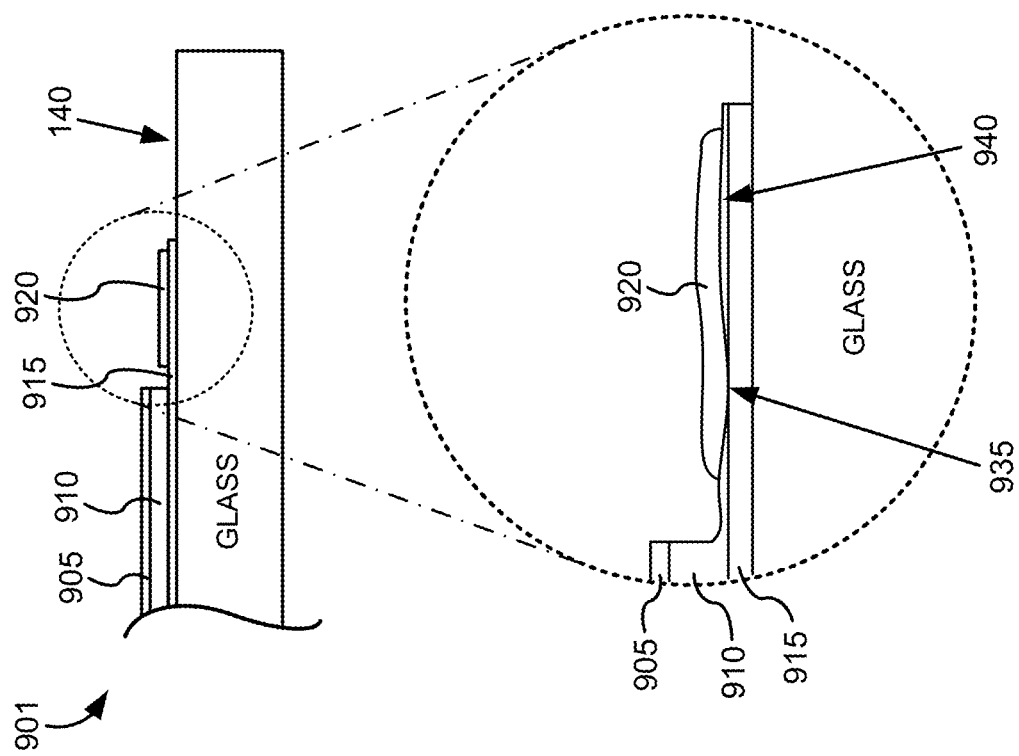
FIGS. 9A and 9B are drawings depicting problematic issues related to exposure of a lower conductor for bus bar application.
Figure 9B:
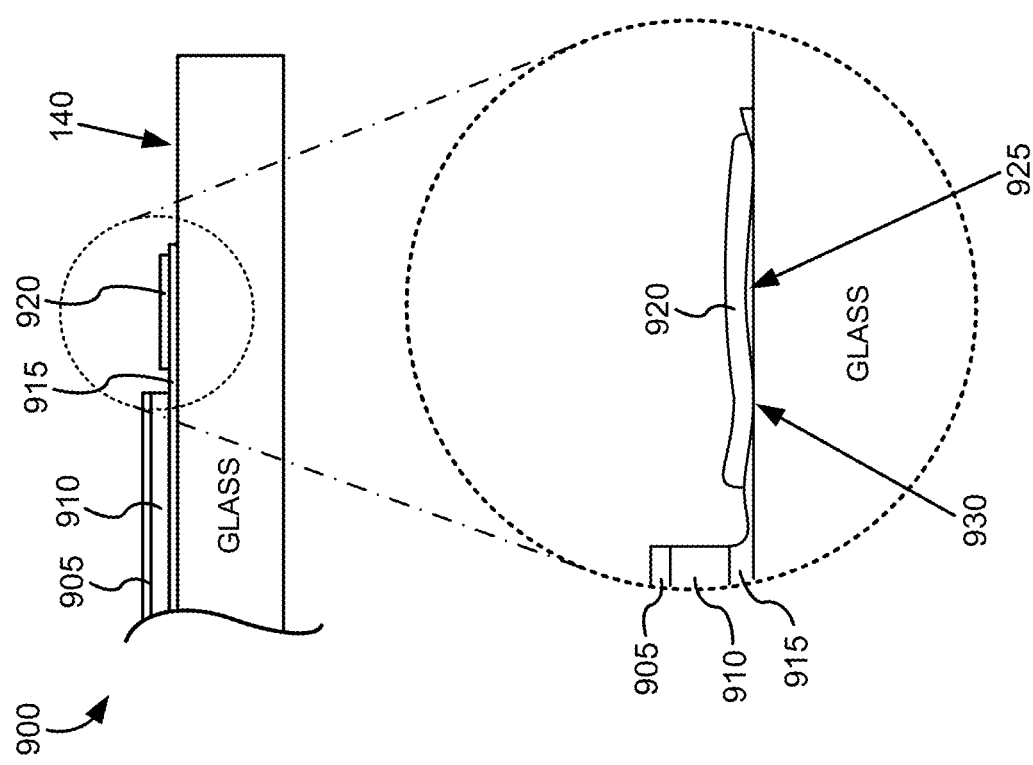

Referring to FIG. 9A, a cross section of an electrochromic device, 900, having a top transparent conductor layer 905, a device stack, 910, and a lower transparent conductor layer, 915. On a BPE of lower conductor layer 915, is a bus bar, 920, e.g., a silver ink bus bar. In the lower portion of FIG. 9A, in detail, is shown a problem with the BPE portion of layer 915. Depending upon the device materials, laser settings, device state, etc., the BPE may not be of uniform thickness. In this example, the laser ablation was uneven, leaving areas, 930, where conductor layer 915 was completely removed, and areas, 925, where layer 915 remains. Areas 930 prevent electrical conduction to the device stack due to cutting off electrical connectivity in the lower TCO. Areas 930 typically span some portion of the BPE, if not all, and thus can be a problem. FIG. 9B shows another problem that may occur. If the laser does not ablate deeply enough, in this example through the device stack, then there may be poor electrical connectivity between lower conductor 915 and bus bar 920. In this example, there is electrical connectivity between bus bar 920 and conductor layer 915 in area 935, where the device stack was penetrated by the laser during BPE, but a large area portion of the device stack remains between bus bar 920 and conductor layer 915 at area 940. So, as illustrated in FIG. 9A, the laser may ablate too deeply, and as illustrated in FIG. 9B, the laser may not ablate sufficiently over the entire area of the BPE. This can happen, e.g., due to film absorption drift during laser ablation, both intra-device and inter-device. Methods described herein overcome these issues by applying varying laser ablation levels, e.g., along individual scribe lines during BPE fabrication. This is described in more detail in relation to FIGS. 10A-F.

Figure 10A:
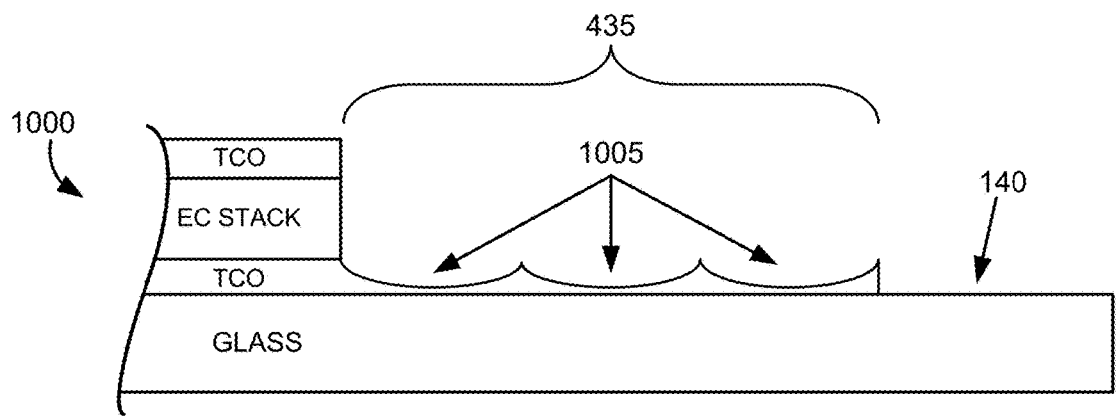
FIGS. 10A through 10F are drawings depicting embodiments for improved bus bar pad exposure.

FIG. 10A depicts a cross sectional portion of an electrochromic device, 1000. The lower TCO is ablated in areas 1005 along one side to form a BPE, 435. In this example, each of three areas 1005 is ablated with a defocused laser such that the cross section is concave has depicted. In this example, each of the scribe lines is made at the same laser fluence level. Also, no overlap of the laser ablations was used, so that there are raised regions (in this case ridges) of the TCO material remaining between adjacent ablation lines. This is one example of using laser ablation of an overlying material down to an underlying conductor layer using varying laser ablation levels along a plurality of individual scribes. There are essentially three "knobs" for achieving variable ablation depth: pulse duration, fluence level and overlap of laser spot and/or pattern (line, shape formed by positioning of individual spots). In certain embodiments 100% overlap is used, e.g., multiple shots on a single spot location or multiple lines across the same area. Embodiments herein for achieving varying ablation depth use any one of these or any combination thereof.

One embodiment is a method of fabricating a BPE, the method comprising laser ablation of overlying material down to an underlying TCO layer using varying laser ablation levels along a plurality of individual scribe lines during fabrication of the BPE. In one embodiment, each of the individual scribe lines, of the plurality of scribe lines, is scribed using a quasi top hat at the same fluence level. Other patterns, besides lines, may be used so long as there is varying ablation depth. For example, a laser spot may be applied in a checkerboard pattern, with or without overlap of adjacent spots, where individual spots apply different pulse times to achieve varying ablation depth. In certain embodiments, at least two individual scribe lines, of the plurality of scribe lines, are scribed using a different fluence level for each line. Such embodiments are described in more detail below.

Figure 10B:
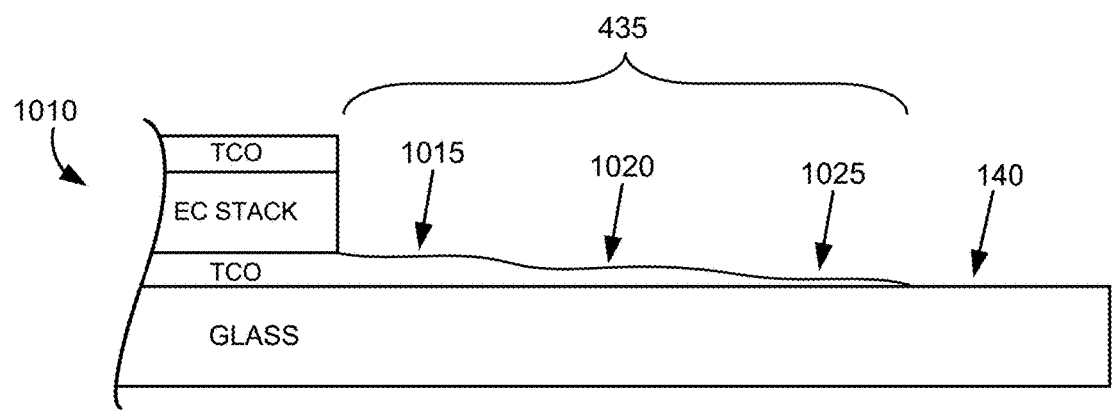
Figure 10C:
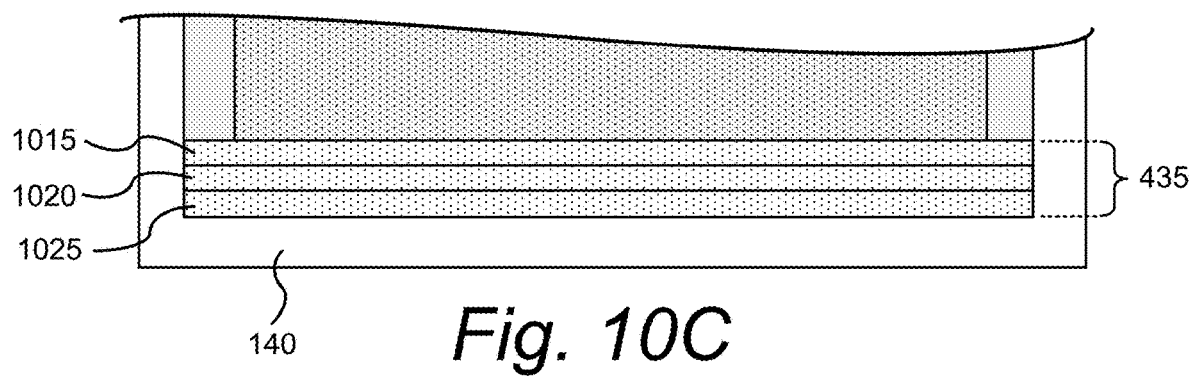

FIG. 10B depicts a cross sectional portion of an electrochromic device, 1010, of an embodiment. The electrochromic device, 1010, has a BPE 435 formed via laser ablation of the lower TCO using varying ablation depth along a plurality of laser ablation lines 1015, 1020 and 1025, along one edge of the device. In this example, the lines are formed by overlapping laser spots along each line, but where each line uses a different overlap percentage of the individual spots. In this example, there is also overlap of the lines; however in some embodiments there is no overlap between one or more lines. FIG. 10C shows a top view of BPE 435 (any device described herein may have a BPE as described in relation to FIGS. 10A-F) that is made from three lines 1015, 1020 and 1025. These lines each are of varying depth of ablation into the TCO relative to the other lines, but have substantially the same depth of ablation within any given line. By using varying ablation depth, e.g. using different fluence level of the laser spot, overlap in the spots or lines, pulse duration, and combinations thereof, the BPE has multiple depth profiles and accounts for problems associated with variation in film absorption during laser ablation. That is, if the laser doesn't ablate deeply enough, or ablates too deeply, there is still a sufficient amount of exposed TCO in order to make good electrical contact with the bus bar along the device edge and thus good performance and coloration front during operation of the device. In this example, the TCO is ablated progressively more deeply as the laser is moved from each line to the next, so that the BPE is progressively thinner at the outer edge and thicker at the innermost surface near the device stack. The BPE depicted in FIG. 10B shows gently sloped transitions between lines indicating that laser ablation paths were overlapping partially. The final BPE is a three-stepped construct as depicted. By using varying ablation depth, good electrical contact between the bus bar and the BPE is ensured because even if there is absorption variation, there will be complete penetration to the lower TCO by at least one of the ablation lines.

In one embodiment, laser ablation is used to remove material from at least two lines along the edge of the EC device, along each line at a different ablation depth. In one embodiment, the ablation depth is selected from at least the upper 10% of the lower TCO, at least the upper 25% of the lower TCO, at least the upper 50% of the lower TCO, and at least the upper 75% of the lower TCO.

Figure 10D:
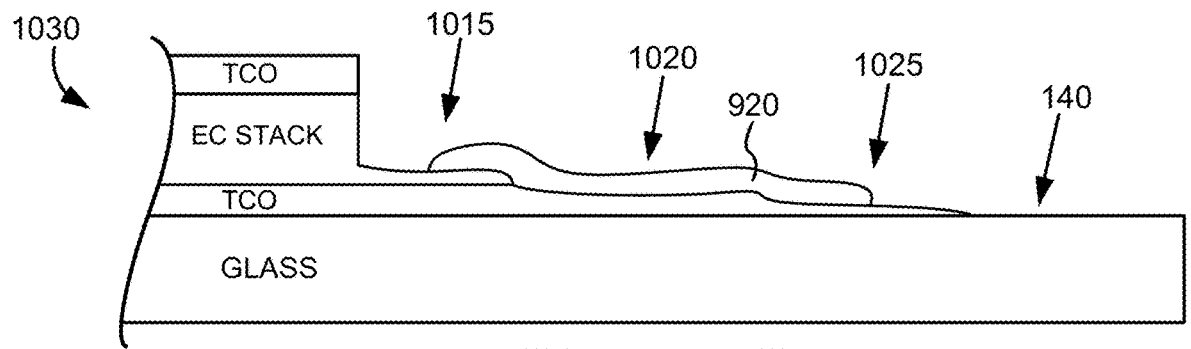
Figure 10E:
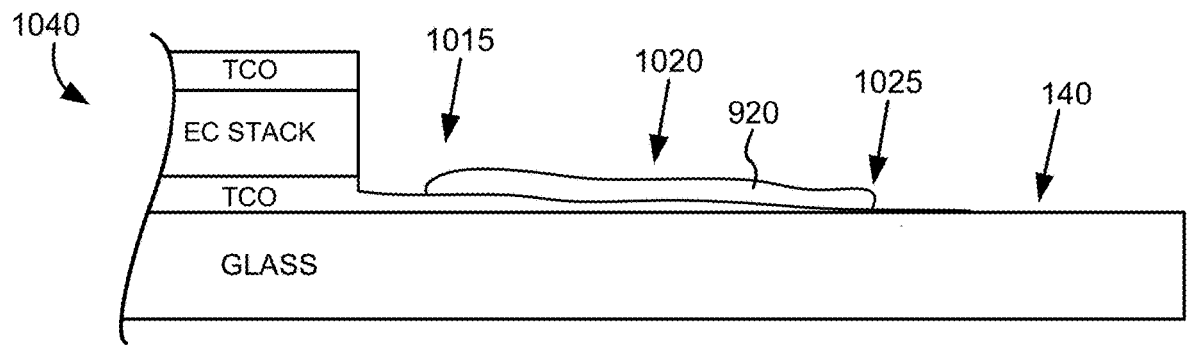

FIG. 10D depicts a cross sectional portion of an electrochromic device, 1030, of an embodiment. Referring to FIG. 10D, even if the materials above the bottom TCO vary in absorption from the calculated value, e.g. the laser ablation does not dig as deeply into the stack as calculated due to loss of absorption for some reason, since there are multiple lines at different depths, the BPE process is successful, i.e. good electrical connectivity with bus bar 920 is achieved. In the example depicted in FIG. 10D, the laser didn't ablate as deeply as calculated, e.g. line 1015 has some EC stack material remaining which would interfere with electrical contact between the BPE and a bus bar. But, lines 1020 and 1025 did penetrate down to the TCO and thus bus bar 920 makes good electrical contact with the lower TCO. FIG. 10E depicts a cross sectional portion of an electrochromic device, 1040, of an embodiment. FIG. 10E depicts the scenario where the laser penetrates more deeply than calculated, e.g. when the absorption of the material layers drifts to a more increased state than expected. In this example, line 1025 has insufficient TCO thickness to conduct electricity properly, but the remaining lines, 1015 and 1020, allow for good electrical connection with bus bar 920.

Figure 10F:
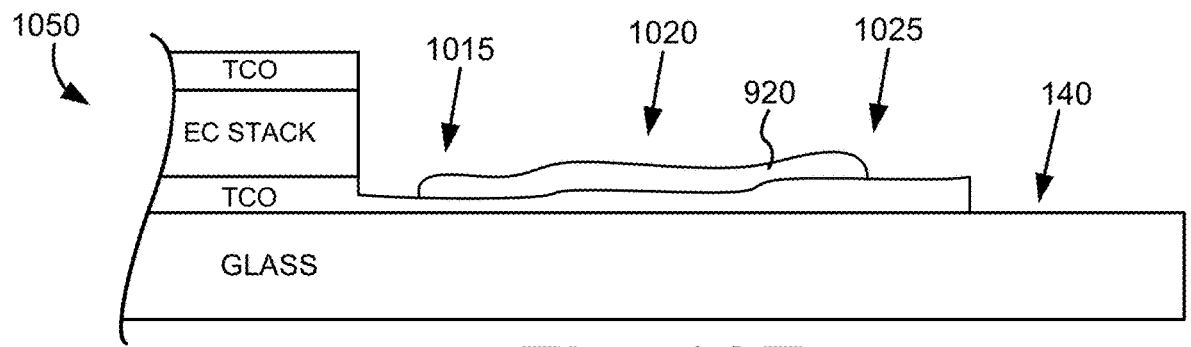

FIG. 10F depicts a cross sectional portion of an electrochromic device, 1050, of an embodiment. FIG. 10F illustrates that the varying depth of the laser lines need not be from less depth to more depth as one moves from inner portion of BPE to outer portion of BPE. In this example, the laser ablation depth is configured such that the BPE is thicker furthest from the EC device and thinnest closest to the device edge. This pattern may have advantage when, e.g., it is desirable to make absolutely sure there is no stack material between where the bus bar is fabricated on the BPE and the device stack. By penetrating more deeply into the TCO on the line (1015) proximate the EC device, this is achieved. In one embodiment, the laser is configured to progressively remove more of the underlying conductor layer in each of the plurality of scribe lines, the ablation area of each scribe line is overlapped at least partially with the ablation area of the previous scribe line, and plurality of scribe lines are fabricated with most removal of underlying conductor layer nearest to the device stack and least removal of underlying conductive layer furthest from the device stack. In one embodiment, the laser is configured to progressively remove more of the underlying conductor layer in each of the plurality of scribe lines, the ablation area of said at least two scribe lines is overlapped at least partially with the ablation area, and plurality of scribe lines are fabricated with least removal of underlying conductor layer nearest to the device stack and most removal of underlying conductive layer furthest from the device stack.

Although the varying fluence and/or overlap and/or pulse duration of laser ablation spots, lines or patterns in order to vary the ablation depth is described in reference to BPE fabrication, it can also be used to create the edge taper as described herein. Nor are these methods limited to those embodiments, e.g., they can also be used to create isolation trenches, e.g., where two or more lines are ablated at different depths to ensure proper electrical (and optionally ionic) isolation of one section of an EC device from another. In one embodiment, an L3 scribe is fabricated where two or more scribe lines are used to fabricate the L3 scribe and at least two scribe lines each have a different ablation depth, with or without overlap of the lines.

The above described fabrication methods are described in terms of rectangular optical devices, e.g. rectangular EC devices. This is not necessary, as they also apply to other shapes, regular or irregular. Also, the arrangement of overlapping device layers as well as BPE and other features may be along one or more sides of the device, depending upon the need. In order to more fully describe the scope of the embodiments, these features are described in more detail below with respect to other shapes and configurations. As described in relation to FIGS. 4A and 4B, the fabrications described below may also include other features such as polish of the lower transparent conductor layer, edge taper, multi-depth ablated BPE, etc. Description of these features was not given so as to avoid repetition, but one embodiment is any of the device configurations described below with one or more of the features described in relation to FIGS. 4A and 4B.

Figure 4D:
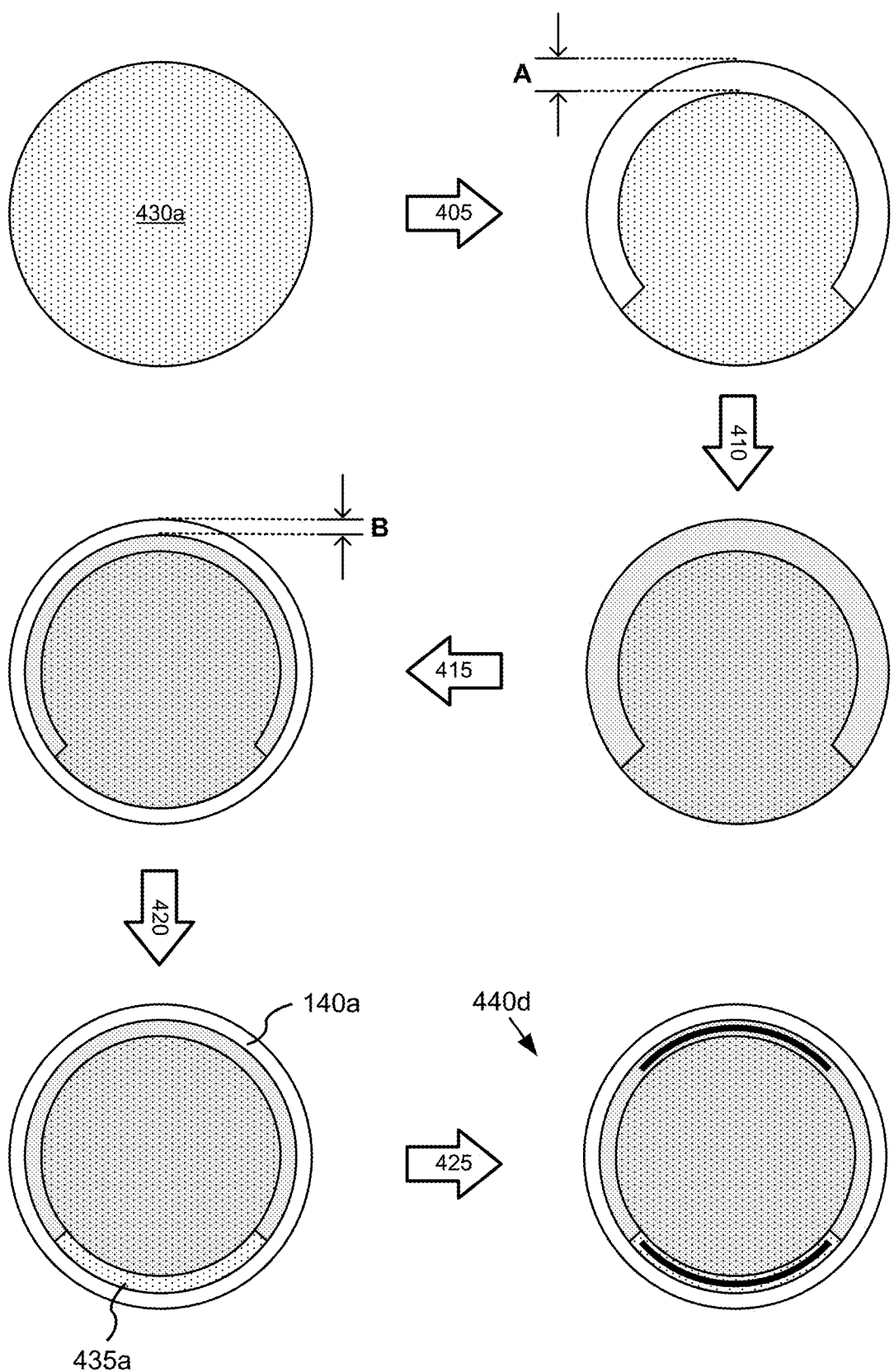
FIG. 4D is a top view schematic depicting steps during fabrication on a round substrate.

FIG. 4D is a top view schematic drawing depicting fabrication steps analogous to that described in relation to the rectangular substrate in FIG. 4B, but on a round substrate, according to an embodiment. The substrate could also be oval. Thus as described previously, a first width A is removed, see 405. The one or more material layers and second conductor layer (and optionally a vapor barrier) are applied over the substrate, see 410. A second width B is removed from the entire perimeter of the substrate, see 415 (140*a* is analogous to 140). A BPE, 435*a*, is fabricated as described herein, see 420. Bus bars are applied, see 425, to make device 440*d* (thus, for example, in accord with methods described above, the at least one second bus bar is applied to the second conducting layer proximate the side of the optical device opposite the at least one exposed portion of the first conducting layer).

Figure 4E:
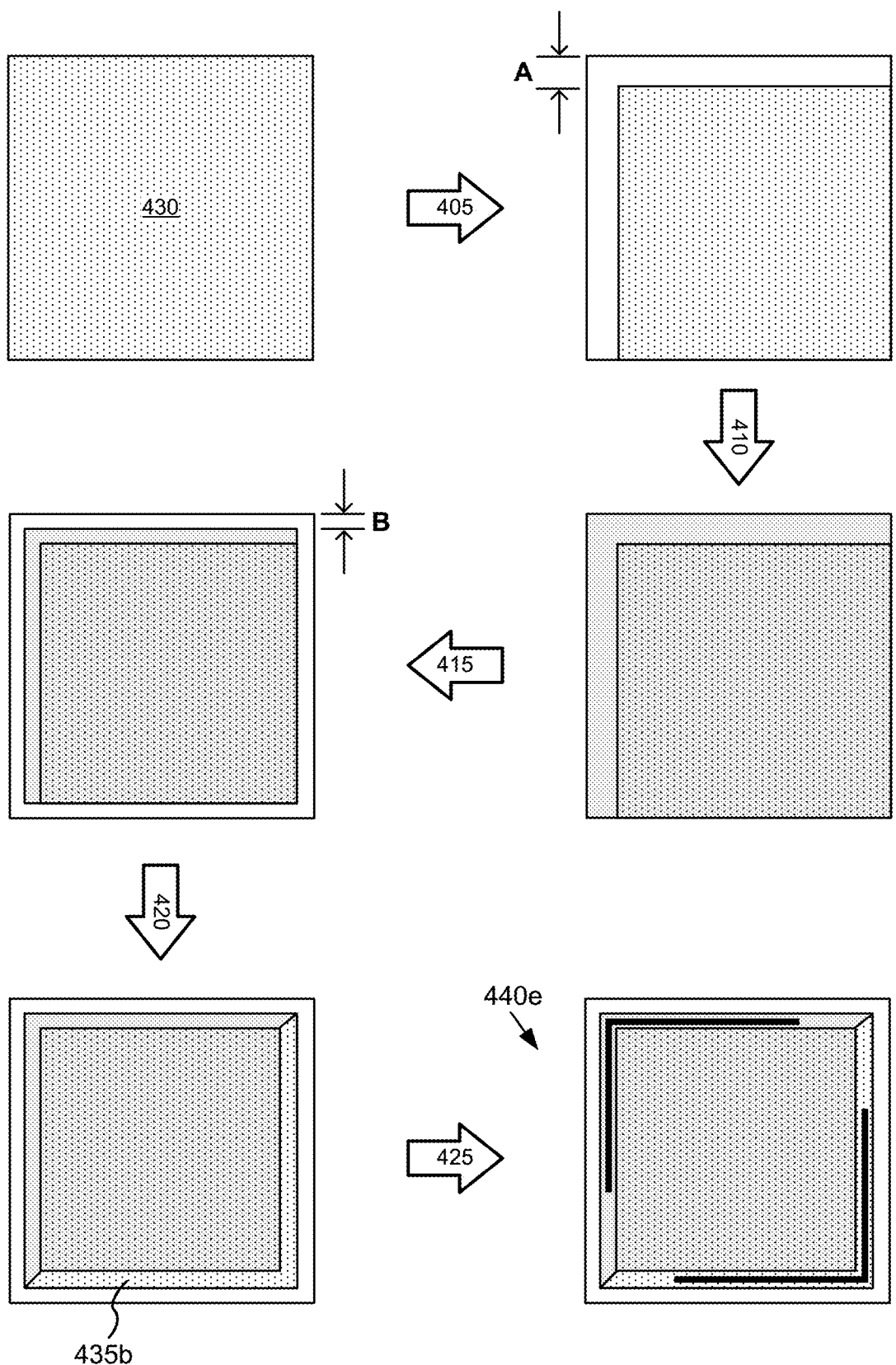
FIG. 4E is a top view schematic depicting steps during fabrication of an electrochromic device.
Figure 4G:
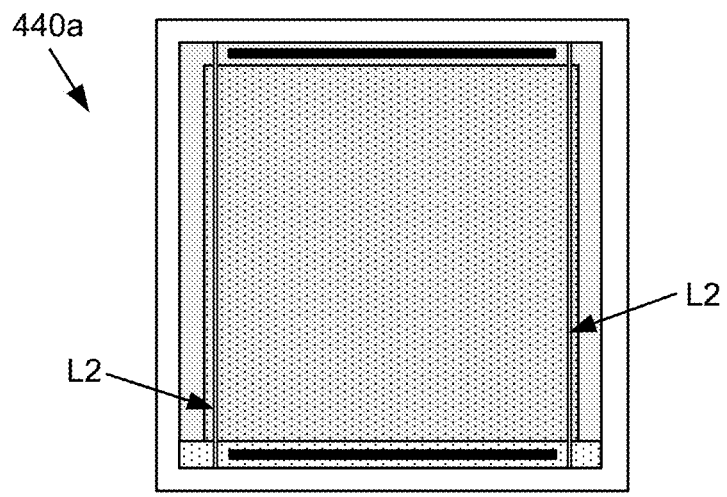
FIG. 4G is a schematic drawing of top views of devices similar to that described in relation to FIG. 4B.
Figure 4G:
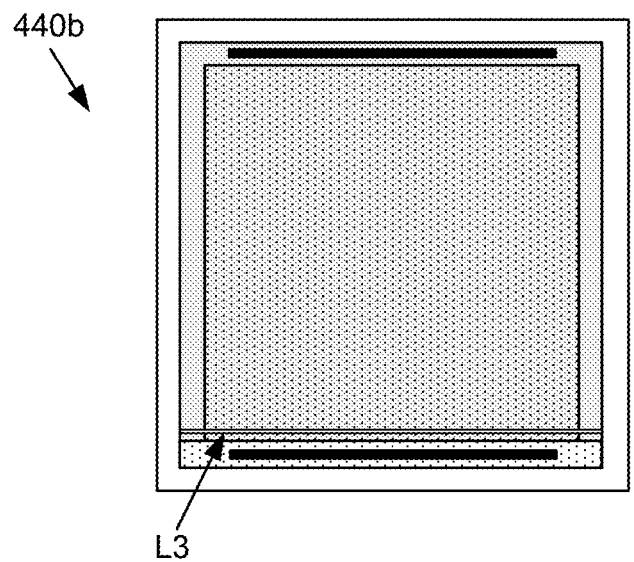
Figure 4G:
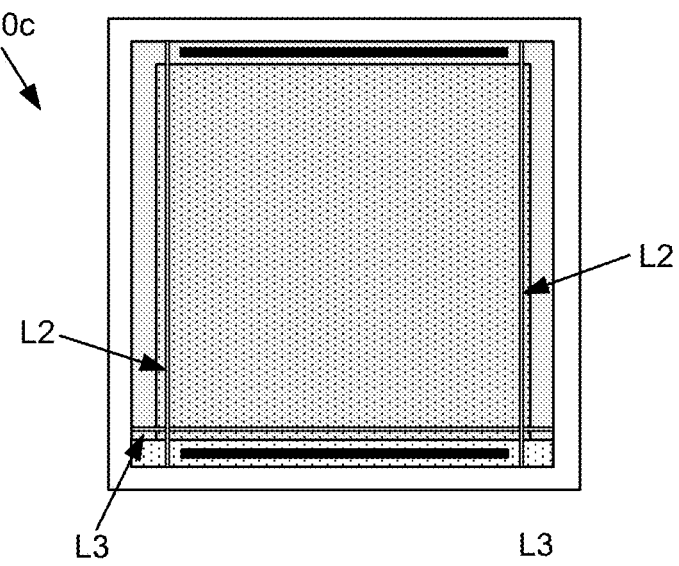

FIG. 4E is a top view schematic depicting fabrication analogous to that described in relation to the rectangular substrate in FIG. 4B, but for angled bus bar application of an embodiment. Thus as described previously, a first width A is removed, see 405, in this example from two orthogonal sides (one or both of the resulting edges of the lower TCO may have edge taper). The one or more material layers and second conductor layer (and optionally a vapor barrier) are applied over the substrate, see 410. A second width B is removed from the entire perimeter of the substrate, see 415. A BPE, 435*b*, is fabricated as described herein; see 420, in this example along orthogonal sides opposite those from which width A was removed. Bus bars are applied, see 425, to make device 440*e* (thus, for example, in accord with methods described above, the at least one second bus bar is applied to the second conducting layer proximate the side of the optical device opposite the at least one exposed portion of the first conducting layer). Angled bus bars are described in U.S. patent application Ser. No. 13/452,032, filed Apr. 20, 2012, and titled "Angled Bus Bar," which is hereby incorporated by reference in its entirety. Angled bus bars have the advantages of decreasing switching speed and localized current "hot spots" in the device as well as more uniform transitions.

Whatever the shape of the device, it can be incorporated into an insulated glass unit. Preferably, the device is configured inside the IGU so as to protect it from moisture and the ambient. FIG. 4F depicts IGU fabrication where the optical device, e.g. an electrochromic device is sealed within the IGU. IGU, 460, including a first substantially transparent substrate, 445, a spacer, 450, and a second substantially transparent substrate, 455. Substrate 445 has an electrochromic device fabricated thereon (bus bars are shown as dark vertical lines on substrate 445). When the three components are combined, where spacer 450 is sandwiched in between and registered with substrates 445 and 455, IGU 460 is formed. The IGU has an associated interior space defined by the faces of the substrates in contact with adhesive sealant between the substrates and the interior surfaces of the spacer, in order to hermetically seal the interior region and thus protect the interior from moisture and the ambient. This is commonly referred to as the primary seal of an IGU. A secondary seal includes an adhesive sealant applied around the spacer and between the panes of glass (the spacer has smaller length and width than the substrates so as to leave some space between the glass substrates from the outer edge to the spacer; this space is filled with sealant to form the secondary seal). In certain embodiments, any exposed areas of the first conducting layer are configured to be within the primary seal of the IGU. In one embodiment, any bus bars are also configured to be within the primary seal of the IGU. In one embodiment, the area of the second conductor layer that is not over the first conductor layer is also configured to be within the primary seal of the IGU. Conventional electrochromic IGU's configure the bus bars either outside the spacer (in the secondary seal) or inside the spacer (in the interior volume of the IGU) in the viewable area of the IGU (sometimes one in the secondary seal, the other in the viewable area). Conventional electrochromic IGU's also configure the EC device edges either running to the substrate edge or inside the spacer (within the interior volume of the IGU). The inventors have found it advantageous to configure the bus bars, laser scribes, and the like to be under the spacer, so as to keep them from the viewable area and, e.g., to free up the secondary seal so that electrical components therein do not interfere with the aforementioned features. Such IGU configurations are described in U.S. patent application Ser. No. 13/456,056, titled "Electrochromic Window Fabrication Methods," filed Apr. 25, 2012, which is hereby incorporated by reference in its entirety. Controllers that fit into the secondary seal are described in U.S. Pat. No. 8,213,074, titled "Onboard Controllers for Multistate Windows," filed Mar. 16, 2011, which is hereby incorporated by reference in its entirety. Methods described herein include sealing any exposed areas of the first conductor layer, edges of the device or overlapping regions of the one or more material layers, and the second conductor layer in the primary seal of the IGU. With or without a vapor barrier layer, such as silicon oxide, silicon aluminum oxide, silicon oxynitride, and the like, this sealing protocol provides superior moisture resistance to protect the electrochromic device while maximizing viewable area.

In certain embodiments, the fabrication methods described herein are performed using large-area float glass substrates, where a plurality of EC lites are fabricated on a single monolithic substrate and then the substrate is cut into individual EC lites. Similar, "coat then cut" methods are described in U.S. Pat. No. 8,164,818, filed Nov. 8, 2010, and titled, "Electrochromic Window Fabrication Methods," which is hereby incorporated by reference in its entirety. In some embodiments, these fabrication principles are applied to the methods described herein, e.g., in relation to FIGS. 4A-4G.

Figure 4H:
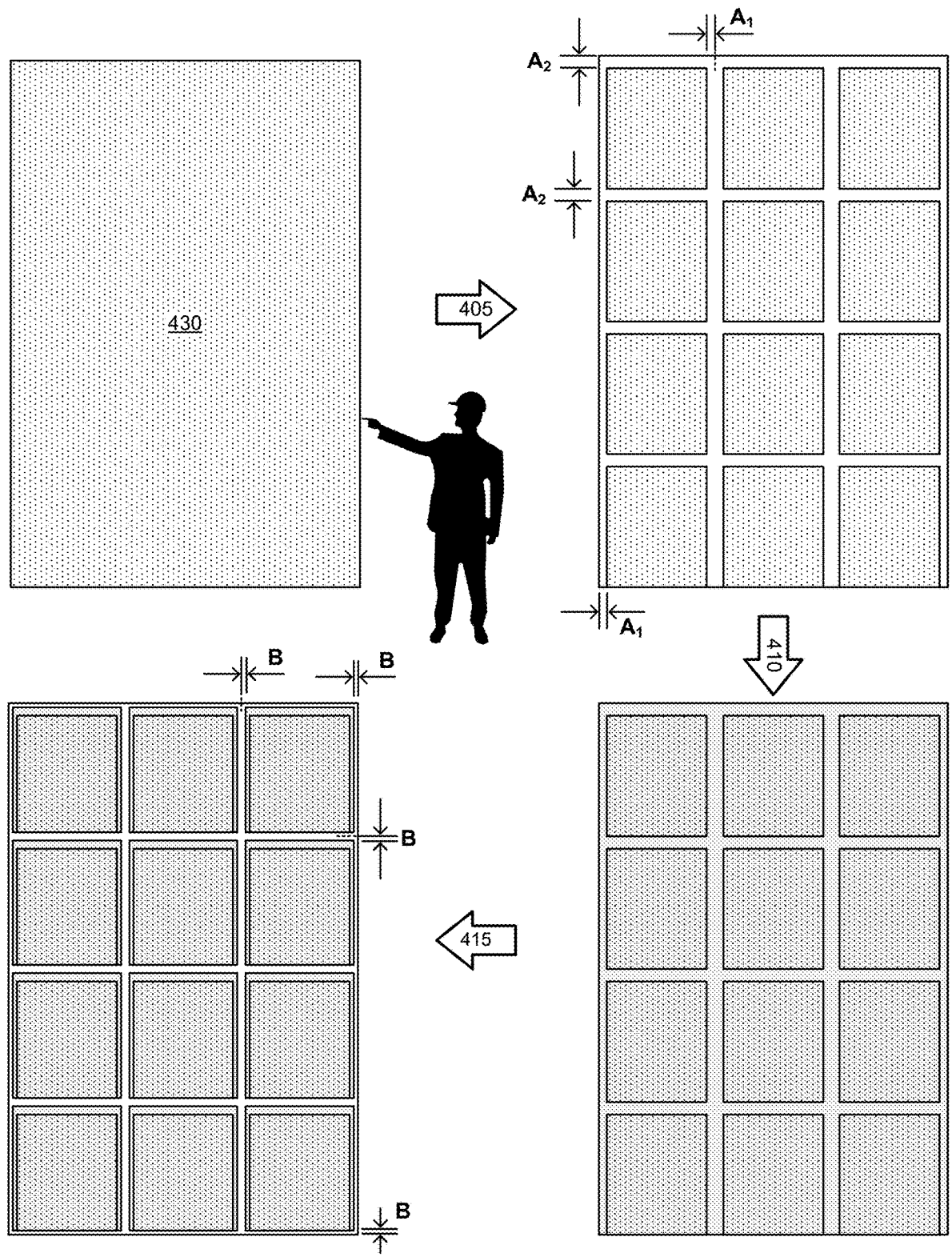
FIGS. 4H and 4I are schematic drawings depicting steps of a process flow similar to that described in relation to FIG. 4A and carried out on a large-area substrate as applied to coat then cut methods.
Figure 4I:
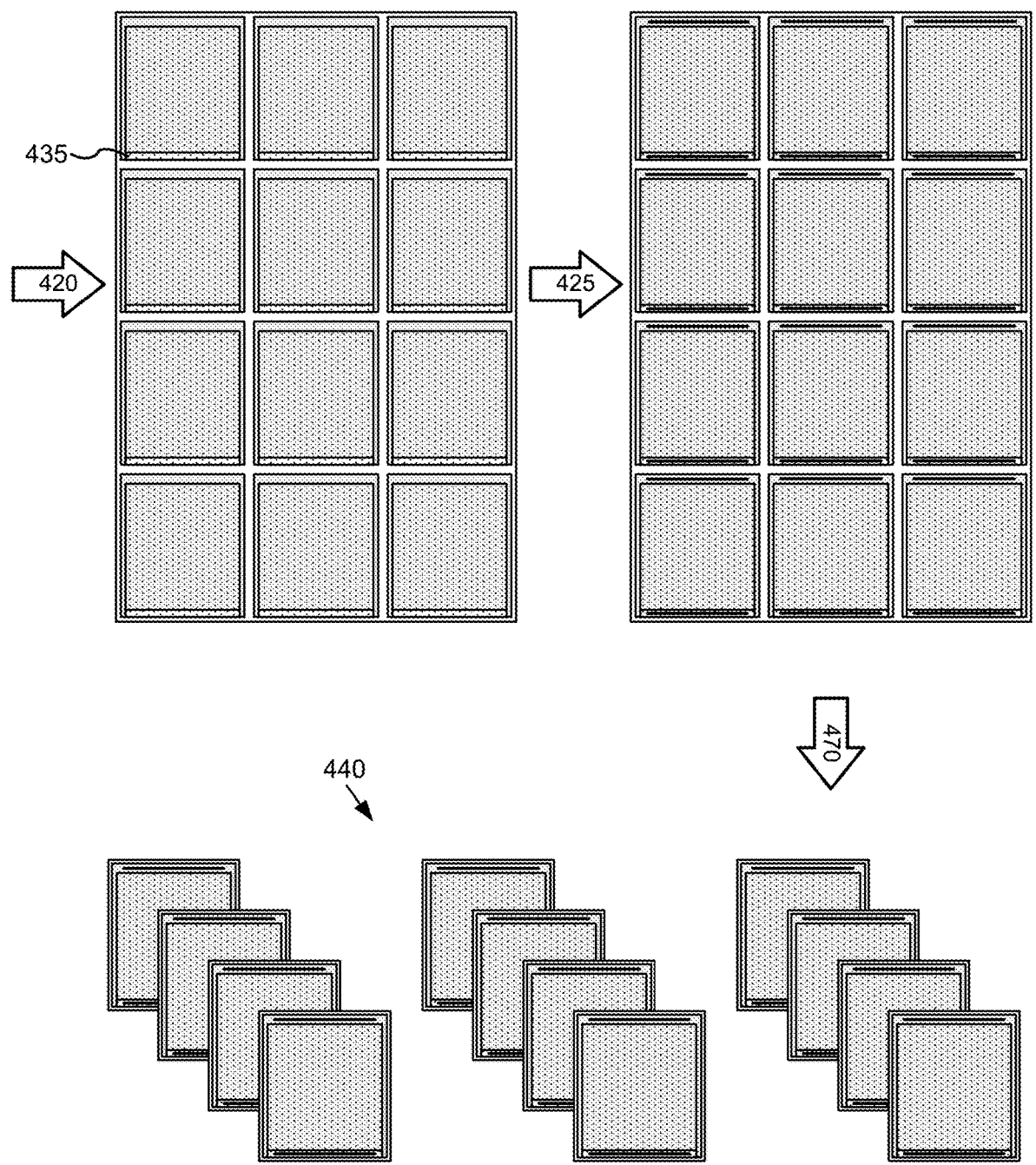

FIGS. 4H and 4I depict an EC lite fabrication process flow, similar to that described in relation to FIG. 4A, but carried out on a large-area substrate as applied to coat then cut methods, according to embodiments. These fabrication methods can be used to make EC lites of varying shapes, e.g., as described herein, but in this example, rectangular EC lites are described. In this example, substrate 430 (e.g. as described in relation to FIG. 4A, coated with a transparent conducting oxide layer) is a large-area substrate, such as float glass, e.g. a sheet of glass that is 5 feet by 10 feet. Analogous to operation 405 as described in relation to FIG. 4A, edge deletion at a first width, A, is performed. Edge taper and/or polish may also be performed. In this example, since there are to be a plurality of EC devices (in this example, 12 devices) fabricated on a large substrate, the first width A may have one or more components. In this example, there are two components, $A_1$ and $A_2$, to width A. First, there is a width $A_1$, along the vertical (as depicted) edges of the substrate. Since there are neighboring EC devices, the width $A_1$ is reflected in a coating removal that is twice the width $A_1$. In other words, when the individual devices are cut from the bulk sheet, the cuts in between neighboring devices along the vertical (as depicted) dimension will evenly bifurcate the area where the coating is removed. Thus "edge deletion" in these areas accounts for where glass edges will eventually exist after the glass is cut (see for example FIG. 4I). Second, along the horizontal dimension, a second A-width component, $A_2$, is used. Note, in certain embodiments width $A_1$ is used about the entire perimeter of the substrate; however, in this example more width is provided to accommodate the bus bar that will fabricated on the top transparent conductor layer (e.g. see FIG. 4C, bus bar 1). In this example, width $A_2$ is the same both at the top and bottom edge of the substrate and between neighboring EC devices. This is because the fabrication is analogous to that described in relation to FIG. 4B, i.e., where the EC devices are cut from the substrate along the bottom of edge of the transparent conductor area for each device (see FIG. 4G).

Next, in operation 410, the remaining layers of the EC device are deposited over the entire substrate surface (save any areas where clamps might hold the glass in a carrier, for example). The substrate may be cleaned prior to operation 410, e.g., to remove contaminants from the edge deletion. Also edge taper on each of the TCO areas may be performed. The remaining layers of the EC device encapsulate the isolated regions of the transparent conductor on the substrate, because they surround these areas of transparent conductor (except for the back face which resides against the substrate or intervening ion barrier layer). In one embodiment, operation 410 is performed in a controlled-ambient all PVD process, where the substrate doesn't leave the coating apparatus or break vacuum until all the layers are deposited.

In operation 415, edge deletion at a second width, B, narrower than the first width A, is performed. In this example, second width B is uniform. In between neighboring devices, second width B is doubled to account for cutting the substrate along lines evenly between two devices so that the final devices have a uniform edge delete about them for the spacer to seal to the glass when an IGU is fabricated from each EC device. As illustrated in FIG. 4I1, this second edge deletion isolates individual EC lites on the substrate. In certain embodiments, the second width B may be much smaller than that needed to accommodate a spacer for IGU fabrication. That is, the EC lite may be laminated to another substrate and thus only a small edge delete at width B, or in some embodiments no edge delete at the second width B is necessary.

Referring to FIG. 4I, operation 420 includes fabricating a BPE, 435, where a portion of the EC device layers are removed to expose the lower conductor layer proximate the substrate. In this example, that portion is removed along the bottom (as depicted) edge of each EC device. Next, during operation 425, bus bars are added to each device. In certain embodiments, the EC lites are excised from the substrate prior to bus bar application. The substrate now has completed EC devices. Next, the substrate is cut, operation 470, to produce a plurality of EC lites 440, in this example 12 lites. This is a radical departure from conventional coat then cut methods, where here, fully functional EC devices can be fabricated, including bus bars on a large area format glass sheet. In certain embodiments the individual EC lites are tested and optionally any defects mitigated prior to cutting the large format sheet.

Coat and then cut methods allow for high throughput manufacture because a plurality of EC devices can be fabricated on a single large area substrate, as well as tested and defect-mitigated prior to cutting the large format glass sheet into individual lites. In one embodiment, the large format glass pane is laminated with individual strengthening panes registered with each EC device prior to cutting the large format sheet. The bus bars may or may not be attached prior to lamination; for example, the mate lite may be coextensive with an area allowing some exposed portions of the top and bottom TCO's for subsequent bus bar attachment. In another example, the mate lite is a thin flexible material, such as a thin flexible glass described below, which is substantially co-extensive with the EC device or the entire large format sheet. The thin flexible mate lite is ablated (and lamination adhesive, if present in these areas) down to the first and second conductor layers so that bus bars may be attached to them as described herein. In yet another embodiment, the thin flexible mate lite, whether co-extensive with the entire large format sheet or the individual EC devices, is configured with apertures which are registered with the top conductor layer and the BPE during lamination. The bus bars are attached either before or after lamination with the mate lite, as the apertures allow for either operation sequence. The lamination and bus bar attachment may separately be performed prior to cutting the large sheet, or after.

In certain embodiments, when laminating, bus bar ink may be applied prior to lamination, where the ink is applied to the BPE and upper TCO, then pressed out from between these areas when laminated, e.g. to an aperture in the mate lite or continuing around the edge of the laminate, to allow lead attach at a point located outside the laminated area. In another embodiment, a flat foil tape is applied to the top conductor and the BPE, the foil tape extends beyond the laminated region, such that wires can be soldered to the tape after lamination. In these embodiments, cutting must precede lamination unless, e.g., the lamination mate lites do not cover the entire surface of the large format substrate (e.g. as described in relation to roll-to-roll embodiments herein).

Lites 440, laminated or not, may be incorporated into an IGU, e.g. as depicted in FIG. 4F. In one embodiment, the individual EC lites are incorporated into an IGU and then one or more of the EC lites of the IGU is laminated with a strengthening pane (mate lite) as described herein or in U.S. Pat. No. 8,164,818. In other embodiments, e.g. as described herein, lamination may include a flexible substrate, e.g. the aforementioned lamination of an IGU where the mate lite is a flexible substrate, or e.g., lamination of the EC lite directly to a flexible substrate. Further such embodiments are described in relation to FIG. 4J.

Figure 4J:
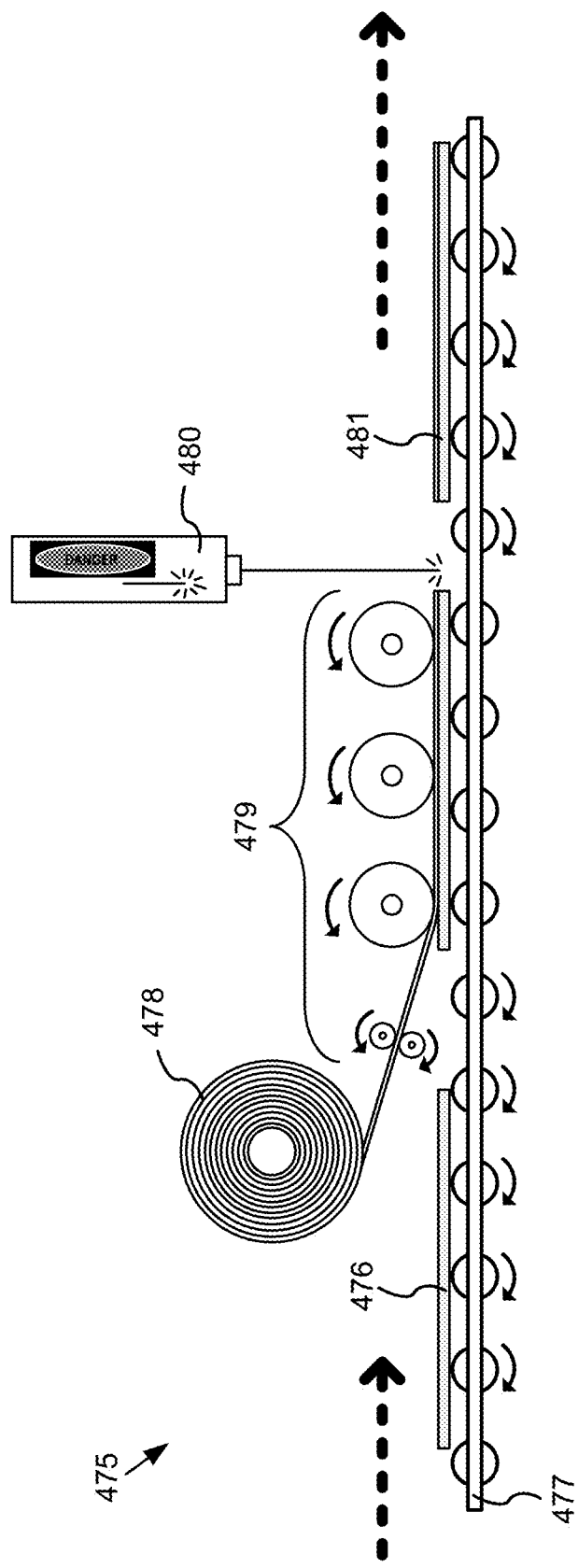
FIG. 4J is a drawing depicting roll-to-roll processing forming laminates of electrochromic devices where the lamination uses a flexible mate lite.

FIG. 4J depicts roll-to-roll processing, 475, forming laminates of electrochromic devices where the lamination uses a flexible mate lite. A substrate, 476, is fed into a lamination line, in this example including a conveyer 477. Substrate 476 may be an IGU with at least one EC lite incorporated, or substrate 476 can be a monolithic EC device, e.g., as described herein or substrate 476 can be a large format substrate with a plurality of EC lites fabricated thereon. In this example, a thin and flexible substrate, 478, in this case a glass substrate is fed from a roll into the lamination line. In one embodiment one or more rolls are applied in parallel to a large format glass sheet including a plurality of EC devices, e.g., as described in relation to FIG. 4I. For example, three separate and parallel rolls of the flexible substrate are fed into a lamination line that laminates the large format glass substrate lengthwise or widthwise such that three columns or rows of EC devices (see FIG. 4I, upper portion) are each laminated with the flexible substrate. Thus using roll-to-roll processing, large format glass sheets can be laminated with flexible mate lite material and cut into individual EC lites. The large format glass sheet may be cut as each row is laminated or after the entire sheet is laminated. In certain embodiments, individual EC lites, or ICU's containing them, are laminated with roll-to-roll processing. More detail of roll-to-roll processing is described below.

Exemplary flexible substrates include thin and durable glass materials, such as Gorilla® Glass (e.g. between about 0.5 mm and about 2.0 mm thick) and Willow™ Glass, commercially available from Corning, Incorporated of Corning N.Y. In one embodiment, the flexible substrate is less than 0.3 mm thick, in another embodiment the flexible substrate is less 0.2 mm thick, and in another embodiment the flexible substrate is about 0.1 mm thick. Such substrates can be used in roll-to-roll processing. Referring again to FIG. 4J, adhesive is applied to substrate 476, flexible substrate 478, or both. Rollers 479 apply sufficient pressure to ensure good bonding between substrate 476 and flexible substrate 478. Flexible substrate 478 is cut to match its lamination partner 476, e.g., using a laser 480. The final laminate structure, 481, results. Using this roll-to-roll method, monolithic EC devices, IGU's or large format glass sheets bearing a plurality of EC lites can be strengthened with a thin flexible strengthening pane. These methods apply to any EC substrate, described herein or otherwise. In one embodiment, the monolithic EC lites as depicted in FIG. 4I, e.g. having been cut from the large area substrate, are fed into the lamination line to be laminated with the flexible substrate. In another embodiment, the large area substrate, having a plurality of EC devices fabricated thereon, is laminated with a flexible substrate of corresponding width, and after lamination, the individual, now laminated, EC devices are cut from the large area laminate, e.g., by row as lamination finishes or after lamination of the entire large format sheet. In another embodiment, the large area substrate, having a plurality of EC devices fabricated thereon, is laminated with a plurality of flexible substrates of corresponding width or length to individual EC lites, and after lamination, the EC devices, now laminated, are cut from the large area laminate, e.g. individually, or by row (or column).

As described, e.g. in relation to FIG. 4A-E, EC devices may have two bus bars, one for each transparent conducting layer. However, methods herein also include fabrication of devices having more than one bus bar for each transparent conducting layer, specifically bus bars on opposing sides of each of the first and second conductor layer. This may be particularly important when fabricating larger EC devices that would otherwise require longer switching times due to the sheet resistance and having large-area devices.

Figure 5A:
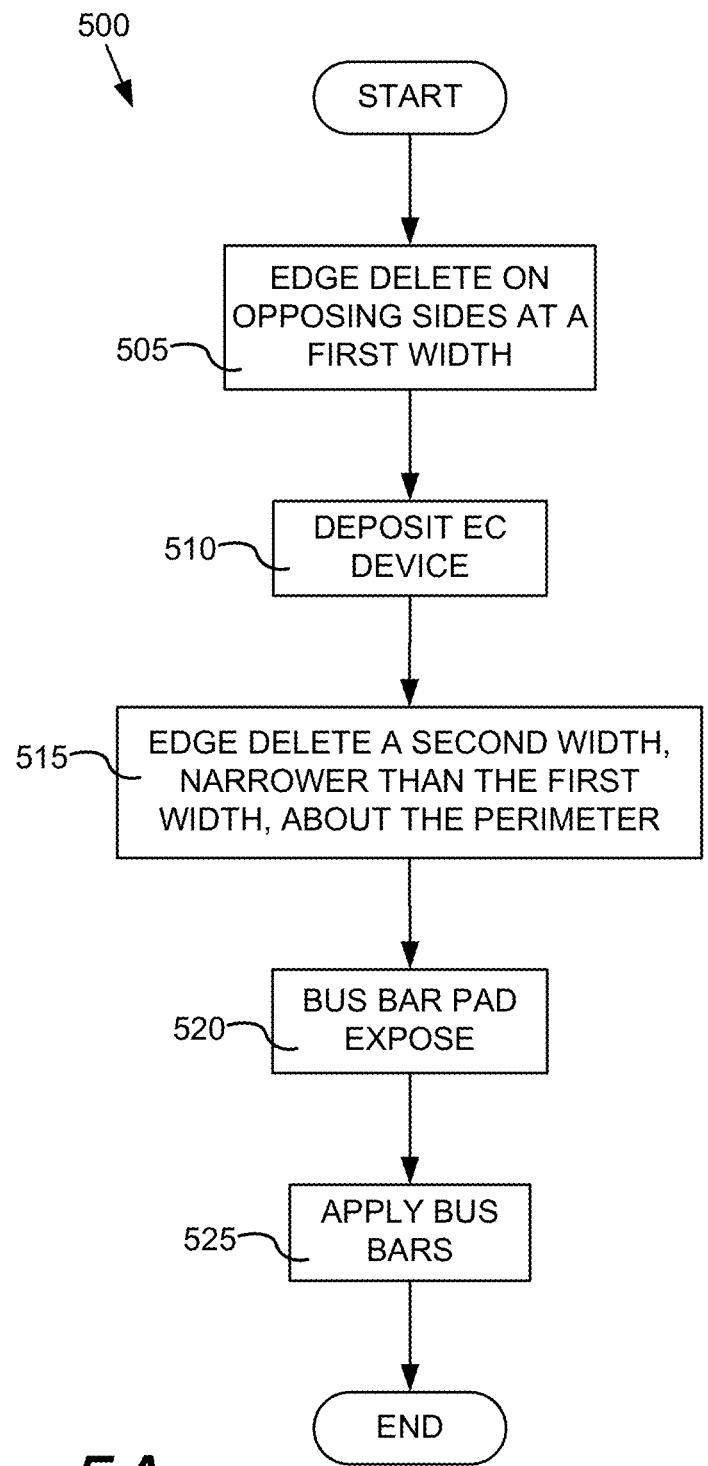
FIG. 5A is a flowchart of a process flow describing aspects of a method of fabricating an optical device having opposing bus bars on each of first and second conductor layers.

FIG. 5A describes aspects of a process flow, 500, for fabricating an optical device have opposing bus bars on each of the first and second conductor layers, according to embodiments. For illustration, FIG. 5B includes top views depicting the process flow described in relation to FIG. 5A as it relates to fabrication of a rectangular electrochromic device. FIG. 5C shows cross-sections of the electrochromic lite described in relation to FIG. 5B.

Figure 5B:
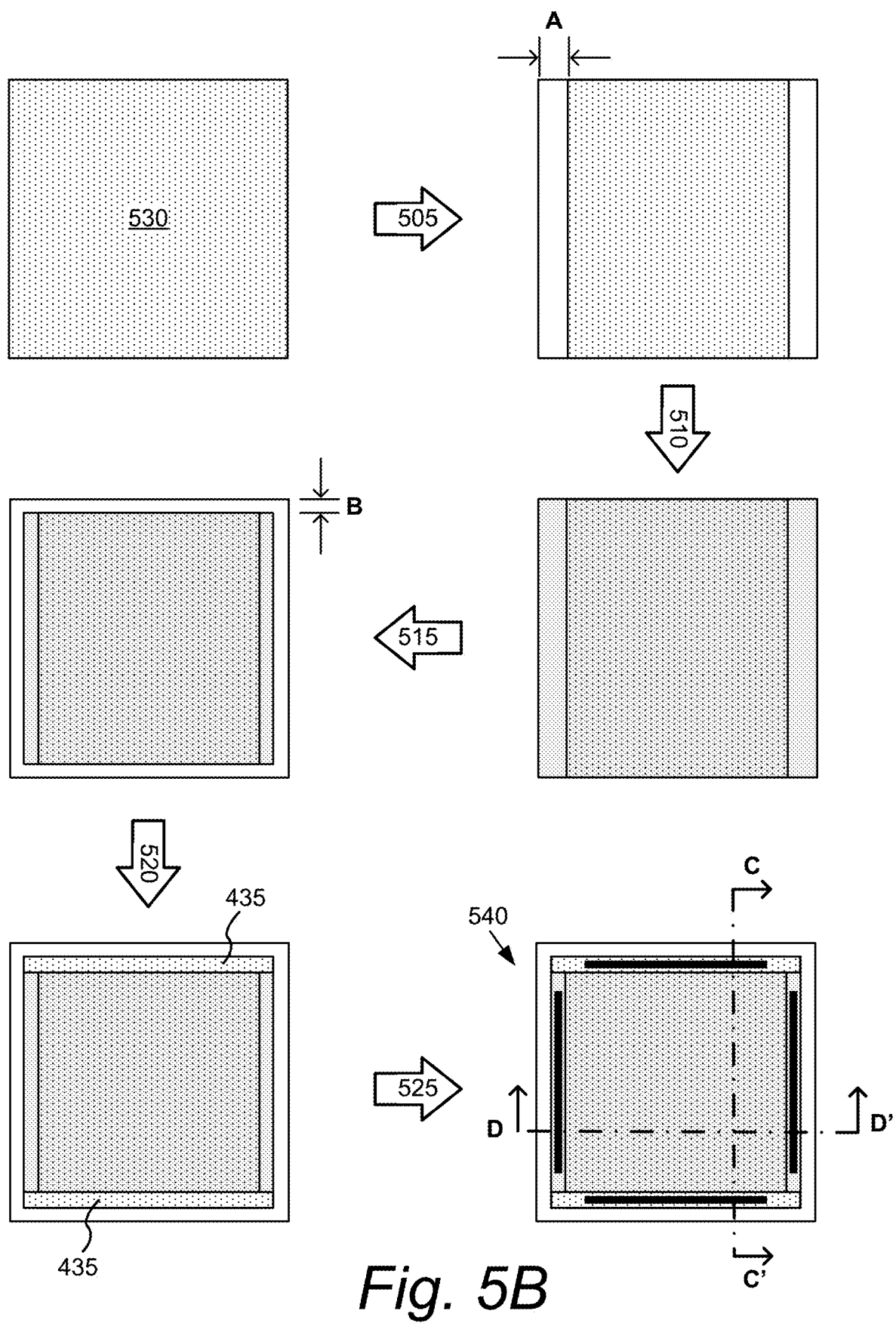
FIG. 5B is a schematic of top-views depicting steps in the process flow described in relation to FIG. 5A.
Figure 5C:
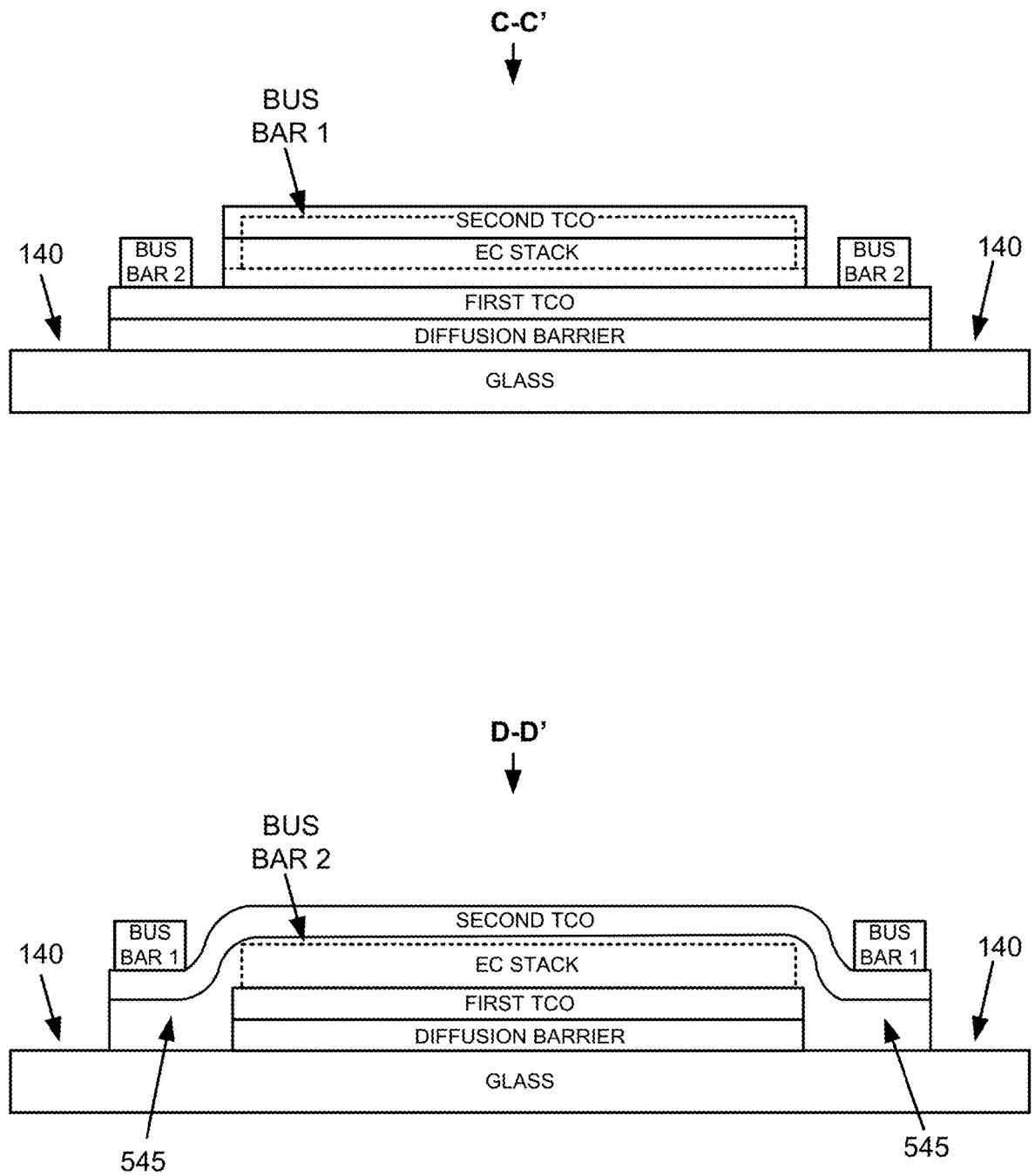
FIG. 5C shows cross-sections of the electrochromic lite described in relation to FIG. 5B.

Referring to FIGS. 5A and 5B, process flow 500 begins with removing the first width A of the first conducting layer from two opposing sides at the perimeter of the substrate, see 505. As described above, this may include removal of a diffusion barrier or not. A substrate with a first conductor layer, 530, is depicted. After step 505, two opposing edge portions of the substrate (or diffusion barrier) are exposed. Edge taper and polish steps may be performed as described in relation to FIGS. 4A and 4B. The one or more material layers of the device and the second conductor layer (and optionally a moisture barrier) are applied to the substrate, see 510. A second width B is removed from the entire perimeter of the substrate, see 515. In this example, two BPE's, 435, are fabricated, see 520. Thus in accord with methods described above, the at least one exposed portion of the first conducting layer includes a pair of exposed portions fabricated along the lengths of the opposing sides of the optical device from which the first width was not removed in 505. Bus bars are applied, see 525, to make device 540 (thus, for example, in accord with methods described above, applying the at least one second bus bar to the second conducting layer includes applying a pair of second bus bars, each of the pair of second bus bars on opposing lengths of the second conducting layer and over areas where the first conducting layer was removed in 505). FIG. 5B indicates cross-sections C-C' and D-D' of device 540. Drawings of the cross-sectional views of device 540 at C-C' and D-D' are shown in more detail in FIG. 5C.

FIG. 5C shows cross-sections C-C' and D-D' of device 540. In this example, the diffusion barrier was removed when width A and width B were removed. Specifically, perimeter area 140 is free of first conductor layer and diffusion barrier; although in one embodiment the diffusion barrier is left intact to the edge of the substrate about the perimeter on one or more sides. In another embodiment, the diffusion barrier is co-extensive with the one or more material layers and the second conductor layer (thus width A is fabricated at a depth to the diffusion barrier, and width B is fabricated to a depth sufficient to remove the diffusion barrier). In this example, there is an overlapping portion, 545, of the one or more material layers only on opposing sides of the functional device. On both of these overlapping portions, on the second TCO, bus bars 1 are fabricated. In one embodiment, a vapor barrier layer is fabricated co-extensive with the second conductor layer. In this embodiment, two portions of the vapor barrier are removed in order to expose the second conductor layer for bus bars 1. These exposed portions are analogous to areas 435, the BPEs for bus bars 2.

Figure 5D:
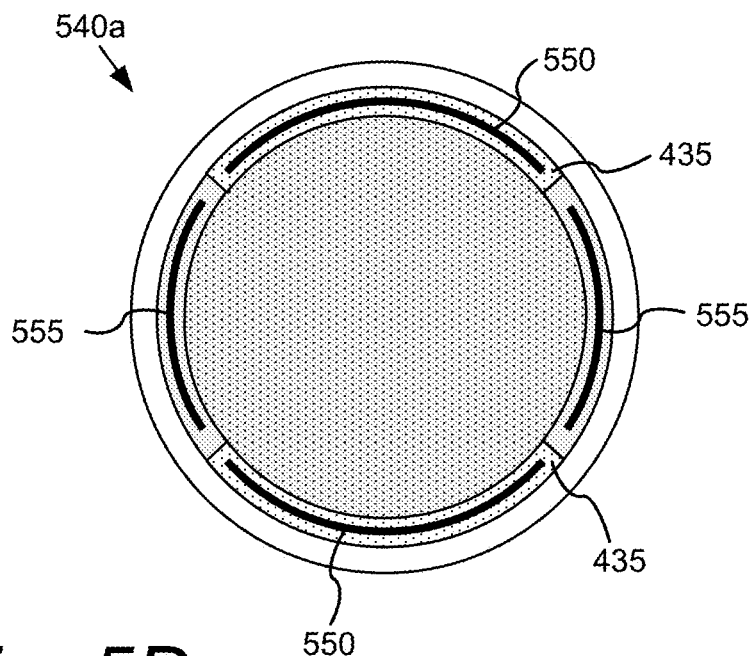
FIGS. 5D and 5E are top view schematics of electrochromic devices.

FIG. 5D depicts an electrochromic device, 540a, analogous to rectangular device 540. Bus bars 550 are on the first conductor layer and bus bars 555 are on the second conductor layer. Thus, the BPEs 435 are fabricated on opposing sides of the circular area and analogous opposing bus bars are applied to the second conductor layer.

Figure 5E:
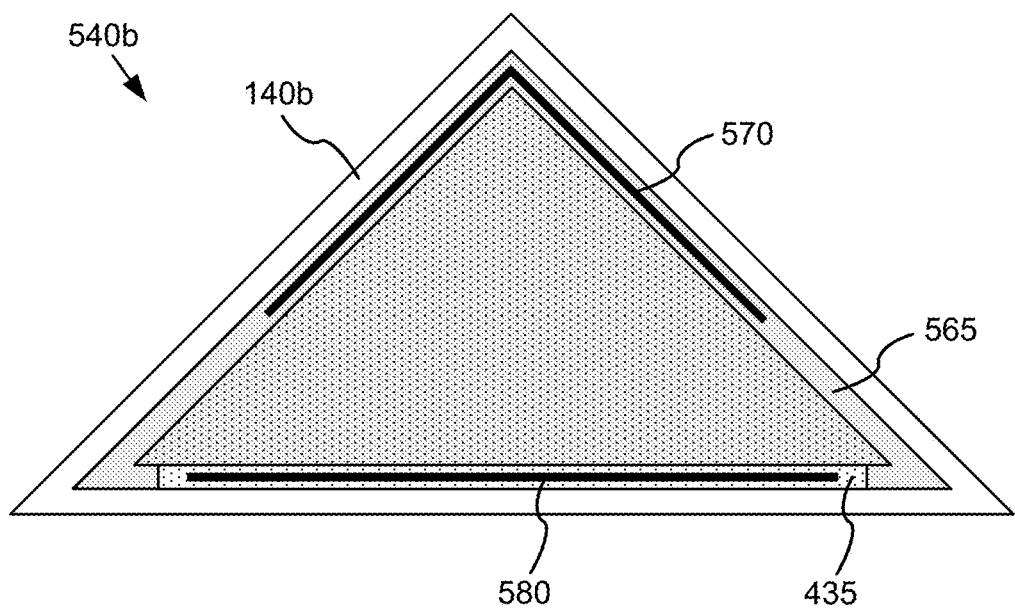

FIG. 5E depicts an electrochromic device, 540b, in this example a triangular shaped device. In this example, area 140b is analogous to areas 140 and 140a in previously described devices. Device 540b has one angled bus bar, 570, and one linear bus bar, 580. In this example, angled bus bar 570 is on the region, 565, of the second conductor layer that is not over the first conductor layer, and linear bus bar 580 is on the BPE, 435. Triangular optical devices are not limited to this particular configuration, e.g., the BPE could be along two orthogonal sides and have the angled bus bar, and the linear bus bar could be on the second conductor layer. The point is that methods described herein can be used to fabricate optical devices of virtually any shape. Also, various masking steps may be used to fabricate devices as described herein, although masking adds extra steps. Other embodiments include optical devices.

One embodiment is an optical device including: (i) a first conductor layer on a substrate, the first conductor layer including an area less than that of the substrate, the first conductor layer surrounded by a perimeter area of the substrate which is substantially free of the first conductor layer; (ii) one or more material layers including at least one optically switchable material, the one or more material layers configured to be within the perimeter area of the substrate and co-extensive with the first conductor layer but for at least one exposed area of the first conductor layer, the at least one exposed area of the first conductor layer free of the one or more material layers; and (iii) a second conductor layer on the one or more material layers, the second conductor layer transparent and co-extensive with the one or more material layers, where the one or more material layers and the second conductor layer overhang the first conductor layer but for the at least one exposed area of the first conductor layer. In one embodiment, the optical device further includes a vapor barrier layer coextensive with the second conductor layer. There may be a diffusion barrier between the substrate and the first conductor layer. The perimeter area of the substrate can include the ion diffusion barrier. In one embodiment, the at least one optically switchable material is an electrochromic material. In one embodiment, the substrate and the first conductor layer are also transparent. In one embodiment, the at least one exposed area of the first conductor layer includes a strip proximate the perimeter area of the substrate. The device may include a first bus bar on and within the area of the strip. The device may also include a second bus bar on the second conductor layer, the second bus bar configured to be on or disposed on a portion of the second conducting layer that does not cover the first conducting layer, the portion proximate the perimeter area and opposite the first bus bar. In one embodiment, the first and second conductor layers and the one or more material layers are all solid-state and inorganic. In one embodiment, the substrate is float glass, tempered or untempered, and the first conducting layer includes tin oxide, e.g. fluorinated tin oxide. In one embodiment, the substrate is registered with a second substrate in an IGU. In one embodiment, any otherwise exposed areas of the first conducting layer are configured to be within the primary seal of the IGU, the bus bars may also be configured to be within the primary seal of the IGU as well as the area of the second conductor layer that is not over the first conductor layer. The optical device may be rectangular, round, oval, triangular and the like.

In certain embodiments, opposing bus bars on each conductor layer are used. In one embodiment, the at least one exposed area of the first conductor layer includes a pair of strips, each strip of the pair of strips on opposing sides of the first conductor layer proximate the perimeter area of the transparent substrate. Depending upon the shape of the device, the strips may be linear or curved, for example. The strips can include a first pair of bus bars, each of the first pair of bus bars on and within the area of each strip of the pair of strips. A second pair of bus bars on the second conductor layer can be included, each of the second pair of bus bars configured to be on or disposed on each of two portions of the second conducting layer that do not cover the first conducting layer, each of the two portions proximate the perimeter area and on opposing sides of the second conducting layer.

The first and second conductor layers and the one or more material layers of optical devices described herein may be all solid-state and inorganic. In one embodiment, the substrate is float glass, tempered or untempered, and the first conducting layer includes tin oxide, e.g. fluorinated tin oxide. The substrate may be registered in an IGU with an additional EC device or not. As described, the bus bars, any laser scribes, device edges, and/or exposed portions of the first conductor layer may be sealed in the primary seal of the IGU. Dual EC device IGU's are described in U.S. patent application Ser. No. 12/851,514 (now U.S. Pat. No. 8,270, 059), filed Aug. 5, 2010, and titled "Multi-pane Electrochromic Windows," which is hereby incorporated by reference in its entirety. One embodiment is a multi-pane window as described in that application, having one or more EC devices as described herein. One embodiment is any optical device described herein which does not include a laser isolation scribe. One embodiment is any optical device described herein which does not include an inactive portion of the optical device.

Figure 5F:
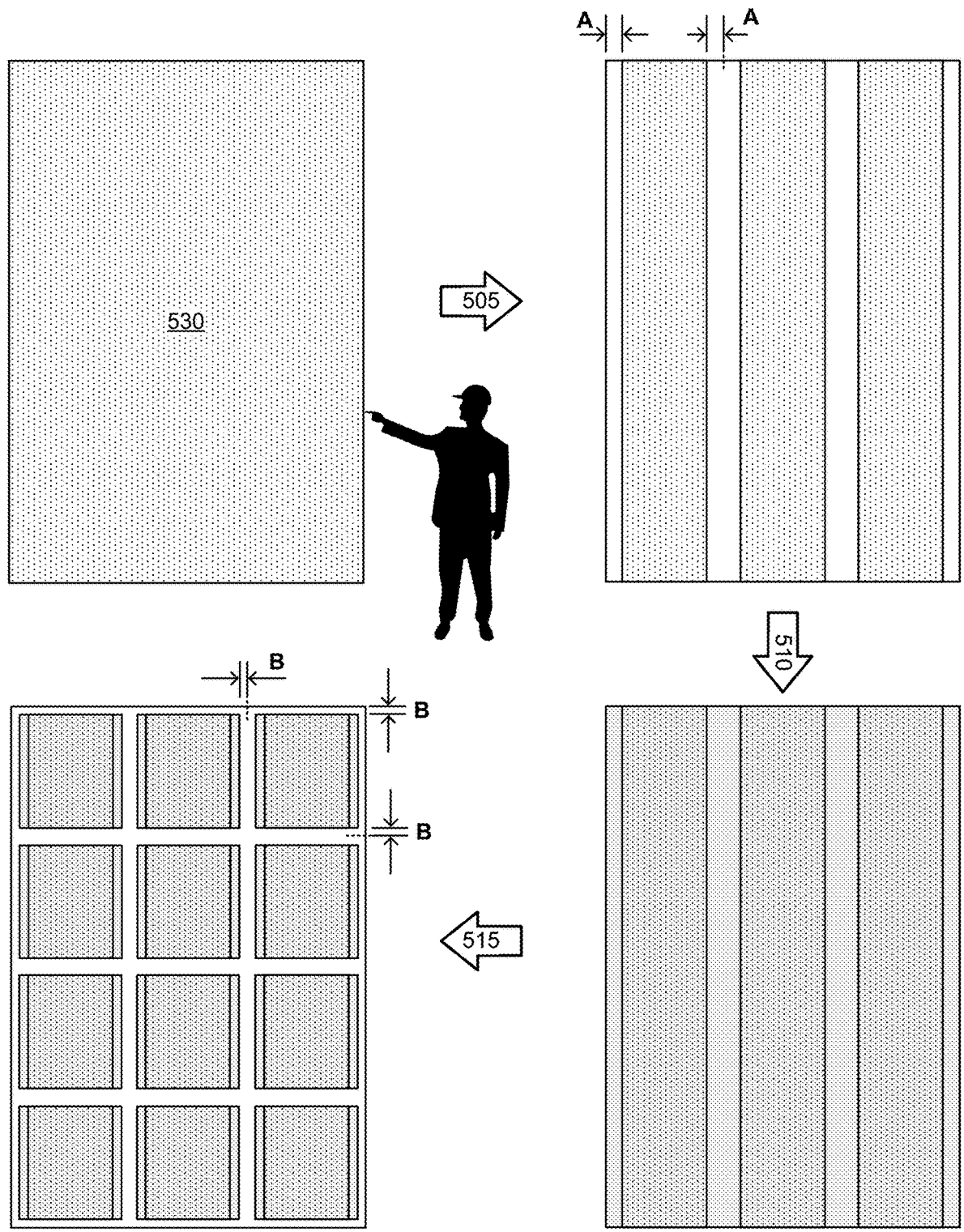
FIGS. 5F and 5G are schematic drawings depicting steps in a process flow similar to that described in relation to FIG. 5A and carried out on a large-area substrate as applied to coat then cut methods, according to embodiments.
Figure 5G:
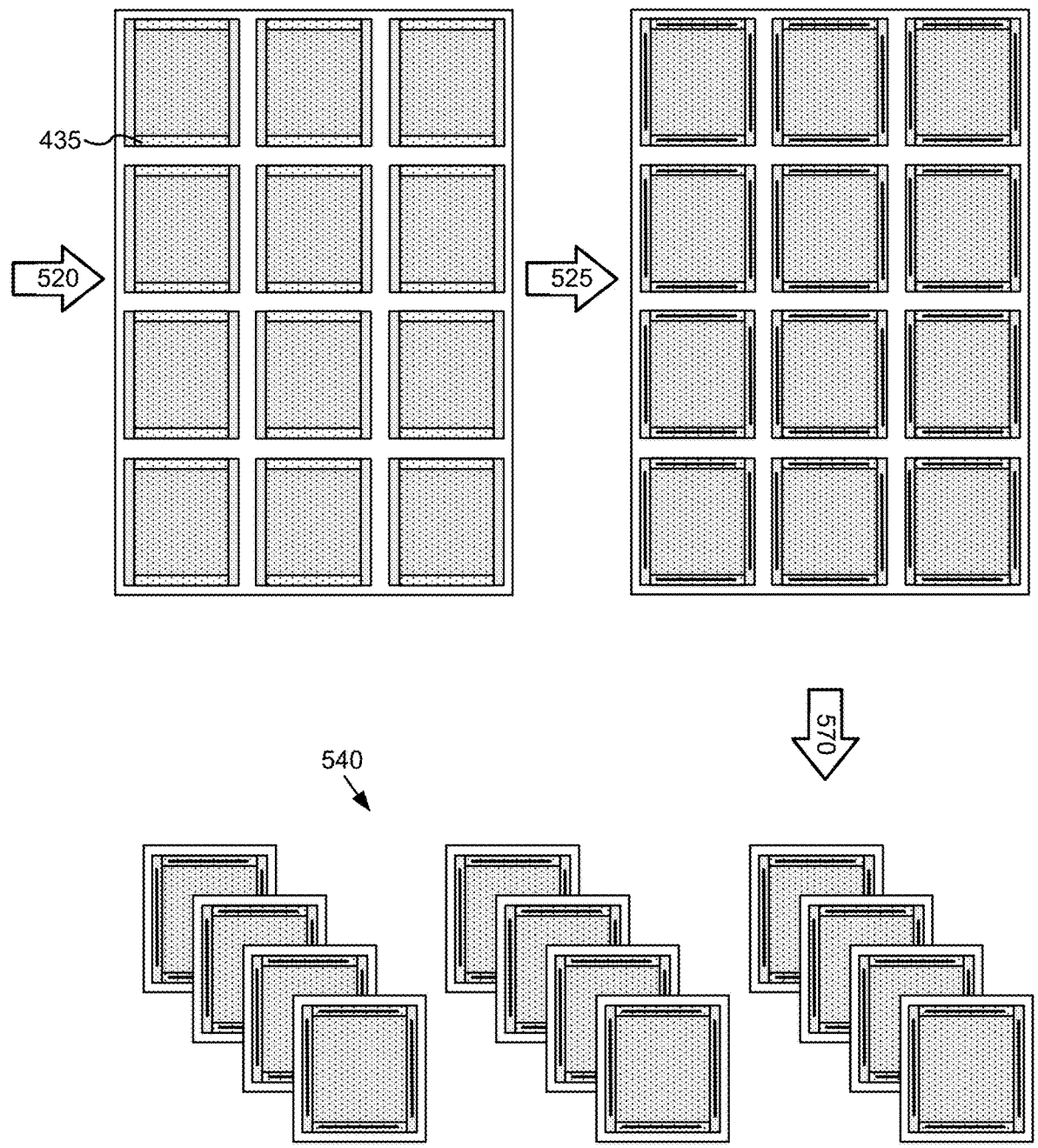

As described above in relation to FIGS. 4H and 4I, some embodiments include coat then cut fabrication. FIGS. 5F and 5G depict a process flow similar to that described in relation to FIG. 5A and carried out on a large-area substrate as applied to coat then cut methods of disclosed embodiments. This is an example of fabricating EC devices having two opposing bus bars on each transparent conducting layer. The lamination embodiments described above also apply to the coat then cut embodiments described below.

Referring to FIG. 5F, a large area substrate, 530, has a transparent conducting layer thereon (as indicated by the dotted pattern). During operation 505, an edge delete is performed at a first width A. The edge delete between what will be neighboring EC devices is made to be double of A, so that each EC device has an equivalent edge delete width A. In operation 510, the remaining EC device layers are applied. Next, see 515, the edge delete at width B, narrower than width A, is performed. In this example, the isolated EC device precursors are analogous to those described in FIG. 5B after operation 515.

Referring to FIG. 5G, operation 520 creates bus bar pad expose regions 435, in this example, two for each EC device. Operation 525 includes application of bus bars, two for each of the transparent conductor layers. In operation 570, the large area substrate is cut to produce, in this example, 12 EC devices 540. As described above in relation to FIGS. 4H-J, these may be incorporated into IGUs, or laminated directly, for example, using a thin flexible substrate.

As described above, thin flexible substrates may be used as strengthening panes (mate lites) for EC lites, e.g. EC lites fabricated as described herein. In certain embodiments, thin flexible substrates are used as substrates for the EC lite fabrication process. For example, one embodiment includes any of the EC device fabrication methods described herein performed on a thin flexible substrate as described herein, e.g. Gorilla® Glass or Willow™ Glass. In some embodiments, fabrication is performed using a roll-to-roll fabrication scheme. Examples of this embodiment are described below in relation to FIGS. 6A and 6B.

Figure 6A:
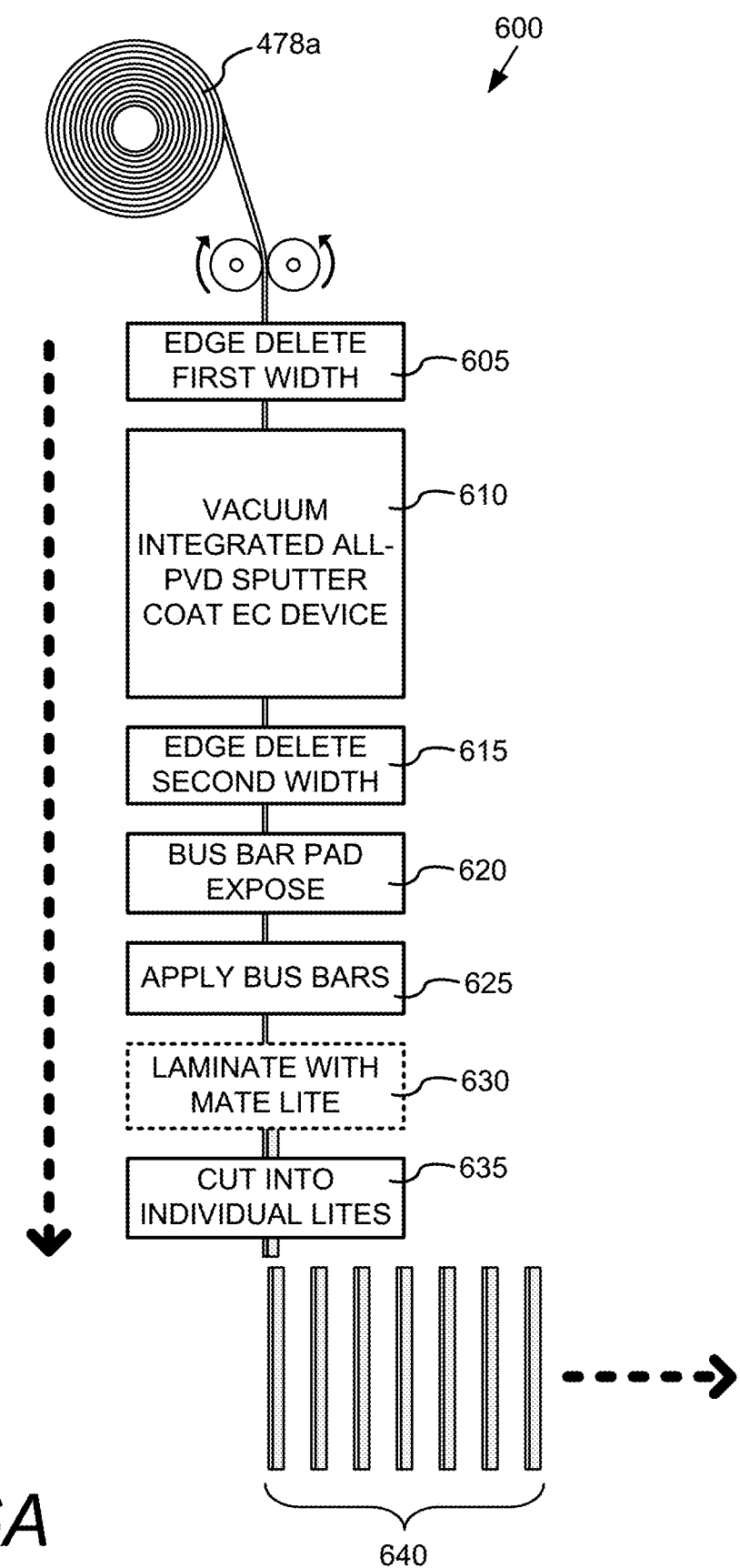
FIG. 6A is a schematic drawing depicting roll-to-roll fabrication of electrochromic devices on flexible substrates and optional lamination with rigid substrates.

FIG. 6A depicts roll-to-roll fabrication, 600, of electrochromic devices on thin flexible substrates and optional lamination with rigid substrates. FIG. 6A is a fusion of a chart-type process flow with block diagrams including functional descriptions of apparatus and device features. The actual apparatus for performing the described fabrication may be in any orientation, but in one embodiment, the flexible substrate is preferably vertical. In another embodiment, the substrate is vertical and the process operations are performed in a "top down" format, where the substrate is fed into the line from a first height, passes downward through the fabrication process, and ends at a second height, lower than the first height. In this example, a thin flexible substrate, 478a (as described above), includes a transparent conductive oxide layer. An example of this substrate is Willow Glass™, which is commercially available with an ITO coating from Corning, Incorporated of Corning, N.Y. The heavy dotted arrow in FIG. 6A indicates the direction of motion of the flexible substrate through various modules.

First, the flexible substrate is fed into an edge deletion module, 605. In this module, the edge deletion of a first width (as described herein) from the transparent conductor layer is performed. The substrate may optionally be cleaned (not depicted in FIG. 6A) of any contaminants resulting from the first edge delete. Also, in accord with embodiments described herein, e.g. in relation to FIGS. 4A and 4B, the transparent conducting layer may be given an edge taper and/or polishing process (not depicted). Next, the thin flexible substrate enters a coater, 610, where the remaining layers of the EC device are deposited, in this example, using a vacuum integrated all-PVD sputter apparatus. Such apparatus are described in U.S. Pat. No. 8,243,357, titled, "Fabrication of Low Defectivity Electrochromic Devices," filed on May 11, 2011, which is hereby incorporated by reference in its entirety. After the flexible substrate is coated with the EC device, a second edge delete (as described herein) is carried out, in this example, in a module 615. Edge deletion may optionally be followed by edge taper (not shown). Next is BPE fabrication, 620, followed by application of bus bars, see 625. Optionally, the flexible substrate may be laminated with a mate lite, see 630, e.g. as described in relation to FIG. 4J. The mate lite may be flexible as the substrate, or a rigid substrate, such as annealed glass or a polymeric substrate. In this example, the flexible substrate is laminated with annealed glass. The flexible substrate is then cut, either to match the rigid substrate to which it is laminated (as depicted) which produces laminated EC devices 640, or as a monolithic flexible EC device (not shown). In the latter embodiment, the flexible EC device may be coated with a vapor barrier and/or encapsulation layer prior to or after cutting from the bulk material.

Depending upon the width of the flexible substrate, there may be one or more EC devices fabricated along the width of the flexible substrate as it passes through modules/process flows 605-635. For example, if the flexible substrate is as wide as a large area float glass substrate as described herein, lamination with the large area substrate will produce a corresponding large-area laminate. Individual EC lite laminates can be cut from that large area laminate, e.g. as described above.

Figure 6B:
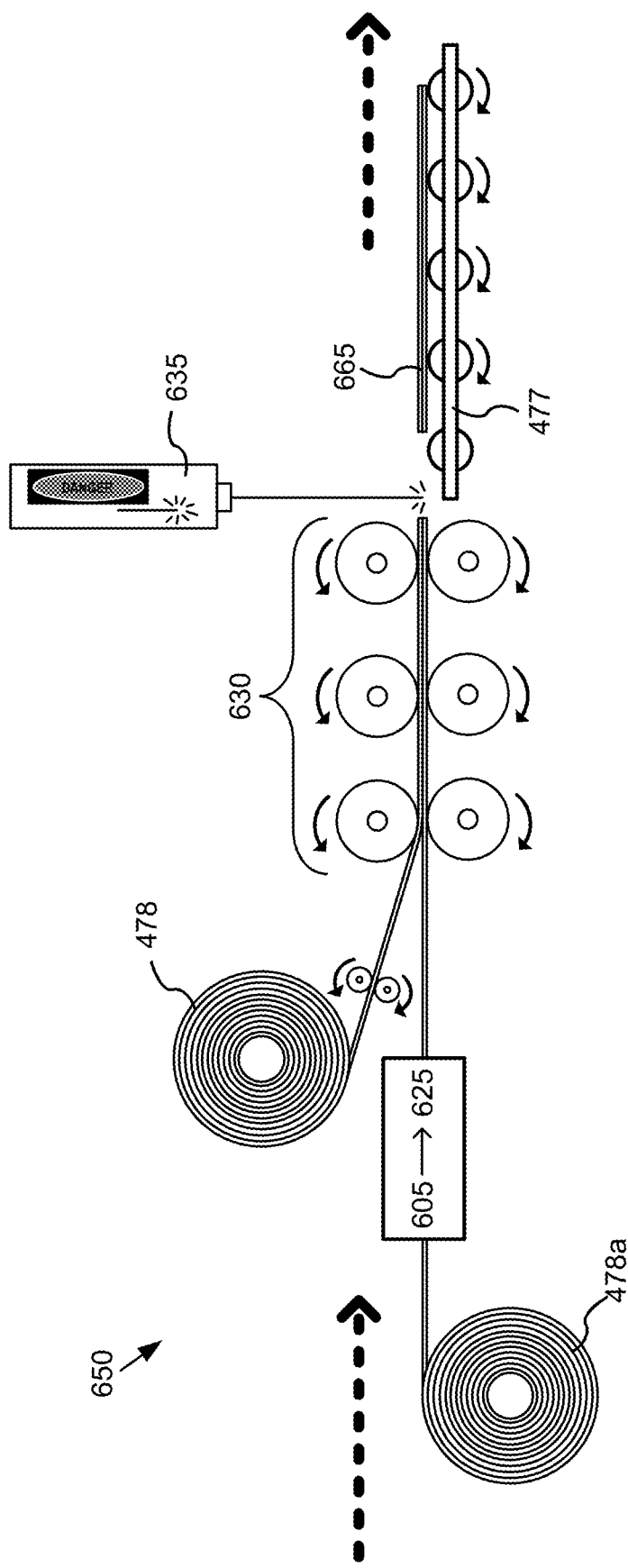
FIG. 6B is a schematic drawing depicting lamination of electrochromic devices on flexible glass substrates and lamination with flexible substrates.

In some embodiments, a flexible EC device laminate is desired. In one embodiment, the flexible substrate bearing the plurality of EC devices is itself laminated with another flexible substrate. FIG. 6B depicts fabrication, 650, of electrochromic devices on flexible glass substrates and subsequent lamination with flexible substrates. In this example, flexible substrate 478a (as described above) having a transparent conductor layer thereon is fed through fabrication line processes 605-625 as described in relation to FIG. 6A. Then, the flexible substrate, having a plurality of EC devices thereon, is laminated with another flexible substrate, in this example substrate 478 as described above, via appropriate application of lamination adhesive and rollers 630. The newly formed laminate is cut, e.g. via laser, see 635, to form individual flexible EC laminates. 665, which, e.g., can pass along conveyer 477 for further processing. As described above, the flexible substrate "mate lite" may be patterned with apertures to accommodate the bus bars, or ablated to reveal TCO and the bus bars (process 625) added after lamination, either before or after cutting into individual laminated EC lites.

Although the foregoing embodiments have been described in some detail to facilitate understanding, the described embodiments are to be considered illustrative and not limiting. It will be apparent to one of ordinary skill in the art that certain changes and modifications can be practiced within the scope of the above description and the appended claims.

We claim:

1. A method of fabricating an electrochromic device, the method comprising:
   a. receiving a glass substrate with a first transparent conductor layer covering a work surface of the glass substrate;
   b. removing a portion of the first transparent conductor layer from the glass substrate about a periphery of the glass substrate;
   c. depositing an electrochromic device stack over the first transparent conductor layer and covering substantially the entire work surface of the glass substrate;
   d. depositing a second transparent conductor layer over the electrochromic device stack and covering substantially the entire work surface of the glass substrate;
   e. removing a portion of the second transparent conductor layer from the entire periphery of the glass substrate; and
   f. depositing a vapor barrier over the second transparent conductor layer and covering substantially the entire work surface of the glass substrate.

2. The method of claim 1, wherein the glass substrate is rectangular.

3. The method of claim 2, wherein b. comprises removing the first transparent conductor layer from three edges of the glass substrate.

4. The method of claim 3, wherein e. comprises removing the second transparent conductor layer from all four edges of the glass substrate, but not removing any of the electrochromic device stack.

5. The method of claim 4, further comprising removing the vapor barrier from all four edges of the glass substrate, but not removing any of the second transparent conductor layer.

6. The method of claim 4, further comprising forming a bus bar pad by laser ablation to expose the first transparent conductor layer along one edge of the electrochromic device stack.

7. The method of claim 4, wherein forming the bus bar pad is formed prior to f.

8. The method of claim 4, wherein forming the bus bar pad is formed after f.

9. The method of claim 7, wherein, prior to f., a first bus bar is fabricated on the bus bar pad, a second bus bar is fabricated on the second transparent conductor layer along a side that is opposite the bus bar pad, and, wherein no electrochromic device stack lies under the second bus bar.

10. The method of claim 3, wherein the first transparent conductor layer is tapered about its peripheral edge prior to c.

11. The method of claim 1, wherein the first transparent conductor layer is polished prior to b. and/or after b. and prior to c.

12. The method of claim 3, wherein each of b. and e. comprise removal of a first width of the first transparent conductor layer and removal of a second width of the second transparent conductor layer, respectively where the first width is greater than the second width.

13. The method of claim 6, wherein the bus bar pad is between about 5 mm and about 15 mm wide.

14. The method of claim 9, further comprising fabricating an insulated glass unit comprising:
   (i) the glass substrate;
   (ii) a spacer; and
   (iii) a second glass substrate;
   wherein the glass substrate and the second glass substrate are mated with the spacer therebetween using a primary sealant to adhere the glass substrate and second glass substrate to the spacer, thereby forming a primary seal area on the faces of the spacer that mate with the respective surfaces of the glass substrate and second glass substrate.

15. The method of claim 14, wherein the peripheral edge of the second transparent conductor layer, formed in e., is sealed within the primary seal area.

16. The method of claim 14, wherein the first and second bus bars are sealed within the primary seal area along their lengths.

17. The method of claim 14, further comprising attaching wire leads to the first and second bus bars.

18. The method of claim 14, further comprising applying an adhesive sealant around the spacer and between the glass substrate and second glass substrate to form a secondary seal of the insulating glass unit.

19. The method of claim 1, wherein the vapor barrier comprises one or more of a silicon oxide, a silicon aluminum oxide, a silicon oxynitride, an aluminum zinc oxide, a tin oxide, and a silicon dioxide.

20. The method of claim 7, wherein, after f., portions of the vapor barrier are removed to expose the second transparent conductor layer opposite the bus bar pad, and to expose the bus bar pad, wherein a first bus bar is fabricated on the bus bar pad, a second bus bar is fabricated on the second transparent conductor layer along a side that is opposite the bus bar pad, and, wherein no electrochromic device stack lies under the second bus bar.

21. The method of claim 1, wherein the vapor barrier is electrically insulating.

22. The method of claim 1, wherein the vapor barrier is electrically conductive.

* * * * *